United States Patent
Nishimoto et al.

(10) Patent No.: US 7,621,654 B2
(45) Date of Patent: Nov. 24, 2009

(54) LED MOUNTING MODULE, LED MODULE, MANUFACTURING METHOD OF LED MOUNTING MODULE, AND MANUFACTURING METHOD OF LED MODULE

(75) Inventors: Keiji Nishimoto, Osaka (JP); Hideo Nagai, Osaka (JP)

(73) Assignee: Panasonic Corporation, Kyoto (JP)

( * ) Notice: Subject to any disclaimer, the term of this patent is extended or adjusted under 35 U.S.C. 154(b) by 120 days.

(21) Appl. No.: 10/591,081

(22) PCT Filed: Mar. 18, 2005

(86) PCT No.: PCT/JP2005/005603

§ 371 (c)(1), (2), (4) Date: Aug. 30, 2006

(87) PCT Pub. No.: WO2005/093862

PCT Pub. Date: Oct. 6, 2005

(65) Prior Publication Data

US 2007/0189007 A1    Aug. 16, 2007

(30) Foreign Application Priority Data

Mar. 26, 2004 (JP) .............................. 2004-093896
Mar. 9, 2005 (JP) .............................. 2005-064801

(51) Int. Cl.
  *F21V 1/00* (2006.01)
(52) U.S. Cl. .................. 362/241; 362/247; 362/249.02; 257/98
(58) Field of Classification Search ................. 362/240, 362/241, 800, 247, 227, 237, 230, 231, 249.01, 362/249.02; 257/98
See application file for complete search history.

(56) References Cited

U.S. PATENT DOCUMENTS

| 5,283,425 | A | 2/1994 | Imamura |
| 5,660,461 | A * | 8/1997 | Ignatius et al. ............... 362/241 |
| 6,331,063 | B1 | 12/2001 | Kamada et al. |
| 6,930,332 | B2 * | 8/2005 | Hashimoto et al. ............ 257/98 |
| 6,949,772 | B2 | 9/2005 | Shimizu et al. |
| 7,045,828 | B2 | 5/2006 | Shimizu et al. |
| 2002/0001192 | A1 * | 1/2002 | Suehiro et al. ............... 362/240 |
| 2002/0006040 | A1 | 1/2002 | Kamada et al. |

(Continued)

FOREIGN PATENT DOCUMENTS

DE    199 45 919    3/2000

(Continued)

*Primary Examiner*—Bao Q Truong

(57) ABSTRACT

The following explains an LED module that can achieve favorable light extraction efficiency without increasing a cost. An LED module (100) includes LED devices (110), an LED mounting module (120) on which the LED devices (110) are mounted, and a lens board (130) attached to a front surface of the LED mounting module (120). The LED mounting module (120) includes a printed wiring board (123) and a reflecting board (126). The printed wiring board (123) is an insulation board (122) on which a wiring pattern (124), used to mount the LED devices (110), is formed. The reflecting board (126) is made of a resin material, and has therein reflecting holes (126a) provided in correspondence with locations, on the printed wiring board (123), where the LED devices (110) are mounted. The reflecting board (126) and the printed wiring board (123) are directly adhered to each other at their surfaces that face each other.

6 Claims, 39 Drawing Sheets

U.S. PATENT DOCUMENTS

| | | |
|---|---|---|
| 2003/0141510 A1 | 7/2003 | Brunner et al. |
| 2003/0189829 A1* | 10/2003 | Shimizu et al. ............. 362/240 |
| 2004/0047151 A1 | 3/2004 | Bogner et al. |
| 2005/0207165 A1 | 9/2005 | Shimizu et al. |
| 2005/0237747 A1 | 10/2005 | Shimizu et al. |
| 2006/0160409 A1 | 7/2006 | Shimizu et al. |

FOREIGN PATENT DOCUMENTS

| | | |
|---|---|---|
| EP | 1 087 447 | 3/2001 |
| EP | 1 246 265 | 10/2002 |
| EP | 1 267 423 | 12/2002 |
| JP | 11-163412 | 6/1999 |
| JP | 2003-124528 | 4/2003 |

* cited by examiner (a)

(b)

(c)

(a)

(b)

(c)

(a)

(b)

(c)

(a)

(b)

(c)

(a)

(b)

(c)

(a)

(b)

(c)

(a)

(b)

(c)

LED MOUNTING MODULE, LED MODULE, MANUFACTURING METHOD OF LED MOUNTING MODULE, AND MANUFACTURING METHOD OF LED MODULE

TECHNICAL FIELD

The present invention relates to an LED mounting module, an LED module, a manufacturing method of an LED mounting module, and a manufacturing method of an LED module. An LED mounting module includes a substrate and a reflecting member made of a resin. On one of main surfaces of the substrate, an LED device is to be mounted. The reflecting member has therein a reflecting hole provided in correspondence with a location, on the main surface of the substrate, where the LED device is to be mounted.

BACKGROUND ART

In recent years, light emitting diodes (hereinafter referred to as LEDs) attract attention as a next-generation light source for lighting apparatuses. There is a demand for developing energy-saving lighting apparatuses using LEDs, since LEDs have a higher efficiency and a longer lifetime than incandescent and halogen lamps. In particular, with their small size, LEDs are expected to realize small-sized lighting apparatuses.

To use LEDs for lighting apparatuses, a plurality of LED bare chips (hereinafter referred to as LED devices) are mounted on a substrate, thereby forming an LED module, for example.

Here, a reflecting board is provided so as to surround each of the LED devices to improve light extraction efficiency of such an LED module. The reflecting board can collect light from the LED devices. Such a reflecting board can be provided as follows, for example. According to Japanese patent application publication No. 2003-124528 (patent document 1), LED devices are mounted on a substrate, and a reflecting board made of aluminum, a resin or the like is then adhered to the substrate. Here, a phosphor formed by phosphor powders and a resin may be provided so as to enclose each LED device therein, before the reflecting board is adhered.

Furthermore, Japanese patent application publication No. H11-163412 (patent document 2) discloses a technique of forming depressions in a substrate, so that part of the substrate functions as a reflecting board.

An LED module according to the patent document 1 has the following drawback. An adhesive layer adhering the substrate and the reflecting board absorbs light emitted toward the adhesive layer, out of light emitted by the LED device. In the worst case, the adhesive layer absorbs around 10% of the entire amount of light. This significantly lowers light extraction efficiency.

An LED module according to the patent document 2 does not have such a drawback that an adhesive layer absorbs light, since the substrate has a reflecting surface formed therein. However, this LED module has a problem of high cost. In detail, a wiring pattern needs to be formed on an uneven surface, due to the reflecting surface formed in the substrate. This can not be done by a common patterning method.

DISCLOSURE OF THE INVENTION

In light of the above problems, an objective of the present invention is to provide an LED mounting module and an LED module which can achieve favorable light extraction efficiency without increasing a cost, and a manufacturing method of such an LED mounting module and a manufacturing method of such an LED module.

The above objective is achieved by an LED mounting module, comprising: a substrate; and a reflecting member made of a resin material and having a reflecting hole in a position corresponding to an LED device which is to be mounted on one of main surfaces of the substrate. Here, the substrate and the reflecting member are directly adhered to each other in such a state that the main surface of the substrate is in contact with one of main surfaces of the reflecting member.

Since the substrate and reflecting member are directly adhered to each other in a state that the main surfaces of the substrate and the reflecting member are in contact, nothing is provided between the substrate and the reflecting member (Strictly speaking, minute voids and the like may be found.). In addition, the substrate and reflecting member are adhered to each other without using an adhesive layer or the like. In other words, the substrate and reflecting member are adhered by making use of the resin material forming the reflecting member.

According to this construction, the reflecting member and the substrate are directly adhered to each other, without an adhesive layer used in conventional LED mounting modules. Therefore, light emitted from an LED device is not to be absorbed by an adhesive layer, thereby preventing a drop in light extraction efficiency. Furthermore, the LED mounting module can be manufactured at a lower cost, than conventional LED mounting modules including an adhesive layer.

Here, the substrate includes an insulation board made of a resin material, and a wiring pattern on one of main surfaces of the insulation board, and the resin material forming the insulation board contains a same resin as the resin material forming the reflecting member. Here, the resin material may be a thermosetting resin material or thermoplastic resin material.

According to this construction, since the resin material forming the insulation board principally contains the same resin as the resin material forming the reflecting member, the insulation board and the reflecting member can be strongly adhered to each other, and have substantially the same linear expansion coefficient.

Here, the resin material forming the reflecting member is a thermosetting resin material principally containing an epoxy resin, which is compatible with materials forming other constituents of the LED mounting module, and can be easily handled. Alternatively, the resin material forming the reflecting member is a thermoplastic resin material principally containing a resin selected from a group consisting of a polyphthalamide resin, a liquid crystal polymer, a polyphenylene sulfide resin, and a polybutylene terephthalate resin. The resin material forming the reflecting member contains one or more fillers to improve reflection efficiency.

Here, the fillers include at least one of $TiO_2$, $SiO_2$, $Al_2O_3$, and $BaSO_4$, and the resin material forming the insulation board contains at least one of $Al_2O_3$, $AlN$, $SiO_2$, and $SiC$.

Here, a metal board is provided on the other main surface of the substrate. The resin material forming the insulation board is a composite material containing an inorganic filler and a thermosetting resin material. Alternatively, the resin material forming the insulation board is a thermosetting resin material containing a glass fiber.

Here, a depression is formed in a part of the substrate at which the reflecting member is adhered, and the depression is filled with the resin material forming the reflecting member. Furthermore, the LED device is one of a plurality of LED devices that are to be mounted on the main surface of the substrate, and the reflecting hole is one of a plurality of reflecting holes formed in the reflecting member in correspondence with the plurality of LED devices.

Furthermore, the substrate includes an insulation board made of a ceramic material, and a wiring pattern on one of main surfaces of the insulation board.

Here, the ceramic material contains at least one of $Al_2O_3$, AlN, $SiO_2$, and SiC.

The above objective is also achieved by an LED module constituted by this LED mounting module and an LED device mounted on the LED mounting module. The LED device can be directly or indirectly (using a sub-mounting device) mounted on the LED mounting module.

According to this construction, the reflecting member and the substrate are directly adhered to each other. This can enhance the extraction efficiency of light emitted by the LED device mounted on the LED mounting module.

The above objective is also achieved by a manufacturing method of an LED mounting module including a substrate and a reflecting member having a reflecting hole in a position corresponding to an LED device which is to be mounted on one of main surfaces of the substrate. This manufacturing method includes a formation step of forming a half-cured reflecting member formed by a resin material in B stage; and a connection step of placing the half-cured reflecting member on the main surface of the substrate, and completely curing the resin material in B stage while the main surface of the substrate is in contact with a main surface of the half-cured reflecting member which faces the substrate, thereby forming the reflecting member, which is directly adhered to the substrate.

Here, a resin material in "B stage" is adhesive because the viscosity of the resin material has been lowered by heating. The resin material in "B stage" is completely cured by further heating.

According to this manufacturing method, the reflecting member is formed and directly adhered to the substrate by completely curing the resin material in B stage forming the half-cured reflecting member. This indicates that a step of adhering the reflecting member and the substrate is not separately required, differently from the prior art. Therefore, the LED mounting module can achieve improved extraction efficiency of light emitted by an LED device which is to be mounted, without increasing a cost.

Here, the reflecting member is made of a thermosetting resin material, and in the connection step, the substrate and the half-cured reflecting member are heated and applied with pressure while the main surface of the substrate is in contact with the main surface of the half-cured reflecting member.

The above objective is also achieved by a manufacturing method of an LED module. This manufacturing method includes a manufacturing step of manufacturing an LED mounting module, based on the manufacturing method described above; a mounting step of mounting the LED device at a predetermined location on the manufactured LED mounting module; and a covering step of covering the mounted LED device with a resin material containing a phosphor powder.

According to this manufacturing method, the reflecting member is formed and directly adhered to the substrate by completely curing the resin material in B stage forming the half-cured reflecting member. This indicates that a step of adhering the reflecting member and the substrate is not separately required, differently from the prior art. Therefore, the LED module can achieve improved extraction efficiency of light emitted by an LED device, without increasing a cost.

The above objective is also achieved by a manufacturing method of an LED mounting module. This manufacturing method includes a substrate formation step of forming a substrate; and a reflecting member formation step of forming a reflecting member on one of main surfaces of the substrate, the reflecting member being made of a resin material and having a through hole in a position corresponding to an LED device which is to be mounted on the main surface of the substrate. Here, in the reflecting member formation step, the reflecting member is formed in such a manner that a molding member is placed on the main surface of the substrate, a liquid resin material is injected into a space defined between the molding member and the substrate, and the resin material in the space is cured.

According to this manufacturing method, the reflecting member is formed in such a manner that the molding member is placed on the main surface of the substrate, a liquid resin material is injected into a space defined between the molding member and the substrate, and the resin material in the space is cured. This indicates that a step of adhering the reflecting member and the substrate is not separately required, differently from the prior art. Therefore, the LED mounting module can achieve improved extraction efficiency of light emitted by an LED device which is to be mounted, without increasing a cost.

Here, a wiring pattern is formed on the main surface of the substrate, the molding member is formed like a box, and has a protrusion formed on a base in a position corresponding to the LED device which is to be mounted on the main surface of the substrate, when the molding member is placed on the substrate, a top part of the protrusion faces toward the wiring pattern, a depression is formed in correspondence with the wiring pattern, in the top part of the protrusion, a width of the depression is larger than a width of the wiring pattern, by 1 μm to 20 μm, and a portion of the depression, which corresponds to a portion of the wiring pattern on which the LED device is to be mounted, has a depth larger than a thickness of the wiring pattern.

Here, the liquid resin material is injected under reduced pressure, and in the reflecting member formation step, after the resin material in the space is cured, a surface of the cured resin material which faces away from the substrate is flattened, and flash is removed by spraying particles against the flash.

The above objective is also achieved by a manufacturing method of an LED module. This manufacturing method includes a mounting step of mounting an LED device on one of main surfaces of a substrate; and a reflecting member formation step of forming a reflecting member on the main surface of the substrate on which the LED device has been mounted, the reflecting member being made of a resin material and having a through hole in a position corresponding to the LED device. Here, in the reflecting member formation step, the reflecting member is formed in such a manner that a molding member is placed on the main surface of the substrate, a liquid resin material is injected into a space defined between the molding member and the substrate, and the resin material in the space is cured.

According to this manufacturing method, the reflecting member is formed in such a manner that the molding member is placed on the main surface of the substrate, a liquid resin material is injected into a space defined between the molding member and the substrate, and the resin material in the space is cured. This indicates that a step of adhering the reflecting member and the substrate is not separately required, differently from the prior art. Therefore, the LED module can achieve improved extraction efficiency of light emitted by an LED device, without increasing a cost.

Here, a wiring pattern is formed on the main surface of the substrate, the molding member is formed like a box, and has a protrusion formed on a base in a position corresponding to the LED device mounted on the main surface of the substrate, when the molding member is placed on the substrate, a top part of the protrusion faces toward the wiring pattern, a depression corresponding to the wiring pattern and a depression corresponding to the LED device are formed in the top part of the protrusion, and a width of the depression corresponding to the wiring pattern is larger than a width of the wiring pattern, by 1 µm to 20 µm.

Here, the liquid resin material is injected under reduced pressure, and in the reflecting member formation step, after the resin material in the space is cured, a surface of the cured resin material which faces away from the substrate is flattened, and flash is removed by spraying particles against the flash.

BEST MODE FOR CARRYING OUT THE INVENTION

First Embodiment

The following describes a lighting apparatus relating to a first embodiment of the present invention, an LED module and an LED mounting module used in the lighting apparatus, and a manufacturing method of the LED mounting module, with reference to the attached drawings.

(1) Lighting Apparatus

1. Construction

Figure 1:
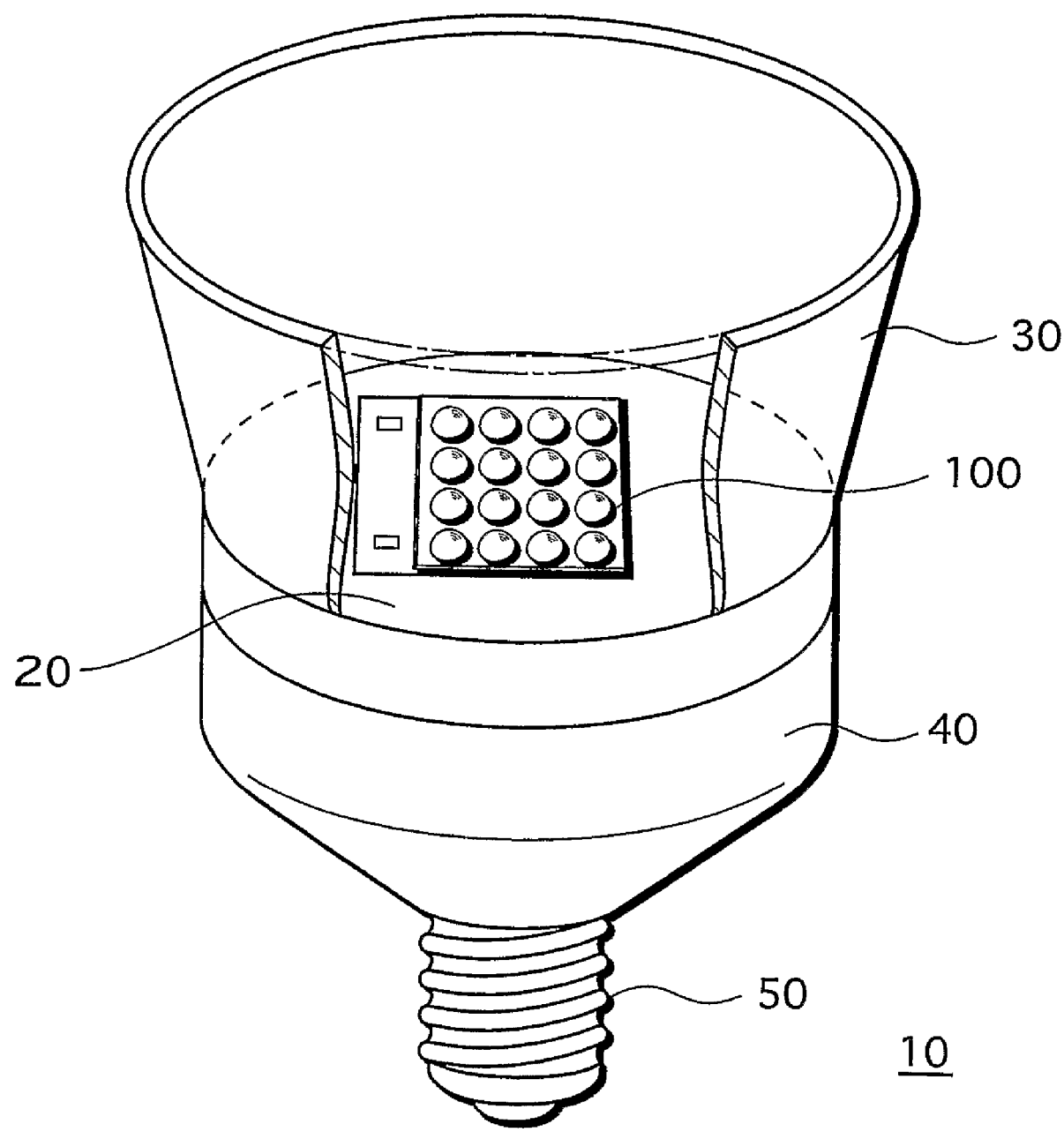
FIG. 1 is an overall view illustrating a lighting apparatus relating to a first embodiment of the present invention.

FIG. 1 is an overall view illustrating the lighting apparatus relating to the first embodiment.

A lighting apparatus 10 is constituted by an LED module 100, a holding part 20, a reflection umbrella 30, a case 40, a cap 50, and a lighting unit (not shown in FIG. 1). The LED module 100 has LED devices mounted therein. The holding part 20 is used to hold the LED module 100. The reflection umbrella 30 reflects light emitted by the LED module 100 forward. The case 40 is attached to a surface of the holding part 20 which is opposite to a surface on which the LED module 100 is provided. The cap 50 is attached to an end of the case 40 which is opposite to a surface connected to the holding part 20. The lighting unit is housed in the case 40, and used to cause the LED module 100 to illuminate.

The cap 50 is a screw-type cap used in typical incandescent lamps, for example, E 26 type. To reflect light emitted from the LED module 100 forward, an internal surface of the reflection umbrella 30 is applied with white paint, or is a mirror finish surface, if the reflection umbrella 30 is made of a metal, for example.

The lighting unit uses publicly-known circuits to cause LED devices to emit light by means of a commercial power source. For example, the lighting unit includes a rectifying circuit that rectifies alternating-current (AC) power supplied by a commercial power source into direct-current (DC) power, a voltage adjusting circuit that adjusts a voltage value of the DC power obtained by the rectifying circuit, and the like.

2. LED Module 100

Figure 2:
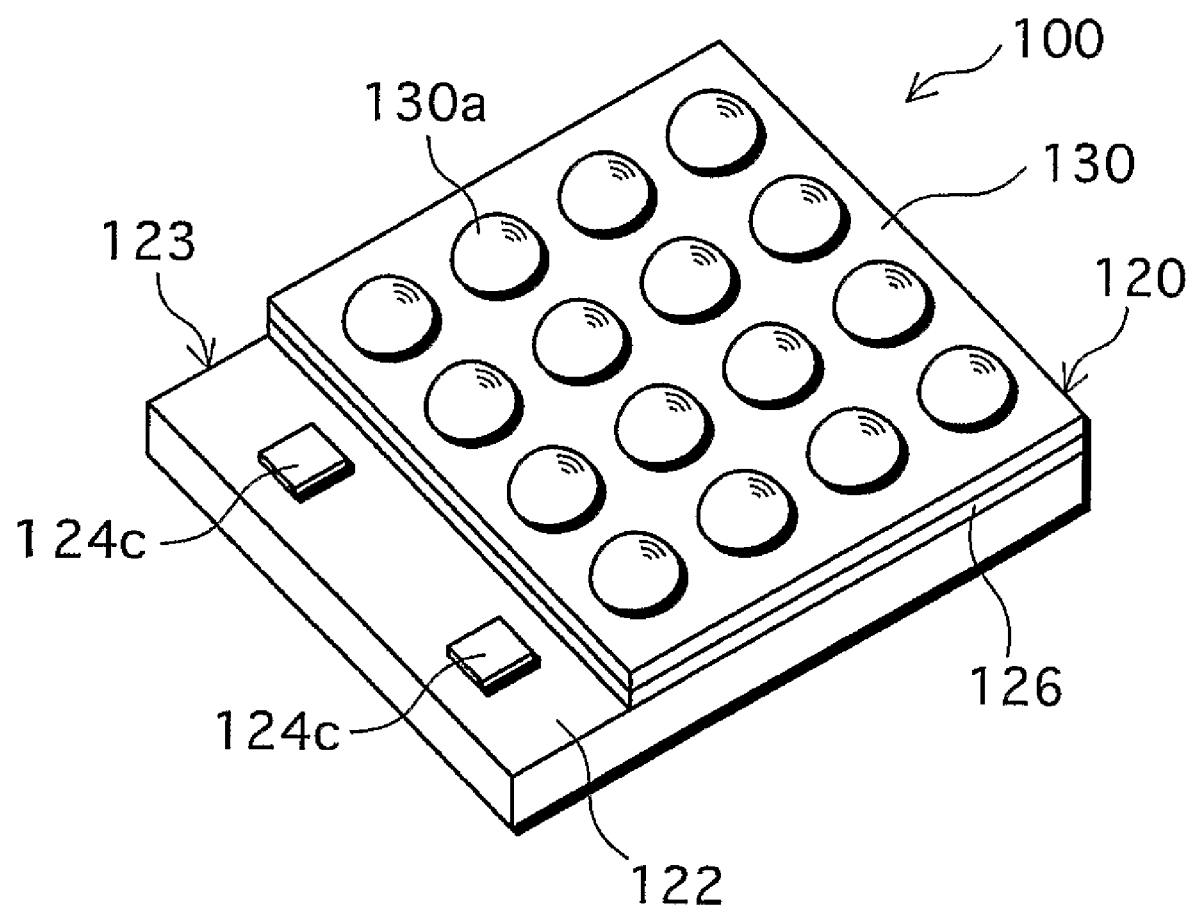
FIG. 2 is a perspective view illustrating an LED module relating to the first embodiment.
Figure 3A:
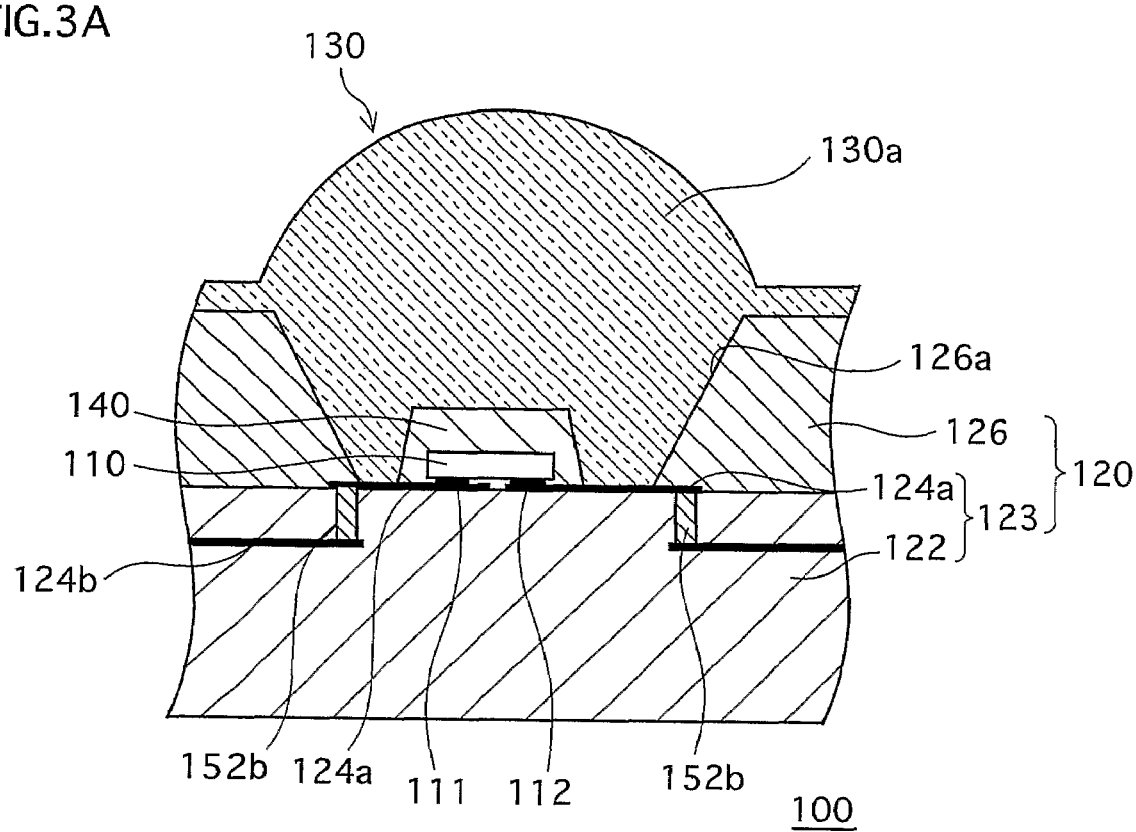
FIG. 3A is an enlarged cross-sectional view illustrating a part of the LED module in which an LED device is mounted.
Figure 3B:
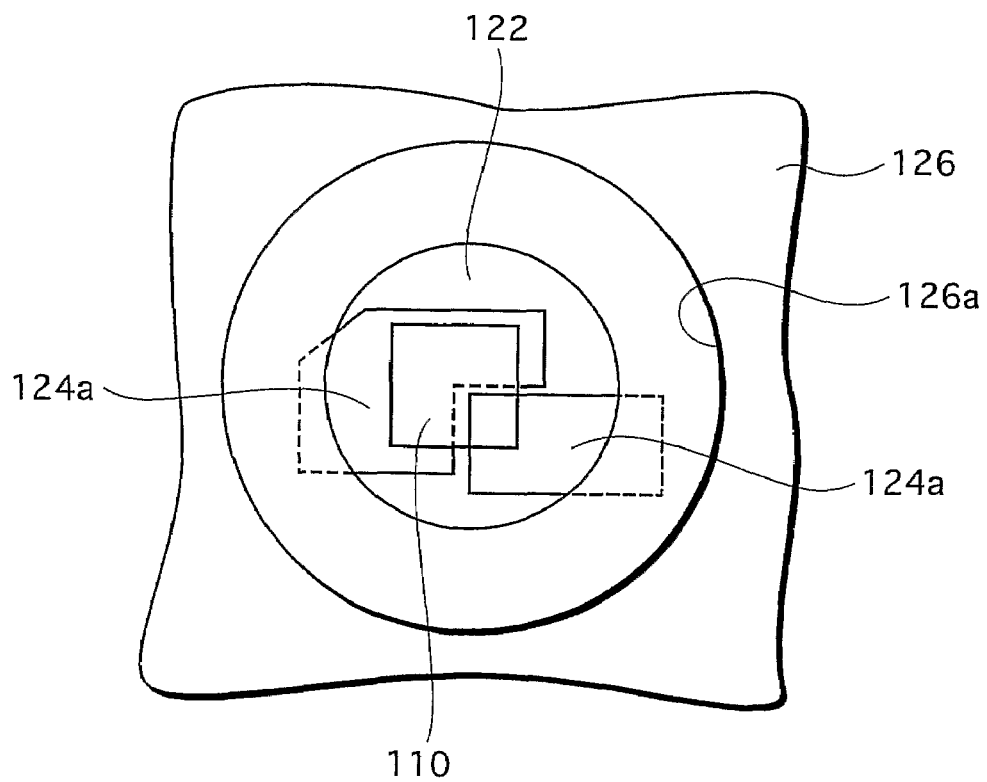
FIG. 3B is an enlarged plan view illustrating the part of the LED module without a lens board.

FIG. 2 is a perspective view illustrating the LED module 100 relating to the first embodiment. FIG. 3A is an enlarged cross-sectional view illustrating a part of the LED module 100 in which each LED device is mounted, and FIG. 3B is an enlarged plan view illustrating the part of the LED module 100 without a lens board.

The LED module 100 is constituted by a plurality of LED devices 110, an LED mounting module 120, and a lens board 130. The LED devices 110 are mounted on a front surface of the LED mounting module 120. The lens board 130 is provided to the front surface of the LED mounting module 120. The LED module 100 is a multiple-point light source, with the LED devices 110 being arranged regularly in directions perpendicular to each other. In the first embodiment, the LED devices 110 are arranged in a matrix of 4×4 at even intervals, in row and column directions perpendicular to each other, as shown in FIG. 2. The LED module 100 functions as a sheet light source by causing the LED devices 110 to emit light.

The distinction between the LED module 100 and the LED mounting module 120 is whether the LED devices 110 are mounted or not.

Figure 4:
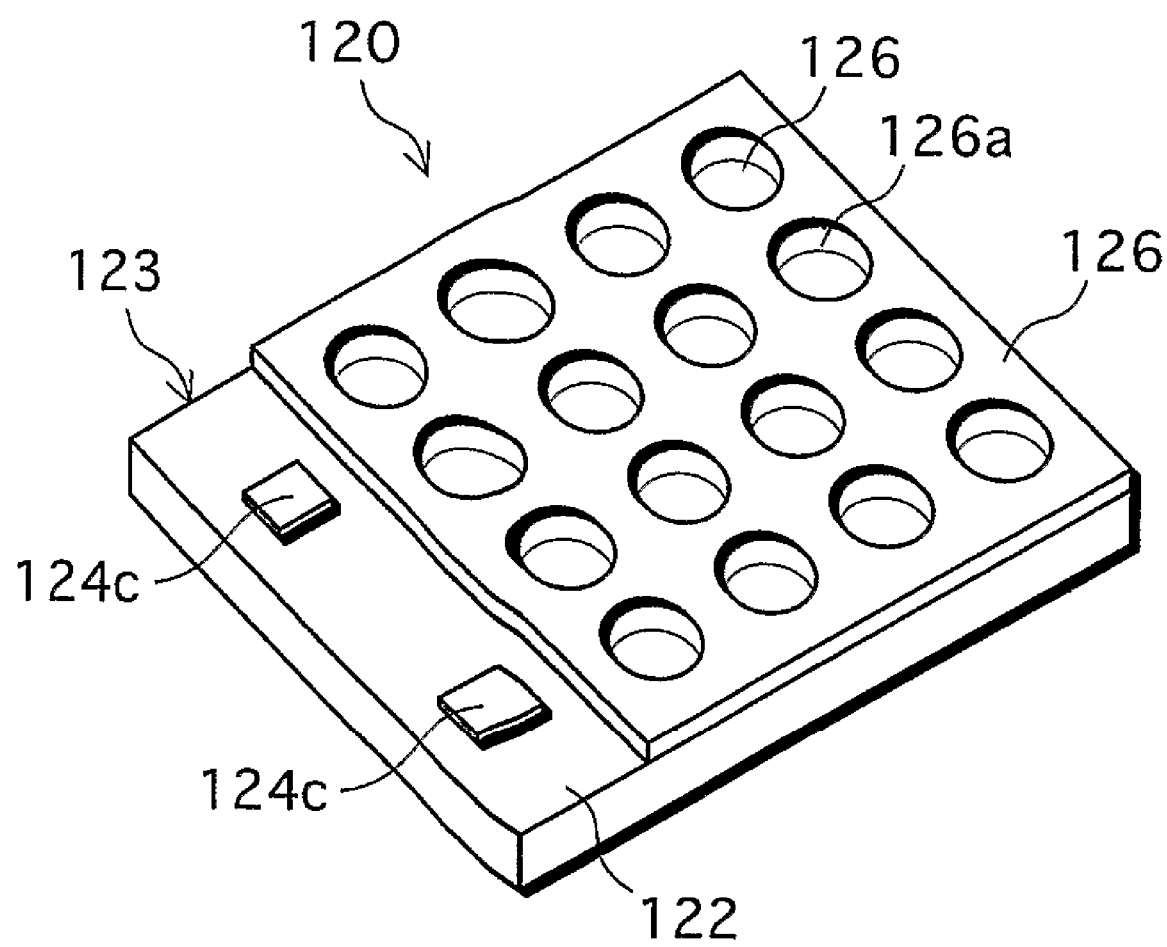
FIG. 4 is a perspective view illustrating an LED mounting module relating to the first embodiment.
Figure 5A:
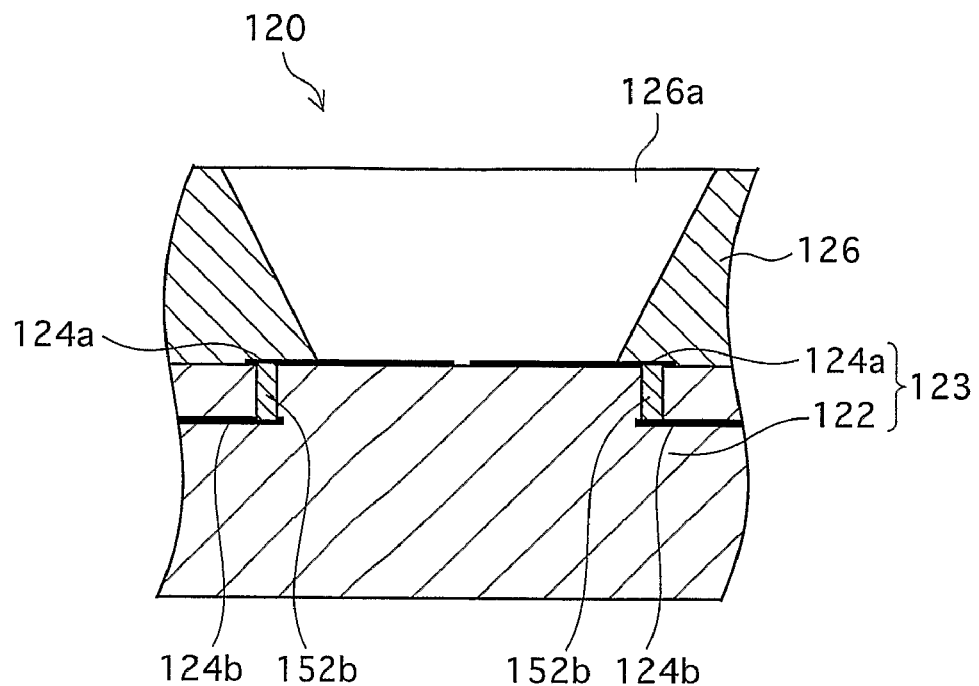
FIG. 5A is an enlarged cross-sectional view illustrating a part of the LED mounting module in which an LED device is to be mounted.
Figure 5B:
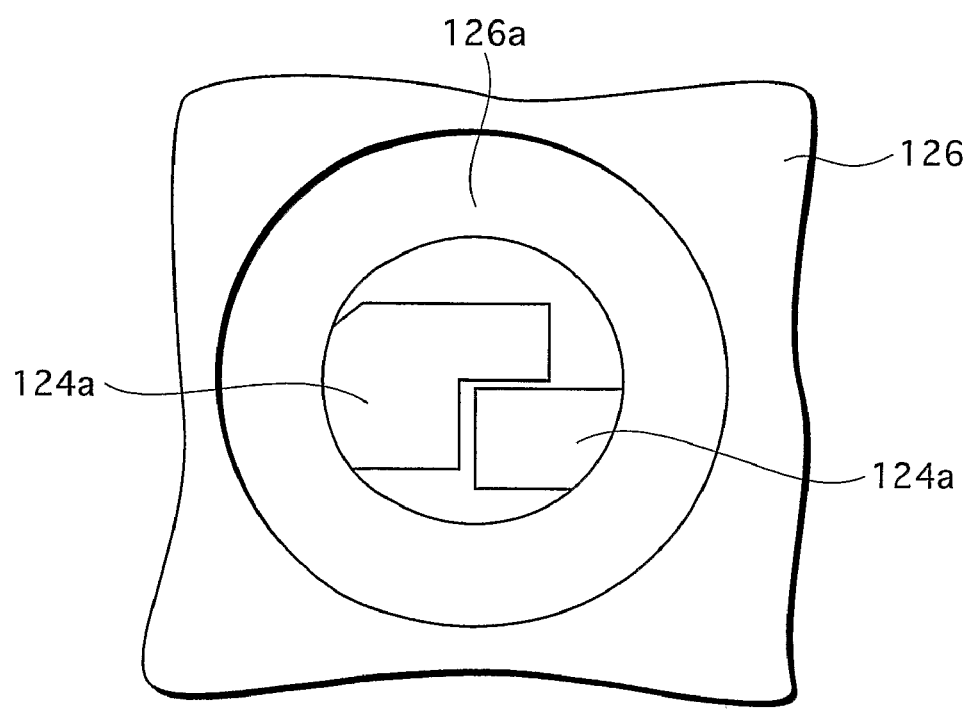
FIG. 5B is an enlarged plan view illustrating the part of the LED mounting module.

FIG. 4 is a perspective view illustrating the LED mounting module 120 relating to the first embodiment. FIG. 5A is an enlarged cross-sectional view illustrating a part of the LED mounting module 120 in which each LED device 110 is to be mounted, and FIG. 5B is an enlarged plan view illustrating the part of the LED mounting module 120 in which each LED device 110 is to be mounted.

The LED mounting module 120 is constituted by a printed wiring board 123 (corresponding to a substrate in the claims) and a reflecting board 126 (corresponding to a reflecting member in the claims) as shown in FIGS. 3 to 5. The printed wiring board 123 is formed in such a manner that wiring patterns 124 to mount the LED devices 110 are provided on a main surface of an insulation board 122. The reflecting board 126 has reflecting holes 126a provided in correspondence with locations, on the printed wiring board 123, where the LED devices 110 are to be mounted. The reflecting board 126 is made of a resin. The reflecting board 126 and the printed wiring board 123 are directly adhered to each other at their main surfaces that face each other.

The insulation board 122 is made of a ceramic material, for example. The ceramic material includes at least one of $Al_2O_3$, AlN, $SiO_2$, and SiC. In the first embodiment, the ceramic material includes $Al_2O_3$, as an example.

The insulation board 122 made of the ceramic material containing at least one of $Al_2O_3$, AlN, $SiO_2$, and SiC has high heat conductivity. This is particularly favorable in improving heat dissipation because the LED devices 110 generate heat when emitting light.

The wiring patterns 124 include patterns 124a that are formed on a front surface of the insulation board 122 and to be connected to the LED devices 110 (hereinafter referred to as surface patterns 124a), patterns 124b that are formed within the insulation board 122 (hereinafter referred to as internal patterns 124b), and patterns 124c that are formed on the front surface of the insulation board 122 and to be connected to power supply terminals (hereinafter referred to as terminal patterns 124c).

The surface patterns 124a and the internal patterns 124b are connected to each other through via holes 152b, and the terminal patterns 124c and the internal patterns 124b are connected to each other through via holes (not shown).

Forming the wiring patterns 124 on the front surface of and within the insulation board 122 has the following advantages. The total area of the surface patterns 124a on the front surface of the insulation board 122 can be reduced, which enables the LED devices 110 to be mounted at a high density. In addition, the wiring patterns 124 can be more freely designed.

The reflecting holes 126a formed in the reflecting board 126 are each tapered toward its end facing the printed wiring board 123 (i.e. downward) as shown in FIG. 3, for example. In other words, the diameter of the reflecting hole 126a gradually increases from its bottom end to its open end. The reflecting board 126 is made of a thermosetting resin material, specifically speaking, an epoxy resin and fillers. The fillers include at least one of $TiO_2$, $SiO_2$, $Al_2O_3$, and $BaSO_4$.

The first embodiment uses a thermosetting resin material containing $TiO_2$, for example. Being made of the resin material containing at least one of $TiO_2$, $SiO_2$, $Al_2O_3$, and $BaSO_4$ as fillers, the reflecting board 126 has improved reflectance characteristics. As an alternative method to improve the reflectance characteristics, a thin metal film may be formed on a wall of each reflecting hole 126a (a reflecting surface) by methods such as deposition and plating, for example. If such is the case, it does not matter whether the thermosetting resin material forming the reflecting board 126 contains fillers such as $TiO_2$ or not.

Such a thin metal film can be formed by deposition in the following manner. First, a wiring pattern exposed in the reflecting hole 126a in the reflecting board 126 is masked. Next, a highly-reflective metal material such as Ag, Au and Al is deposited in reduced-pressure atmosphere, for example. When using a different method, a metal paste of Ag, Au, Al or the like is applied to the reflecting surface, and heated to be cured, for example.

The LED devices 110 each have an anode and a cathode on its back surface as shown in FIG. 3. The anode and cathode are connected to the wiring patterns 124a on the printed wiring board 123, through gold bumps 111 and 112, for example. Thus, each LED device 110 is (flip-chip) mounted.

The light emitted from the LED device 110 may need to be converted into light of a different color. In this case, a phosphor 140, which is made of silicone or an epoxy resin containing predetermined phosphor powders, is formed so as to enclose the LED device 110 therein.

The lens board 130 is made of a translucent epoxy resin, for example. As shown in FIG. 3, the lens board 130 partially protrudes to form a hemispherical shape (convex lens 130a), in correspondence with each reflecting hole 126a in the reflecting board 126, that is to say, the location where each LED device 110 is mounted. The reflecting hole 126a is filled with the same resin material forming the lens board 130, so that the resin material in the reflecting hole 126a is combined with the convex lens 130a.

The reflecting board 126 and the lens board 130 have a substantially square planar shape, for example. The insulation board 122 has a rectangular planar shape whose shorter side has a length equivalent to a side of the reflecting board 126 and the lens board 130. The terminal patterns 124c are formed in a portion of the front surface of the insulation board 122, in which the reflecting board 126 and the lens board 130 are not formed.

3. Manufacturing Method of the LED Module 100

A manufacturing method of this LED module 100 includes a printed wiring board formation step, a half-cured reflecting board formation step, an LED mounting module formation step, an LED mounting step, a phosphor formation step, and a lens board formation step. In the printed wiring board formation step, the printed wiring board 123 is formed. In the half-cured reflecting board formation step, the reflecting board 126 made of a resin in a half-cured state (corresponding to "in B stage" in the claims) is formed (hereinafter referred to a half-cured reflecting board). In the LED mounting module formation step, the half-cured reflecting board is adhered to the front surface of the printed wiring board 123, to form the LED mounting module 120. In the LED mounting step, the LED device 110 is mounted on the LED mounting module 120. In the phosphor formation step, the phosphor 140 is formed so as to enclose the mounted LED device 110 therein. In the lens board formation step, the lens board 130 is formed.

A. Printed Wiring Board Formation Step

Figure 6:
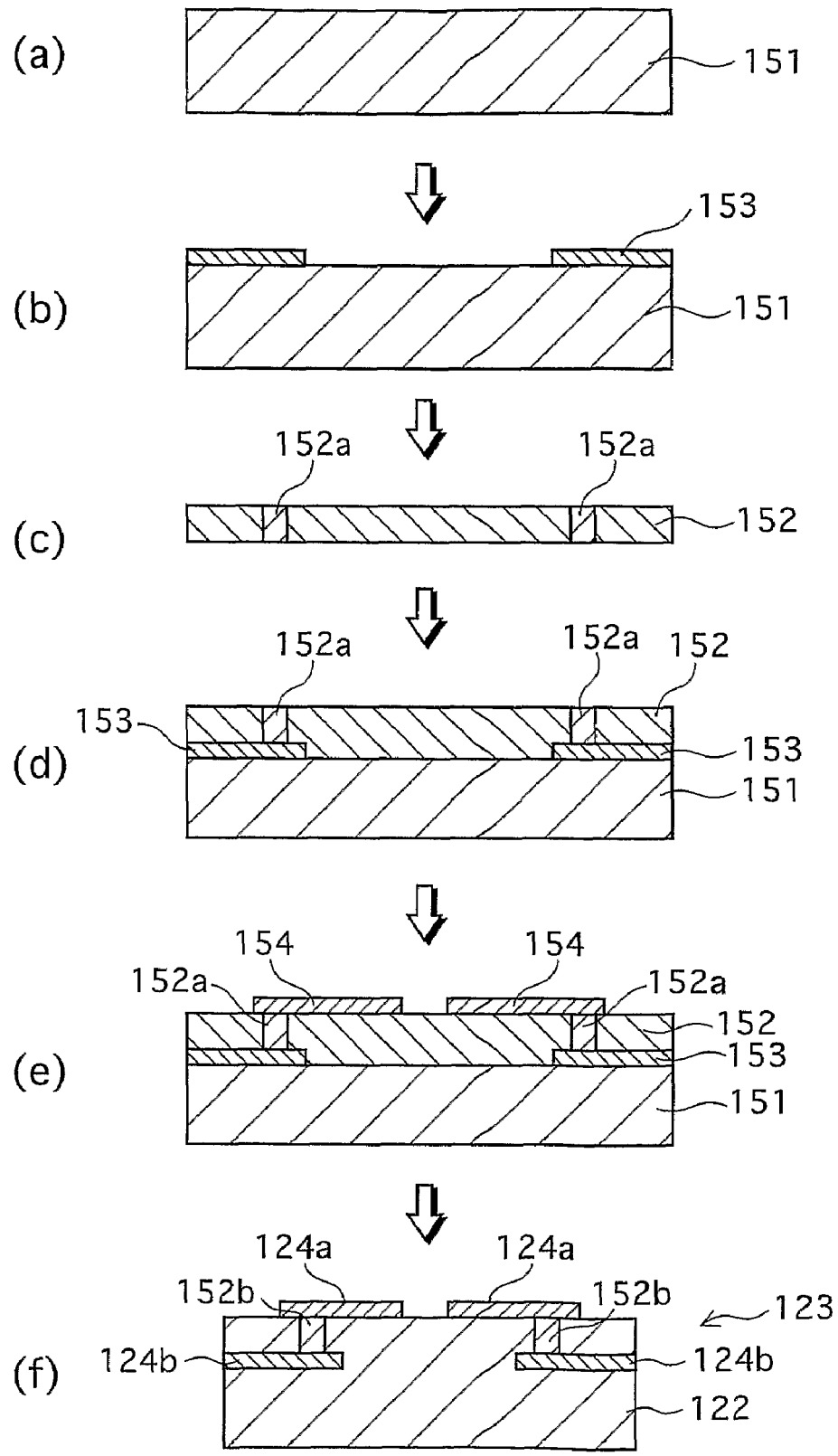
FIG. 6 is used to explain a printed wiring board formation step.

FIG. 6 is used to explain the printed wiring board formation step.

Here, it is assumed that the insulation board 122 constituting the printed wiring board 123 is made of a ceramic material including $Al_2O_3$.

To start with, a green sheet 151 made of a ceramic material including $Al_2O_3$ ((a) in FIG. 6) is used. On a front surface of the green sheet 151, patterns 153, which are to be formed into the internal patterns 124b, are formed by screen-printing or the like, using a conductive paste made of tungsten, copper or the like.

A green sheet 152, different from the green sheet 151, is next used. In the green sheet 152, through holes are formed in predetermined locations by blanking or the like. The through holes are filled with a conductive paste made of tungsten, copper or the like, to form via holes 152a. ((c) in FIG. 6).

The green sheet 152 with the via holes 152a is placed on the front surface of the green sheet 151 on which the patterns 153 are formed, and the green sheets 151 and 152 are applied with pressure, to be adhered to each other. ((d) in FIG. 6) On a surface of the resulting laminate, or a front surface of the green sheet 152 which faces away from the green sheet 151, patterns 154 which are to be formed into the surface patterns 124a are formed by screen-printing using a conductive paste made of tungsten, copper or the like. ((e) in FIG. 6)

Lastly, the green sheets 151 and 152 are fired at a predetermined temperature, and the patterns 154 are plated with nickel, gold or the like. Thus, the printed wiring board 123, which is the insulation board 122 with the wiring patterns 124, is completed ((f) in FIG. 6).

In the above explanation of the printed wiring board formation step, the surface patterns 124a are formed by printing. However, the surface patterns 124a can be alternatively formed by sputtering, deposition, plating or the like, for example. In addition, the conductive paste may be alternatively made of silver or the like in accordance with the firing temperature of the ceramic material.

B. Half-Cured Reflecting Board Formation Step

Figure 7A:
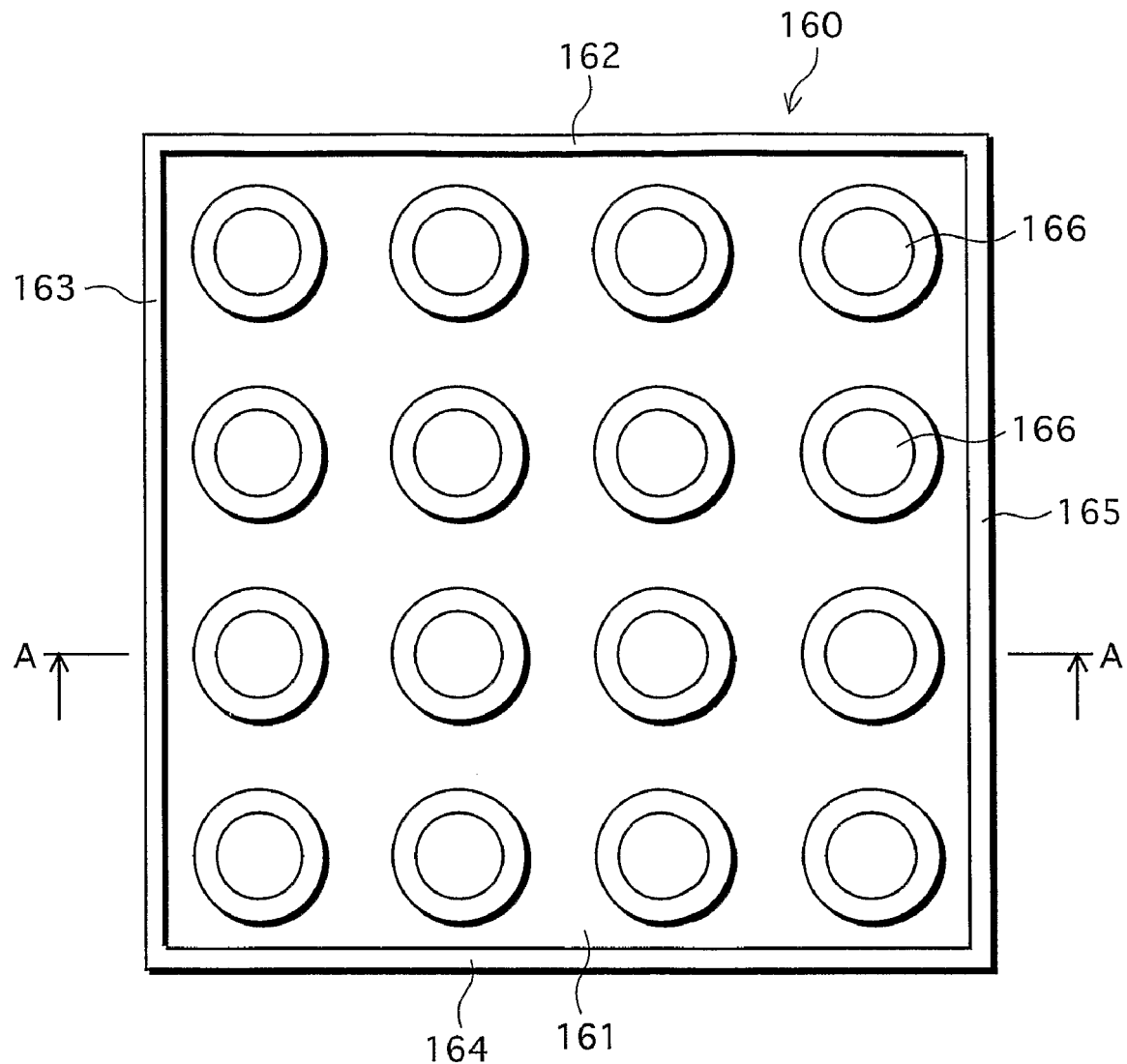
FIG. 7A is a plan view illustrating a mold.
Figure 7B:
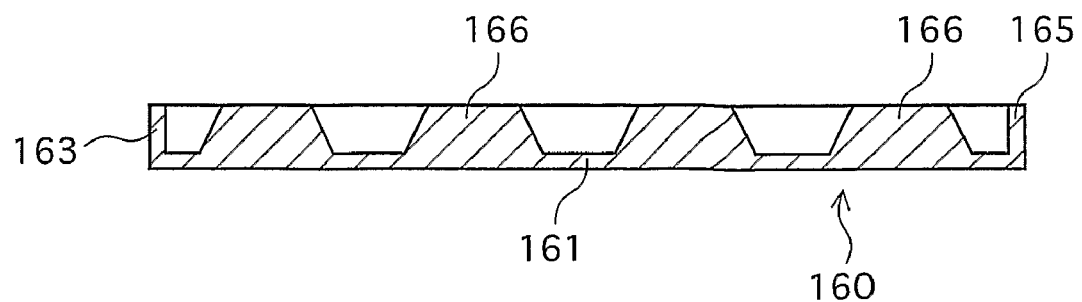
FIG. 7B is a cross-sectional view illustrating the mold along a line AA shown in FIG. 7A in a direction shown by the arrows.

FIG. 7A is a plan view illustrating a mold used to form the half-cured reflecting board, and FIG. 7B is a cross-sectional view illustrating the mold along a line AA shown in FIG. 7A in a direction shown by the arrows.

A mold 160 is formed like a box which is open at the upper side. A planar shape of the mold 160 is substantially square in correspondence with the planar shape of the reflecting board 126. The mold 160 has a base 161, and side walls 162, 163, 164 and 165 that are provided so as to extend vertically at different edges of the base 161. On an internal surface of the base 161, conoidal protrusions 166 are arranged in a matrix of 4×4. Here, the conoidal protrusions 166 have a shape formed by removing a portion of a cone which includes an apex. When the half-cured reflecting board is formed using this mold 160, the protrusions 166 correspond to the reflecting holes 126a in the reflecting board 126.

Figure 8:
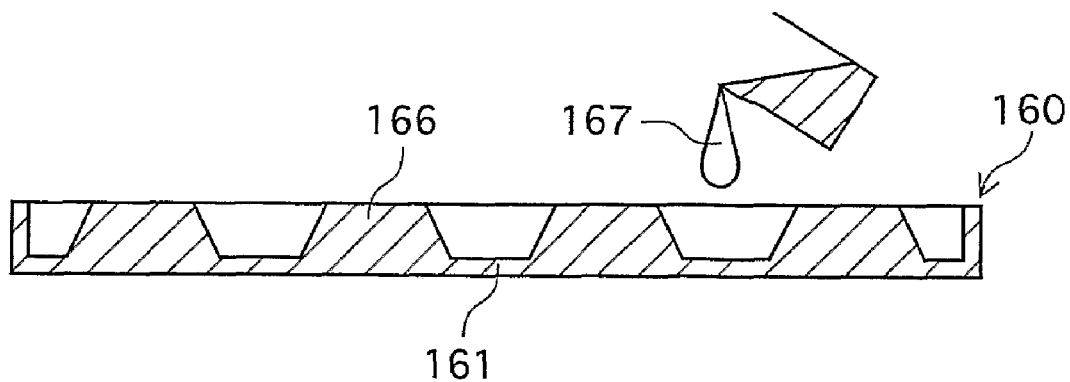
FIG. 8 is used to explain a half-cured reflecting board formation step.
Figure 8:
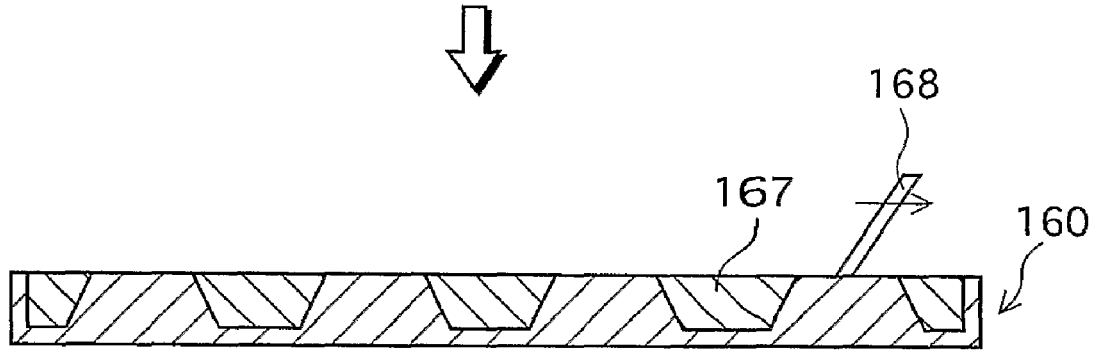
Figure 8:
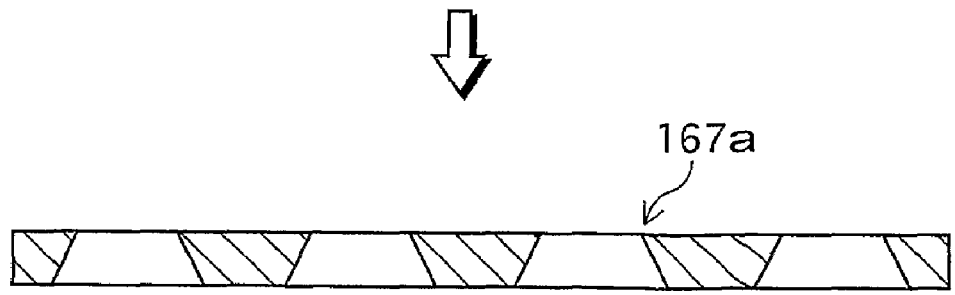

FIG. 8 is used to explain the half-cured reflecting board formation step.

To start with, this mold 160 is arranged so that the base 161 faces downward, and is substantially horizontal. Subsequently, the mold 160 is filled with a liquid epoxy resin 167, for example, ((a) in FIG. 8) and an unnecessary amount of the epoxy resin 167 is then removed.

The resin material 167 principally includes an epoxy resin, and further contains $TiO_2$ to enhance reflection efficiency.

The unnecessary amount of the epoxy resin 167 can be removed by using a squeegee 168, for example. Specifically speaking, one side of the squeegee 168 is placed so as to be in contact with an upper edge of the mold 160, and the squeegee 168 is then slid in a direction shown by the arrow in (b) in FIG. 8, for example.

After this, the epoxy resin 167 is heated at 80° C. for 15 minutes, for example, to be half-cured. Thus, the half-cured reflecting board 167a is formed. The conditions of heating can vary, and need to be appropriately determined according to a resin material forming the reflecting board 126.

C. LED Mounting Module Formation Step

Figure 9:
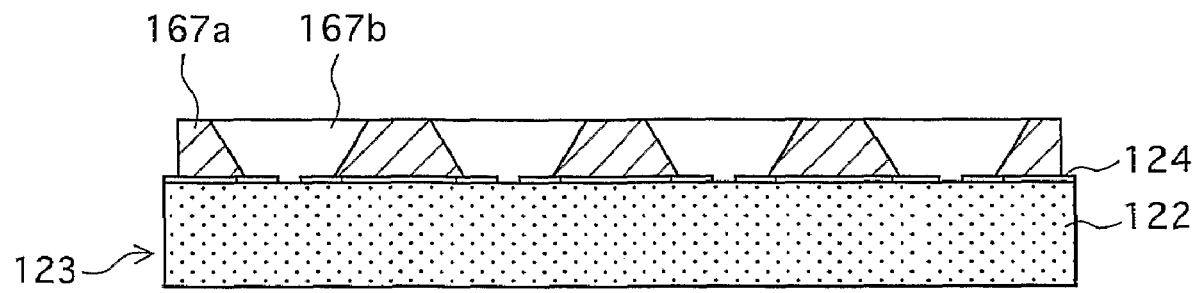
FIG. 9 is used to explain an LED mounting module formation step.
Figure 9:
Figure 9:
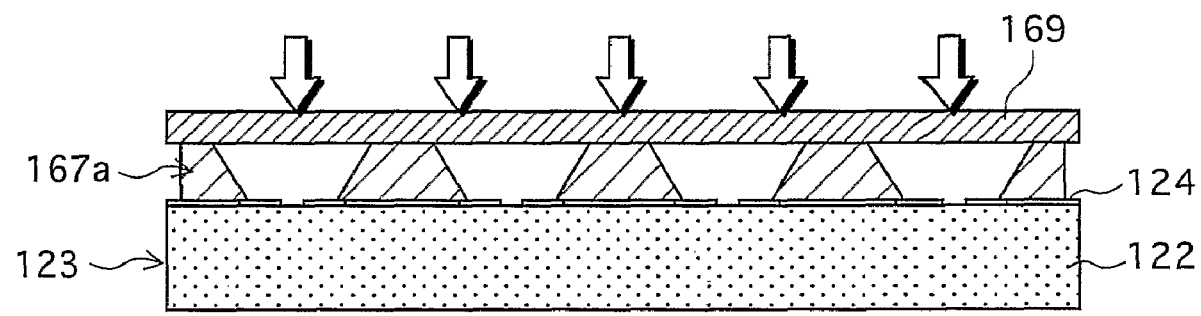
Figure 9:
Figure 9:
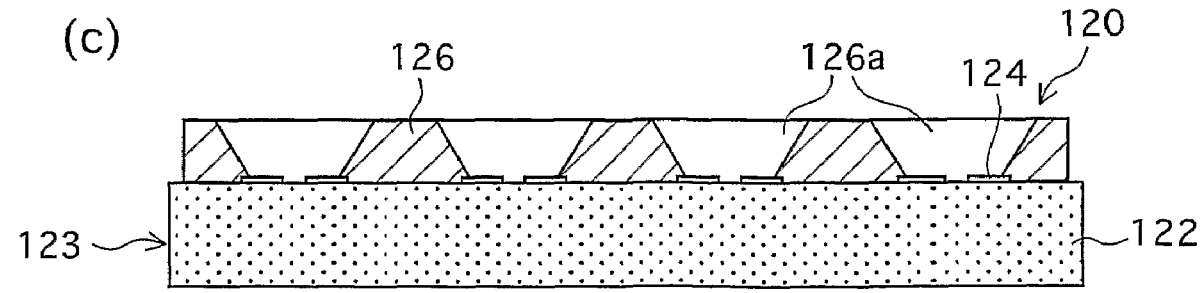

FIG. 9 is used to explain the LED mounting module formation step.

The half-cured reflecting board 167a is placed on the surface of the printed wiring board 123 on which the wiring patterns 124 are formed, in such a manner that the location on the printed wiring board 123 where the LED device 110 is to be mounted corresponds to a substantially center of a hole 167b formed in the half-cured reflecting board 167a. ((a) in FIG. 9)

At this point of the manufacturing method, the resin material 167 forming the half-cured reflecting board 167a is half-cured, or in B stage. Therefore, the shape of the half-cured reflecting board 167a can be maintained. For this reason, the half-cured reflecting board 167a can be handled with ease, and placed efficiently.

Subsequently, the half-cured reflecting board 167a, being placed on the printed wiring board 123, is applied with pressure by means of a pressurizing member 169. While being applied with pressure, the half-cured reflecting board 167a is heated, to be cured. By the heating, the viscosity of the resin material 167 forming the half-cured reflecting board 167a is lowered. Thus, the resin material 167 is completely cured, while the half-cured reflecting board 167a is in contact with the printed wiring board 123. As a result, the printed wiring board 123 and the reflecting board 126 are directly adhered to each other at their surfaces that face each other. This means that the LED mounting module 120 is completed ((c) in FIG. 9).

When the half-cured reflecting board 167a is placed on the front surface of the printed wiring board 123, there may be a gap between their surfaces that face each other due to the wiring patterns 124 or the like. Since the viscosity of the resin material 167 forming the half-cured reflecting board 167a is lowered by the heating, the resin material 167 flows into such a gap. Therefore, the printed wiring board 123 and the reflecting board 126 can be adhered to each other completely. Thus, since there is no gap between the surfaces of the reflecting board 126 and the printed wiring board 123 that face each other, light emitted from the LED device 110 can be efficiently reflected toward a predetermined direction without being lost.

In an example case where a reflecting board and a printed wiring board are adhered to each other by means of an adhesive layer, an adhering sheet or the like needs to be placed on the printed wiring board, before the reflecting board is placed on the printed wiring board. The adhering sheet is very thin, and therefore difficult to be handled. On the other hand, the first embodiment of the present invention utilizes the half-cured reflecting board 167a having a shape of the reflecting board 126, which can be easily and efficiently placed on the printed wiring board 123.

D. LED Mounting Step

Figure 10:
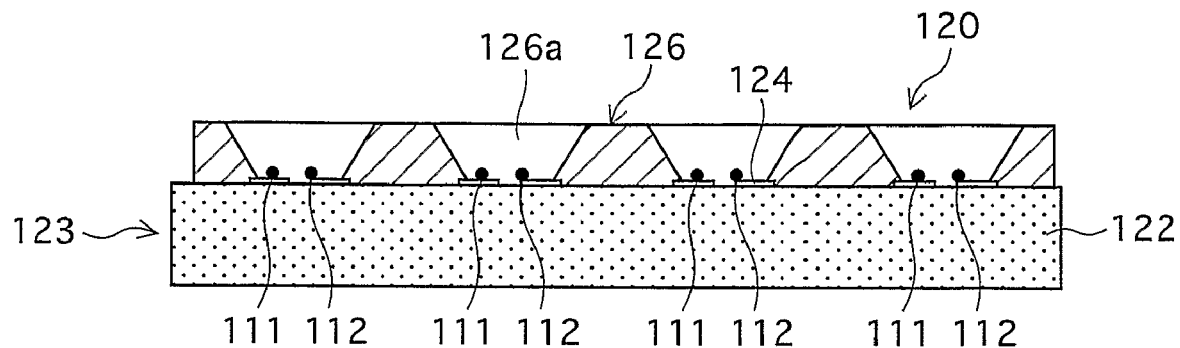
FIG. 10 is used to explain an LED mounting step.
Figure 10:
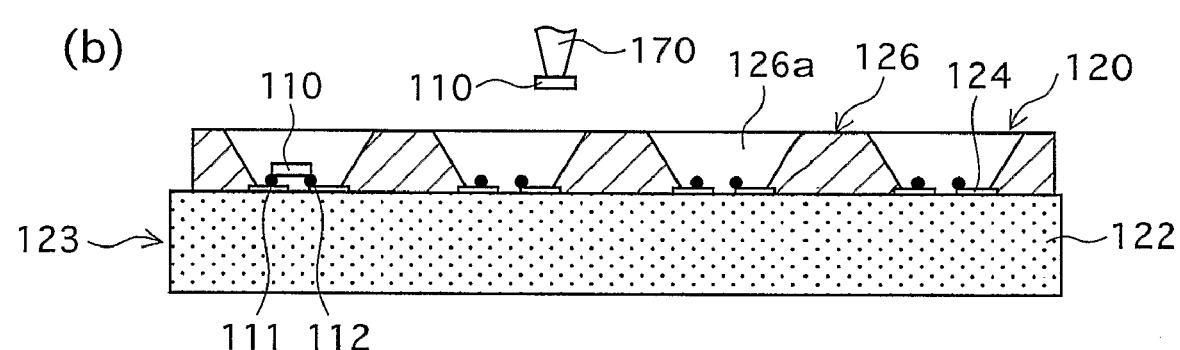
Figure 10:
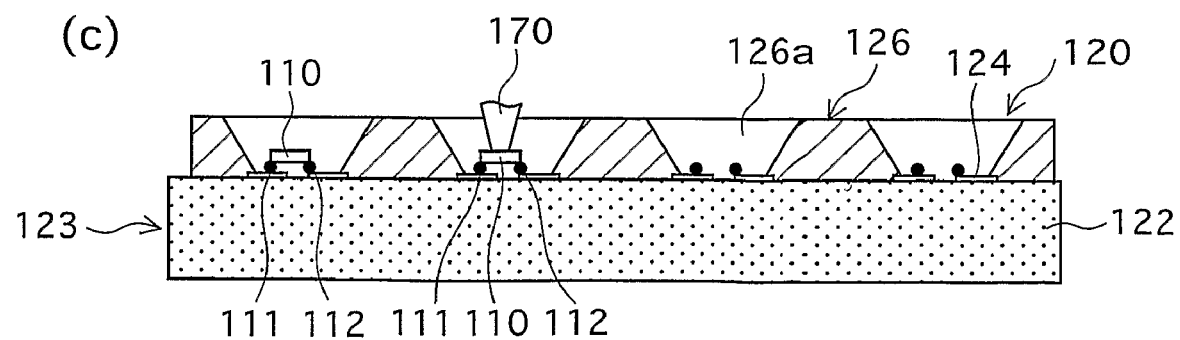

FIG. 10 is used to explain the LED mounting step.

The gold bumps 111 and 112 are, for example, formed at the location, on the LED mounting module 120, where the LED device 110 is to be mounted ((a) in FIG. 10). It goes without saying that the LED device 110 is to be mounted on the wiring patterns 124.

After this, the LED device 110 is placed on the gold bumps 111 and 112, by means of a collet 170 which holds the LED device 110 by suctioning ((b) in FIG. 10). Specifically speaking, the LED device 110, in a state of being suctioned by the collet 170, is placed on the gold bumps 111 and 112, heated, and then subjected to high-frequency (ultrasonic) vibration. In this way, the gold bumps 111 and 112 melt and then solidify. As a consequence, the LED device 110 is mounted on the surface patterns 124a through the gold bumps 111 and 112.

In the present description, the LED module 100 is defined as including the lens board 130. For this reason, the resulting module acquired by mounting the LED device 110 on the LED mounting module 120 is referred to as an LED-mounted module, in order to be distinguished from other modules.

E. Phosphor Formation Step

Figure 11:
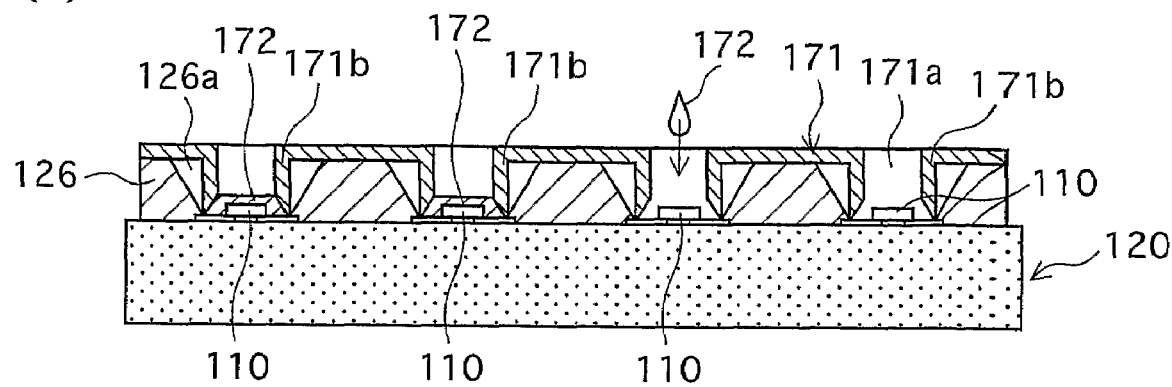
FIG. 11 is used to explain a phosphor formation step.
Figure 11:
Figure 11:
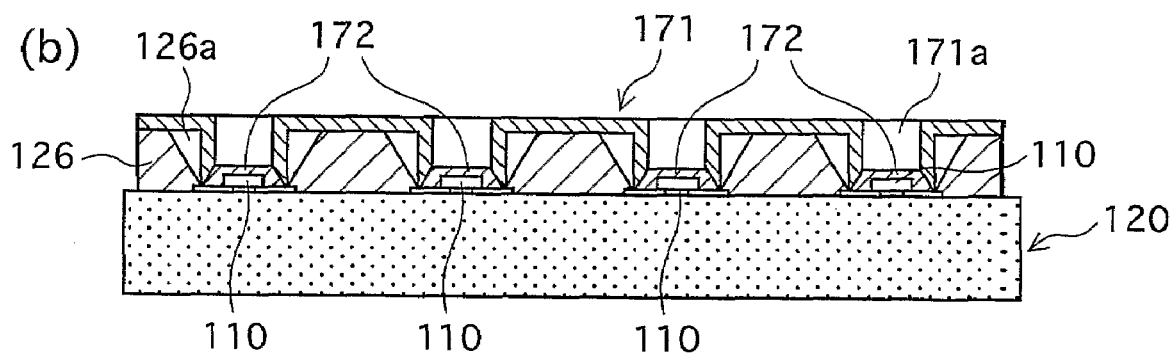
Figure 11:
Figure 11:
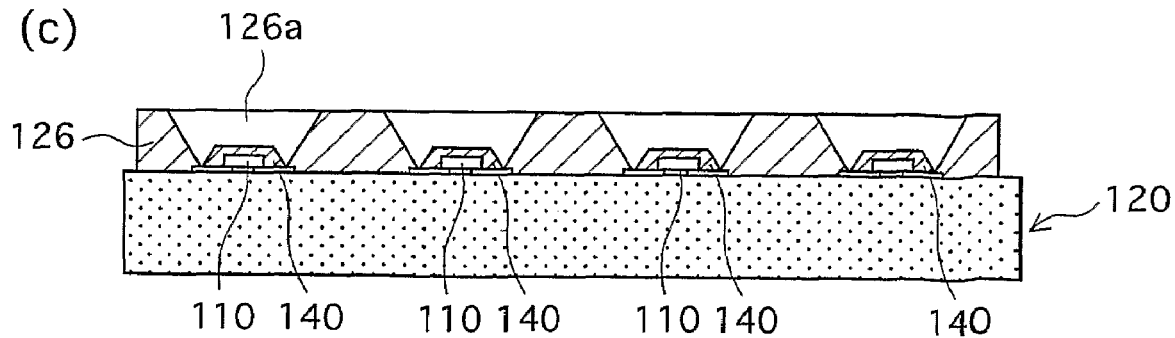

FIG. 11 is used to explain the phosphor formation step.

To form the phosphor 140, a molding jig 171 is placed on the LED-mounted module, in which the LED device 110 has been mounted. The molding jig 171 is substantially plate-like, and has protruding parts 171b in correspondence with the reflecting holes 126a in the reflecting board 126. When the molding jig 171 is placed, the protruding parts 171b protrude into the reflecting holes 126a, and are in contact with the front surface of the printed wiring board 123 at their top edge. The protruding parts 171b have through holes 171a in their center.

After this, a resin material 172 is dropped into the through holes 171a in the molding jig 171 ((a) in FIG. 11) to form the phosphor 140. Here, the resin material 172 is formed by mixing a liquid (before cured) resin with predetermined phosphor powders. The amount of the resin material 172 dropped into each through hole 171a is determined according to the size of the phosphor 140.

After the resin material 172 is dropped into all of the through holes 171a ((b) in FIG. 11), the resin material 172 is heated at 150° C. for 30 minutes, for example, to be cured. Here, the resin material 172 can be cured under different conditions.

When the resin material 172 is completely cured, the molding jig 171 is removed from the LED-mounted module.

F. Lens Board Formation Step

Figure 12:
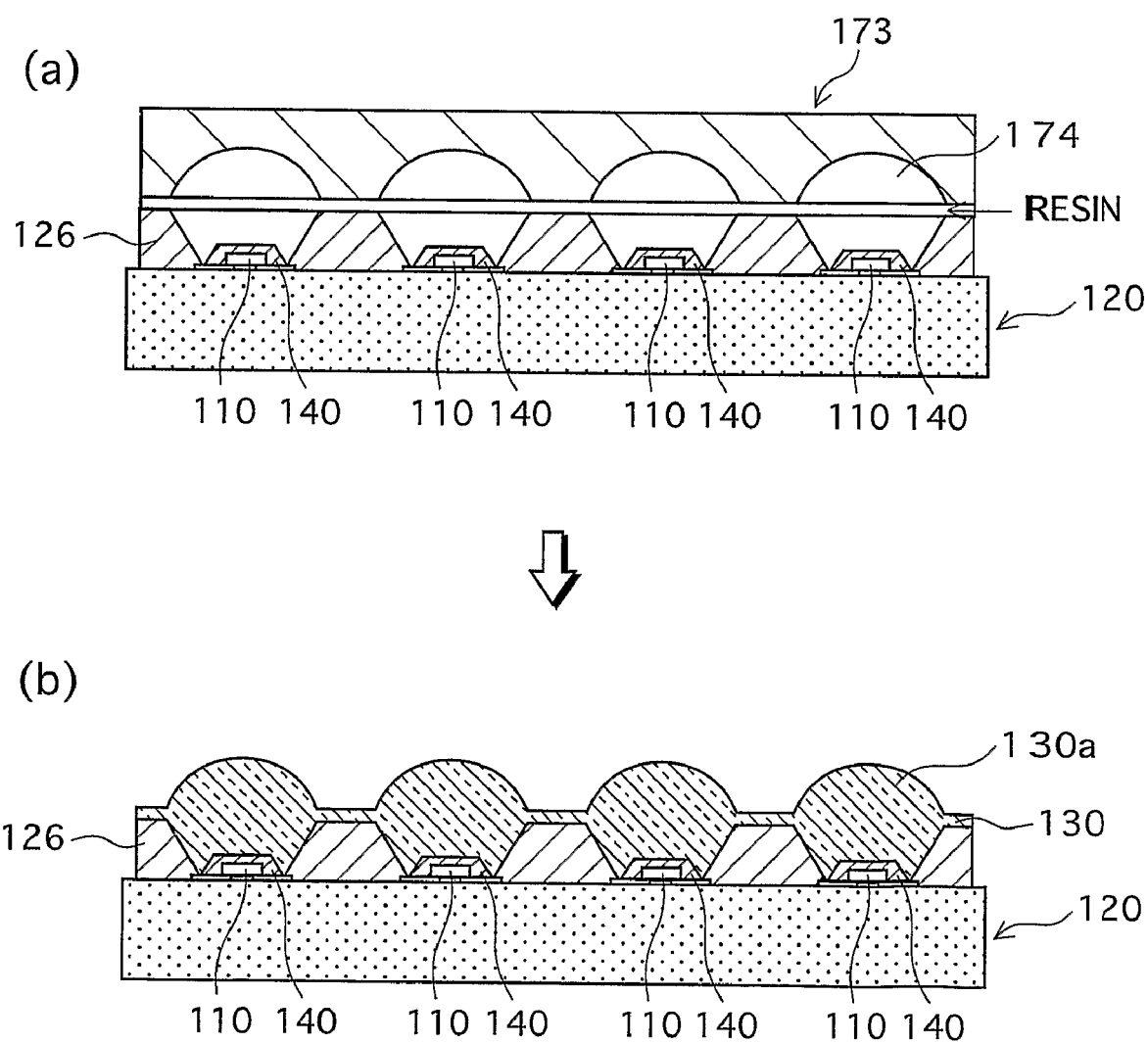
FIG. 12 is used to explain a lens board formation step.

FIG. 12 is used to explain the lens board formation step.

To form the lens board 130, a molding jig 173 is placed on the LED-mounted module, in which the phosphor 140 has been formed in the phosphor formation step. The molding jig 173 is substantially plate-like, and has depressions 174 in correspondence with locations of the reflecting holes 126a in the reflecting board 126. Here, there is a predetermined distance (corresponding to a thickness of the lens board 130) between surfaces of the molding jig 173 and the reflecting board 126.

After this, a liquid (before cured) resin material to form the lens board 130 is injected into the molding jig 173 ((a) in FIG. 12).

When the injection of the resin material is completed, the resin material is heated at 150° C. for 10 minutes, for example, to be cured. Here, the resin material can be cured under different conditions.

When the resin material is completely cured, the molding jig 173 is removed, thereby completing the LED module 100 ((b) in FIG. 12).

4. Other Matters

The first embodiment of the present invention is not limited to those described in the above section "2. LED MODULE". The above description only serves as an example in explaining the type of the LED device 110 (how the LED device 110 is connected), the configuration of the insulation board 122, the phosphor 140 (provided or not), the configuration and formation method of the phosphor 140, the formation method of the reflecting board 126 and the like. The first embodiment includes the following modification examples. The following describes first to fourth modification examples based on the first embodiment, with reference to FIGS. 13 and 14.

Figure 13A:
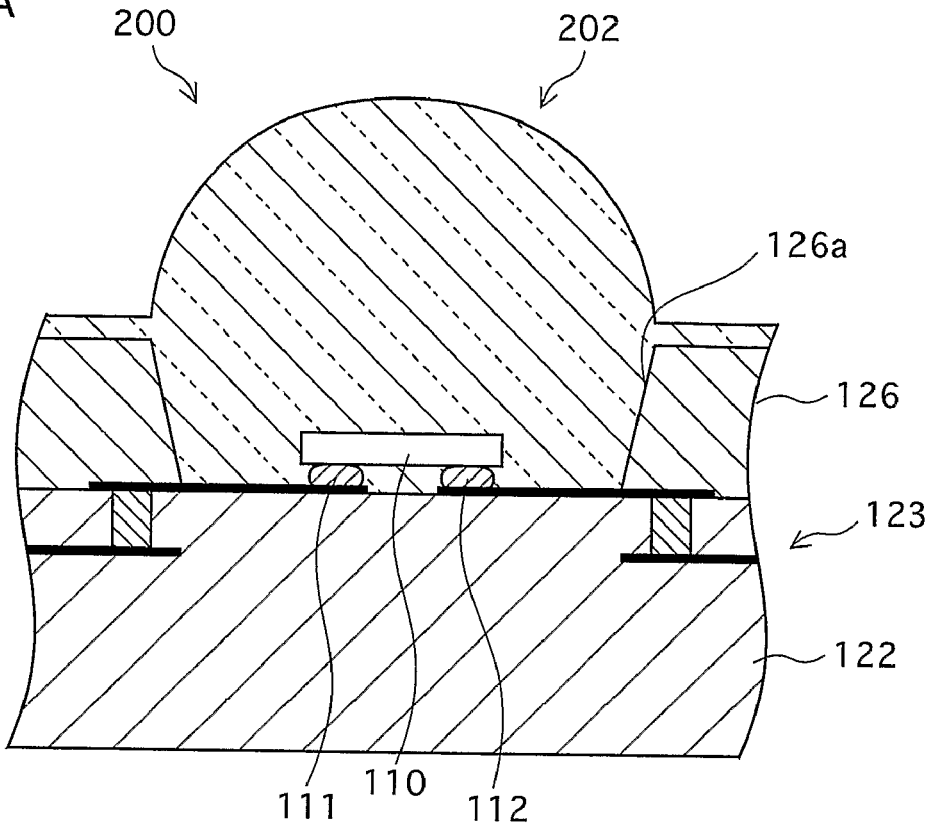
FIG. 13A is a cross-sectional view illustrating an LED module relating to a first modification example based on the first embodiment.
Figure 13B:
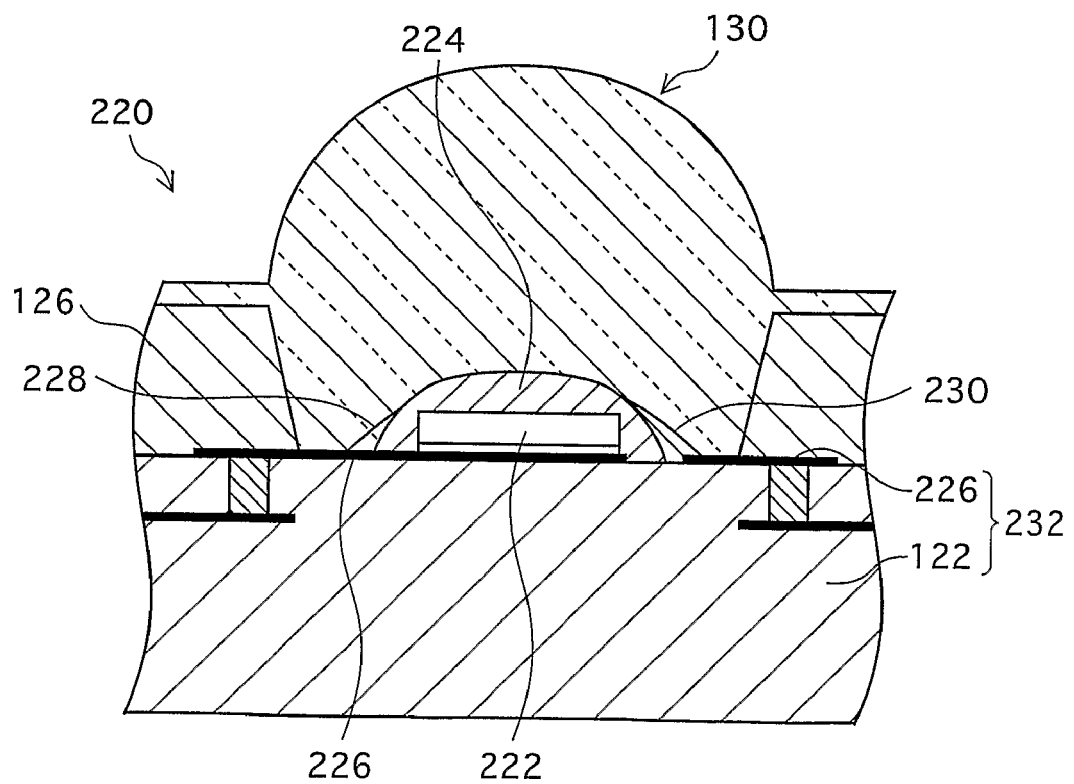
FIG. 13B is a cross-sectional view illustrating an LED module relating to a second modification example based on the first embodiment.

FIG. 13A is a cross-sectional view illustrating an LED module relating to the first modification example, and FIG. 13B is a cross-sectional view illustrating an LED module relating to the second modification example. Note that, in FIGS. 13A and 13B, the same reference numerals as in the first embodiment are used to indicate constituents having the same configuration as in the first embodiment.

FIG. 13A shows an LED module 200 relating to the first modification example. The LED module 200 does not have a phosphor enclosing the LED device 110 therein.

If light emitted by the LED device 110 needs to be converted into light of a different color, a resin material forming a lens board 202 may contain predetermined phosphor powders, or a liquid containing phosphor powders may be applied to an external surface of the lens board 202 to form a phosphor layer.

By utilizing the manufacturing method of the LED module 100, this LED module 200, in which the reflecting board 126 and the printed wiring board 123 are directly adhered to each other at their surfaces that face each other, can be basically realized.

FIG. 13B shows an LED module 220 relating to the second modification example. Instead of the LED device 110 and the phosphor 140, the LED module 220 has an LED device 222 which has two electrodes on its front surface, and a phosphor 224 enclosing the LED device 222 therein, which is formed without using a molding jig.

Having the electrodes on its front surface, the LED device 222 is connected to wiring patterns 226 formed on the front surface of the insulation board 122, using gold wires 228 and 230. The phosphor 224 is formed by dropping a liquid resin material containing predetermined phosphor powders without using a molding jig. To be specific, the resin material has not been cured and has a high viscosity, and can therefore maintain its shape to a certain extent, when dropped. Based on this, the resin material is just dropped and then cured.

As shown in FIG. 13B, one of the wiring patterns 226 is formed so as to mount the entire LED device 222. The LED device 222 is attached to this wiring pattern 226 using an insulative or conductive adhesive agent, a silver paste, or the like. Alternatively, the wiring pattern 226 may not be formed large enough to mount the LED device 222 as shown in FIG. 13B. In this case, the LED device 222 is directly attached to the insulation board 122 using an adhesive agent or the like.

The LED module 220 relating to the second modification example can be realized utilizing the manufacturing method of the LED module 100, if the phosphor formation step is performed in the above-described way. The reflecting board 126 and a printed wiring board 232 are directly adhered to each other at their surfaces that face each other also in the LED module 220.

Figure 14A:
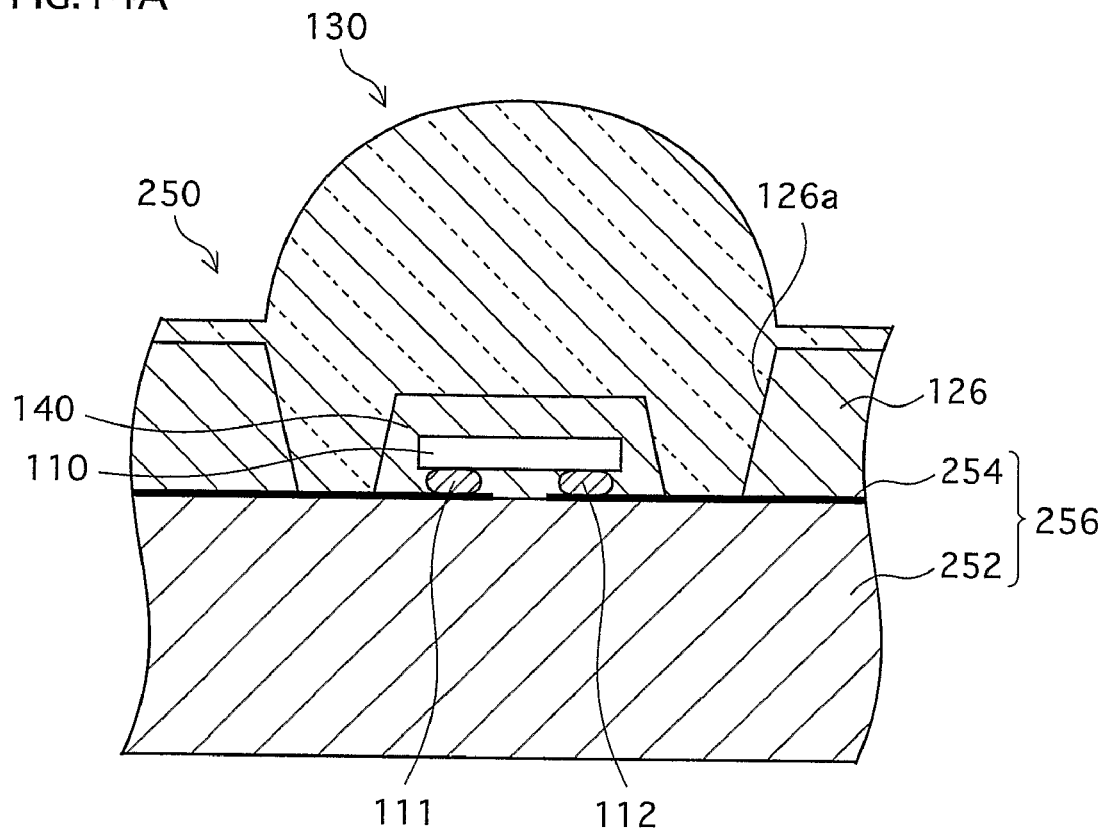
FIG. 14A is a cross-sectional view illustrating an LED module relating to a third modification example based on the first embodiment.
Figure 14B:
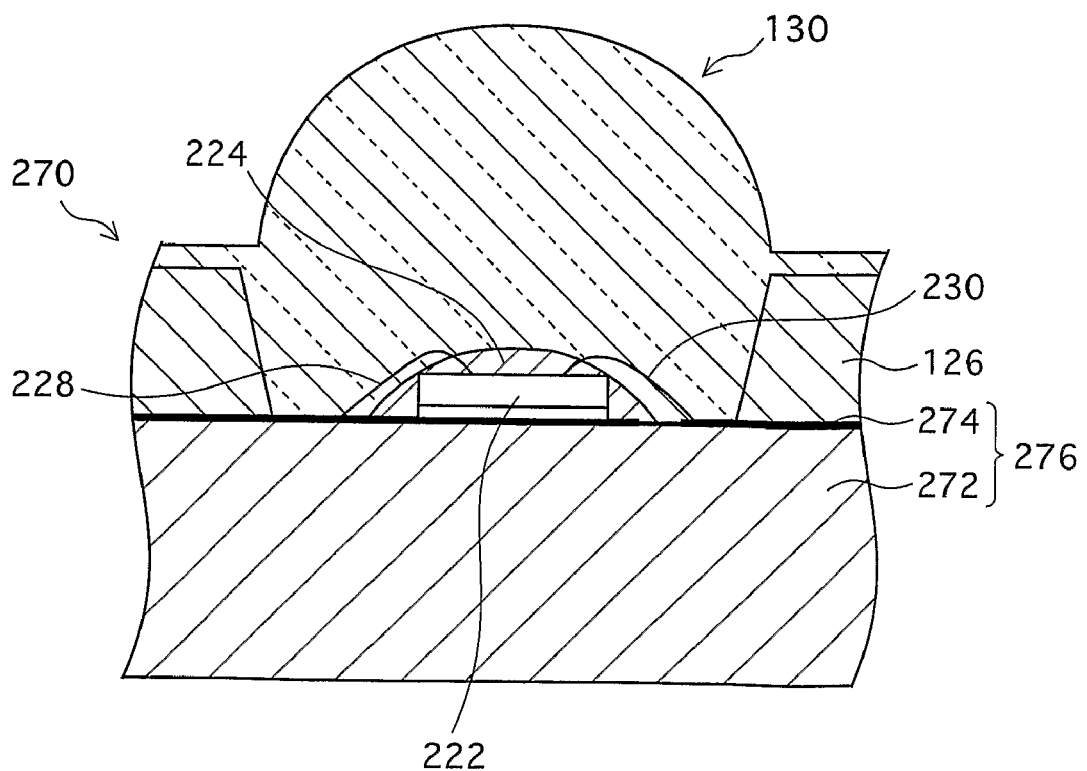
FIG. 14B is a cross-sectional view illustrating an LED module relating to a fourth modification example based on the first embodiment.

FIG. 14A is a cross-sectional view illustrating an LED module relating to the third modification example, and FIG. 14B is a cross-sectional view illustrating an LED module relating to the fourth modification example. Note that, in FIGS. 14A and 14B, the same reference numerals as in the first embodiment are used to indicate constituents having the same configuration as in the first embodiment.

FIG. 14A illustrates an LED module 250 relating to the third modification example. The LED module 250 has wiring patterns only on a front surface of an insulation board 252. FIG. 14B illustrates an LED module 270 relating to the fourth modification example. The LED module 270 also has wiring patterns only on a front surface of an insulation board 272.

According to the first embodiment, the insulation board 122 is formed by two layers of the green sheets 151 and 152 as shown in FIG. 6. Furthermore, the patterns 153 are sandwiched between the green sheets 151 and 152, and connected to the surface patterns 124a through the via holes 152b. However, the first embodiment is not limited to such. As an alternative example, a printed wiring board 256 relating to the third modification example shown in FIG. 14A may be used. The printed wiring board 256 is constituted by the insulation board 252 and wiring patterns 254 formed only on the front surface of the insulation board 252. As another alternative example, a printed wiring board 276 relating to the fourth modification example shown in FIG. 14B may be used. The printed wiring board 276 is constituted by the insulation board 272 and wiring patterns 274 formed only on the front surface of the insulation board 272.

Second Embodiment

The following describes an LED module relating to a second embodiment of the present invention, with reference to the attached figures.

The second embodiment is different from the first embodiment in that an insulation board made of a composite material containing an inorganic filler and a thermosetting resin is used, and that a metal board is provided on a back surface of a printed wiring board.

(1) Construction of LED Module

Figure 15:
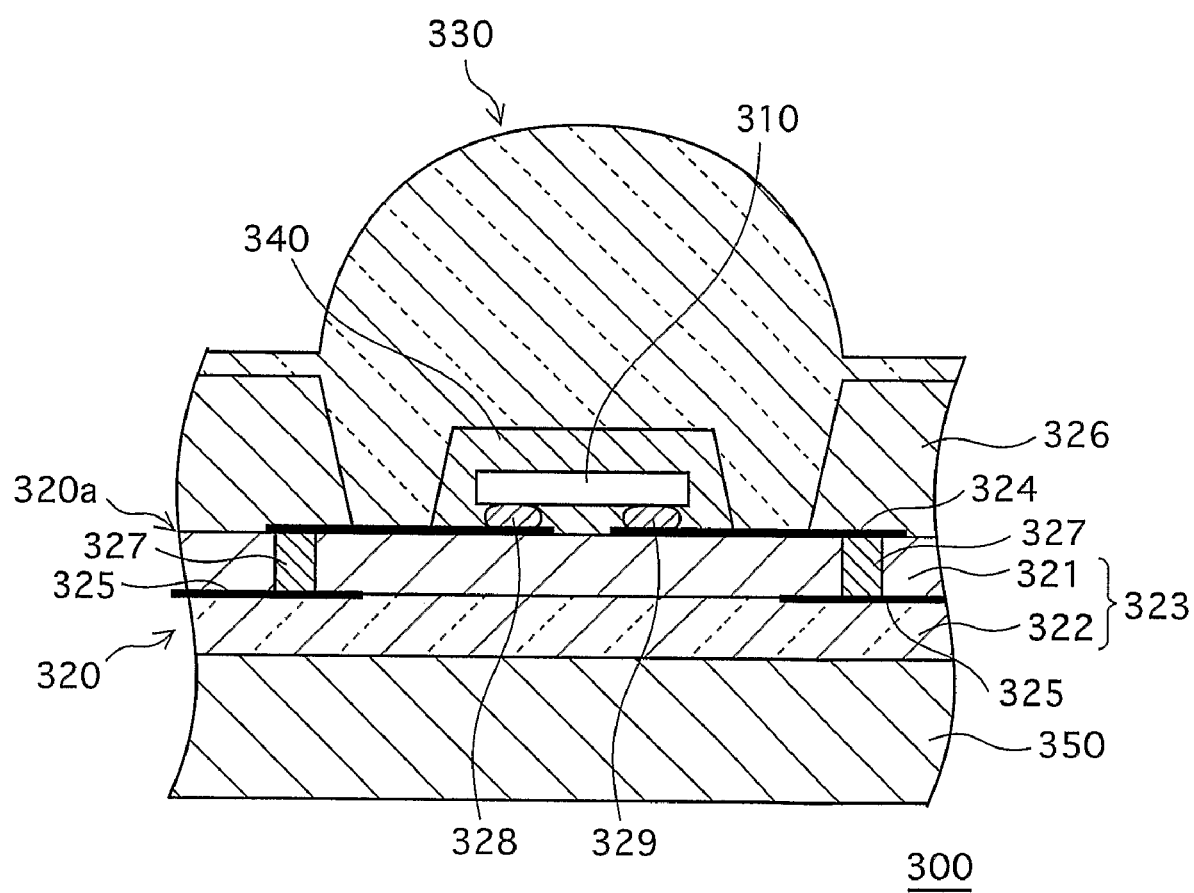
FIG. 15 is a schematic cross-sectional view illustrating an LED module relating to a second embodiment.

FIG. 15 is a schematic cross-sectional view illustrating the LED module relating to the second embodiment.

An LED module 300 relating to the second embodiment includes an LED device 310, an LED mounting module 320, and a phosphor 340, and a lens board 330. The LED device 310 is mounted on the LED mounting module 320. The phosphor 340 encloses the mounted LED device 310 therein. The lens board 330 is provided on a front surface of the LED mounting module 320.

The LED mounting module 320 is constituted by a printed wiring board 320a, a reflecting board 326 made of a resin, and a metal board 350 attached to a back surface of the printed wiring board 320a. The printed wiring board 320a is formed by an insulation board 323 made of a composite material containing an $Al_2O_3$ (alumina) filler and an epoxy resin, and wiring patterns to mount the LED device 310, on a front surface of the insulation board 323.

The insulation board 323 is made up by one or more insulation layers, for example, two insulation layers in the second embodiment. Here, an insulation layer including the front surface of the insulation board 323 is referred to as an upper insulation layer 321, and an insulation layer including a back surface of the insulation board 323 is referred to as a lower insulation layer 322. Wiring patterns 324 and 325 are respectively formed on front surfaces of the insulation layers 321 and 322. The wiring patterns 324 and 325 are connected to each other through via holes 327.

To further distinguish the patterns 324 and 325, the patterns 325 formed on the lower insulation layer 322 are specifically referred to as internal patterns 325, and the patterns 324 formed on the upper insulation layer 321 are specifically referred to as surface patterns 324.

The LED device 310 is mounted on the surface patterns 324 through gold bumps 328 and 329, as in the first embodiment. The phosphor 340 and the lens board 330 each have the same configuration as in the first embodiment, and are each formed using the same method as in the first embodiment.

Similarly to the first embodiment, the reflecting board 326 and the printed wiring board 320a are directly adhered to each other in the second embodiment. This is achieved by placing the reflecting board 326 made of a resin material in a half-cured state on the front surface of the printed wiring board 320a, and then heating and applying pressure to the reflecting board 326.

(2) Manufacturing Method

The following describes a formation method of the printed wiring board 320a relating to the second embodiment.

Figure 16:
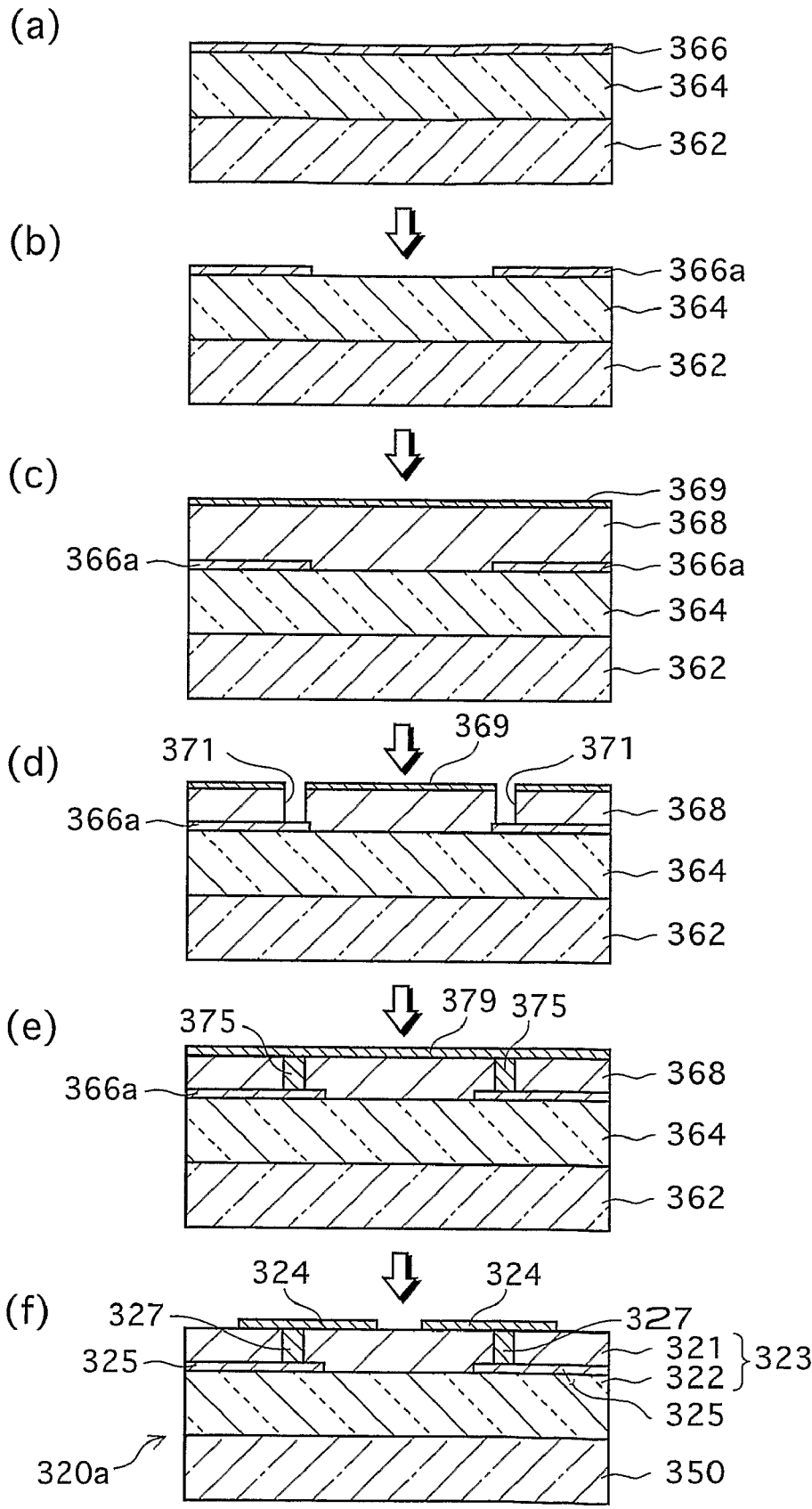
FIG. 16 is used to explain a formation step of a printed wiring board relating to the second embodiment.

FIG. 16 is used to explain the formation step of the printed wiring board 320a with the metal board 350 being attached to its back surface.

To start with, a prepreg having a copper foil 366 on one of its main surfaces (front surface) and a metal board 362 made of aluminum are used. The prepreg is made of an alumina filler and an epoxy resin (not yet cured), and corresponds to the lower insulation layer 322 of the completed printed wiring board 320a. The prepreg is adhered to the metal board 362 in such a manner that a back surface of the prepreg is in contact with the metal board 362. Then, the prepreg is heated and applied with pressure, so as to be (completely) cured and adhered to the metal board 362 ((a) in FIG. 16).

After this, patterns 366a corresponding to the internal patterns 325 are formed in the copper foil 366 that is adhered to a front surface of an insulation board 364 with the metal board 362 being adhered to its back surface ((b) in FIG. 16). The patterns 366a are formed using photolithography, for example. In detail, a dry film (a photoresist film) and an exposure film (a mask film) having a pattern for the internal patterns 325 are adhered to a front surface of the copper foil 366, in this order. After this, ultraviolet rays or the like are irradiated to the copper foil 366 with the films, so that the dry film is developed. Subsequently, etching is performed on the copper foil 366 based on the developed pattern. Then, the dry film is removed.

After the patterns 366a corresponding to the internal patterns 325 are formed, a prepreg corresponding to the upper insulation layer 321 (with a copper foil 369 on its front surface) is adhered to a surface of the insulation board 364 on which the patterns 366a are formed. By heating and applying pressure to the prepreg in order to cure the prepreg, an insulation board 368 is adhered to the insulation board 364 that has already been formed ((c) in FIG. 16).

Subsequently, parts of the copper film 369 corresponding to locations of the via holes 327 in the printed wiring board 320a are removed by etching based on photolithography, for example. Through holes 371 are then formed in correspondence with the removed parts, by means of $CO_2$ laser, for example ((d) in FIG. 16).

After this, copper is plated inside the through holes 371, and onto the front surface of the copper foil 369. Thus, via holes 375 are formed ((e) in FIG. 16). Alternatively, the through holes 371 may be filled with a conductive paste made of tungsten, copper, silver or the like, and copper is then plated onto the front surface of the copper foil 369. Here, the copper-plated copper foil 369 is referred to as a copper layer 379.

Lastly, patterns corresponding to the surface patterns 324 are formed in the copper layer 379, which completes the printed wiring board 320a with the metal board 350 being attached to its back surface as shown in (f) in FIG. 16. The surface patterns 324 are formed by means of photolithography, for example, as well as the internal patterns 325.

Specifically speaking, the patterns formed in the copper layer 379 are plated with nickel, gold or the like, for example, to complete the surface patterns 324. If this plating process comes last, the surface patterns 324 can achieve improved connection with the gold bumps 328 and 329 and enhanced corrosion resistance.

(3) Other Matters

The LED mounting module 320 and LED module 300 relating to the second embodiment are not limited to those described above.

The above description only serves as an example in explaining the type of the LED device 310 (how the LED device 310 is connected), the configuration of the insulation board 323, the phosphor 340 (provided or not), the configuration and formation method of the phosphor 340, the formation method of the reflecting board 326 and the like. The second embodiment can be realized by using the modification examples explained in the section of "4. OTHER MATTERS" in the first embodiment.

The number and arrangement of the LED devices 310 in the LED module 300 are not limited to those disclosed in the above description. The LED devices 310 are arranged in a matrix of 4×4 according to the above description, but may be arranged in N rows and M columns (N and M are same or different integers), for example. In addition, the LED devices 310 can be arranged to form a polygon (e.g. a rhombus or triangle) or an ellipse (including a circle), when seen from above.

According to the second embodiment, the insulation board 323 is made up by the two layers 321 and 322 made of a composite material containing an alumina filler and an epoxy resin, and the patterns 324 and 325 for electrical connection are respectively formed on the layers 321 and 322, as shown in FIGS. 15 and 16. However, the second embodiment is not limited to such. The following describes fifth and sixth modification examples based on the second embodiment, with reference to FIG. 17.

Figure 17A:
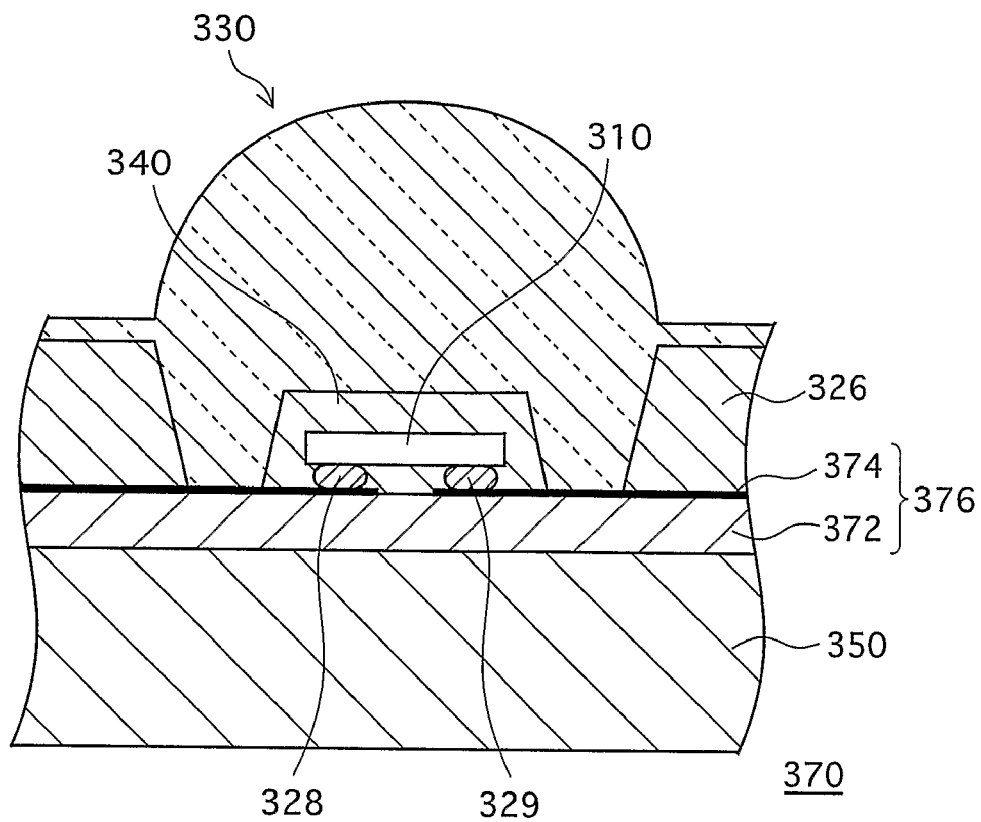
FIG. 17A is a cross-sectional view illustrating an LED module relating to a fifth modification example based on the second embodiment.
Figure 17B:
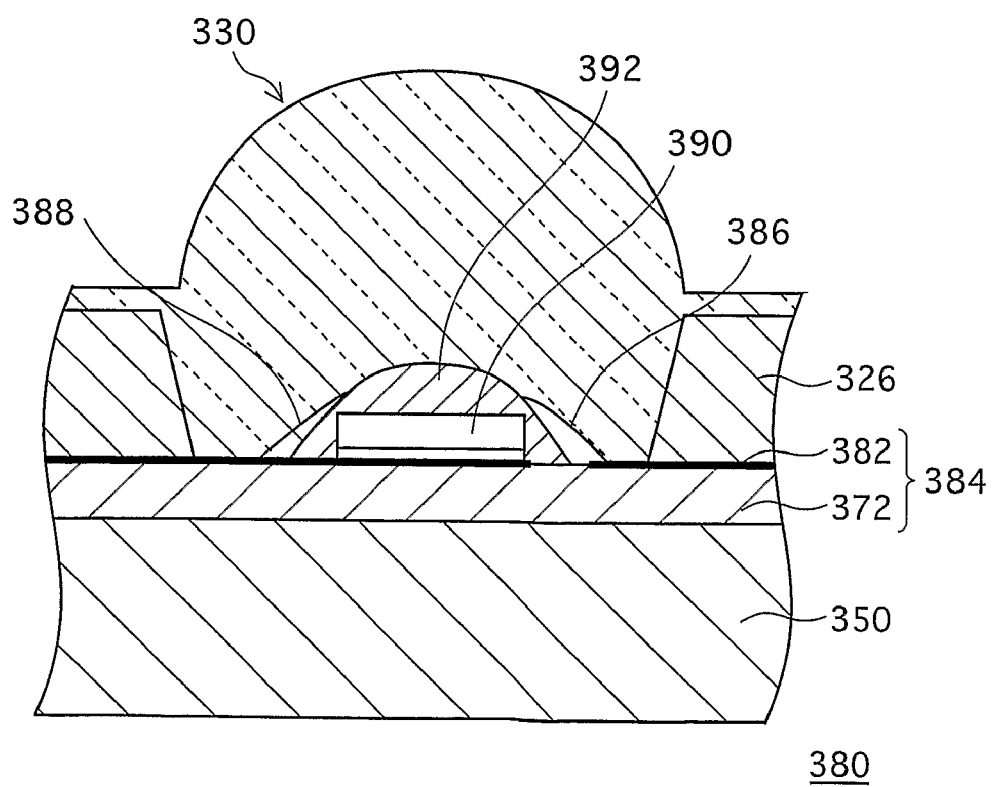
FIG. 17B is a cross-sectional view illustrating an LED module relating to a sixth modification example based on the second embodiment.

FIG. 17A is a cross-sectional view illustrating an LED module relating to the fifth modification example, and FIG. 17B is a cross-sectional view illustrating an LED module relating to the sixth modification example. Note that, in FIGS. 17A and 17B, the same reference numerals as in the second embodiment are used to indicate constituents having the same configuration as in the second embodiment.

As shown in FIG. 17A, an LED module 370 relating to the fifth modification example includes a printed wiring board 376 constituted by an insulation board 372 and wiring patterns 374 formed on a front surface of the insulation board 372. The insulation board 372 is made up by one layer made of a composite material containing an alumina filler and an epoxy resin. The printed wiring board 376 is formed in the following manner. Patterns corresponding to the wiring patterns 374 are formed on the insulation board 372, and plating is last performed on the patterns, in the manner shown in (b) in FIG. 16.

As shown in FIG. 17B, an LED module 380 relating to the sixth modification example includes an LED device 390 and a phosphor 392. The LED device 390 is the same as the LED device 222 relating to the second modification example, and has an anode and a cathode on its front surface. The phosphor 392 is formed in the method described in the second modification example.

The LED module 380 relating to the sixth modification example is basically realized using the manufacturing method of the LED module 100 relating to the first embodiment. However, a printed wiring board 384 is formed in the method described in the fifth modification example, and the phosphor 392 is formed using the method described in the second modification example.

In the LED module 370 relating to the fifth modification example and the LED module 380 relating to the sixth modification example, the reflecting board 326 is directly adhered to the printed wiring board (376 and 384) at their surfaces that face each other.

While the insulation board 323 relating to the second embodiment is made up by the two insulation layers 321 and 322, the insulation board 372 relating to the fifth and sixth modification examples is made up by one insulation layer. Here, however, the insulation board (323 and 372) can be made up by three or more insulation layers.

Further Modification Examples of the First and Second Embodiments

The above describes the first and second embodiments and the first to sixth modification examples of the present invention. However, the present invention is not limited to those specific examples, and further includes the following modification examples. In the following, "the first and second embodiments and the like" refers to the first to sixth modification examples, in addition to the first and second embodiments.

(1) Reflecting Board

1. Formation Method

According to the first and second embodiments and the like, the half-cured reflecting board is formed in such a manner that the resin material is poured into the mold and half-cured. Alternatively, the half-cured reflecting board may be formed by injection molding, for example. This is described in the following as a seventh modification example.

Figure 18:
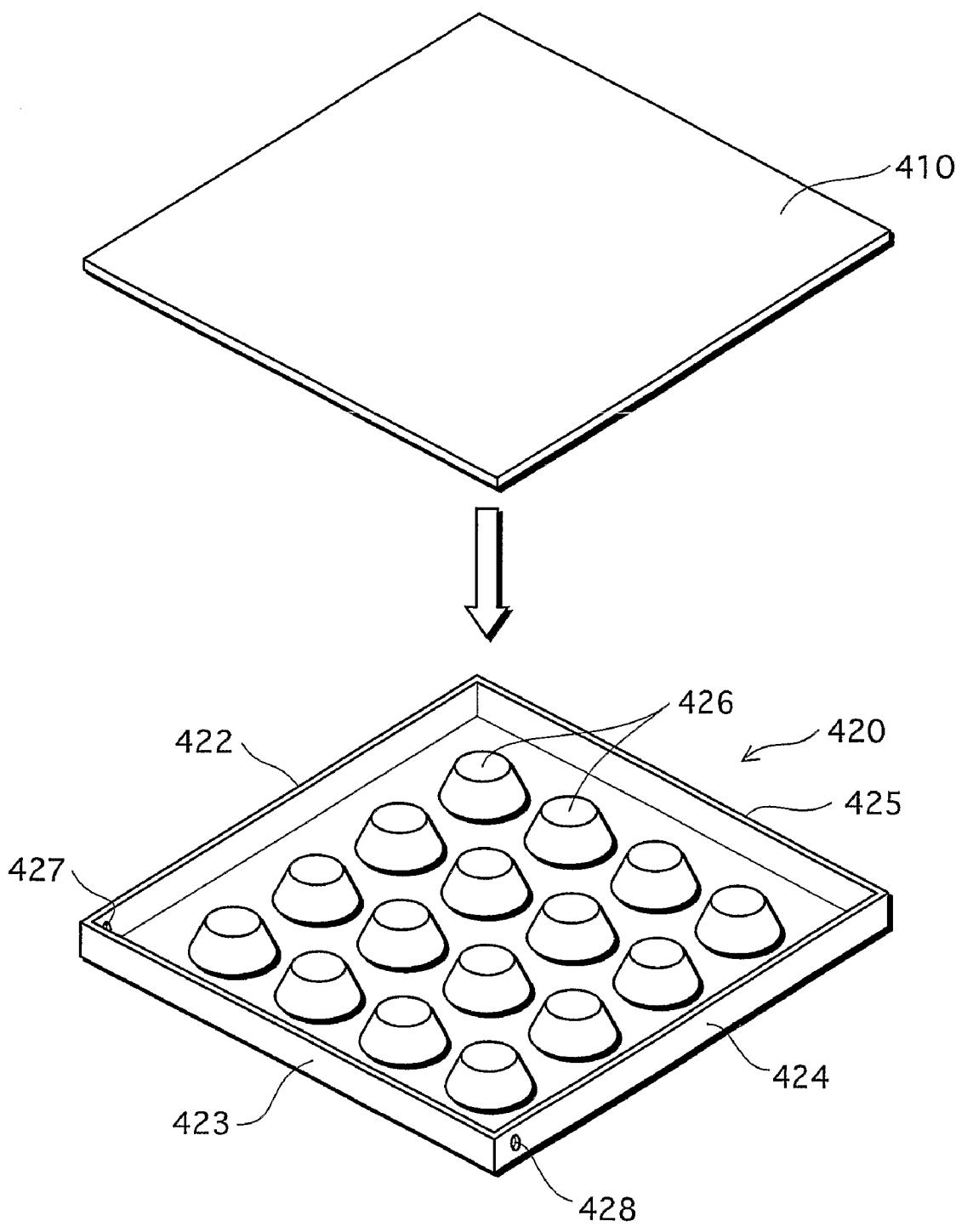
FIG. 18 is an exploded perspective view illustrating a mold used to form a half-cured reflecting board, in a seventh modification example.
Figure 19A:
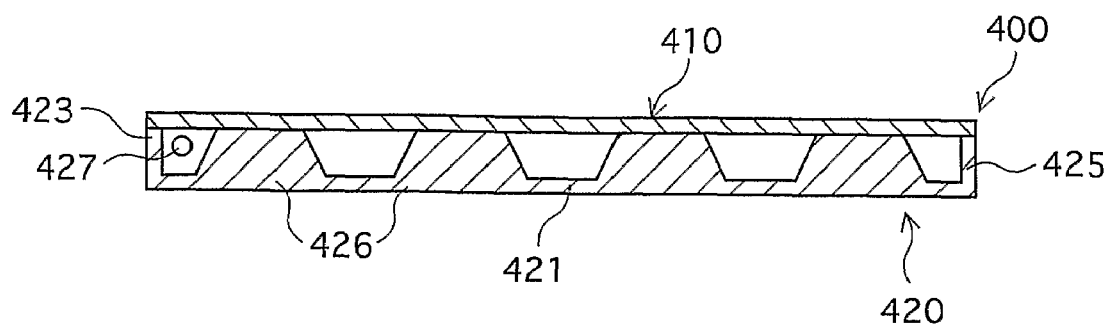
FIG. 19A is a cross-sectional view illustrating the mold used in the seventh modification example.
Figure 19B:
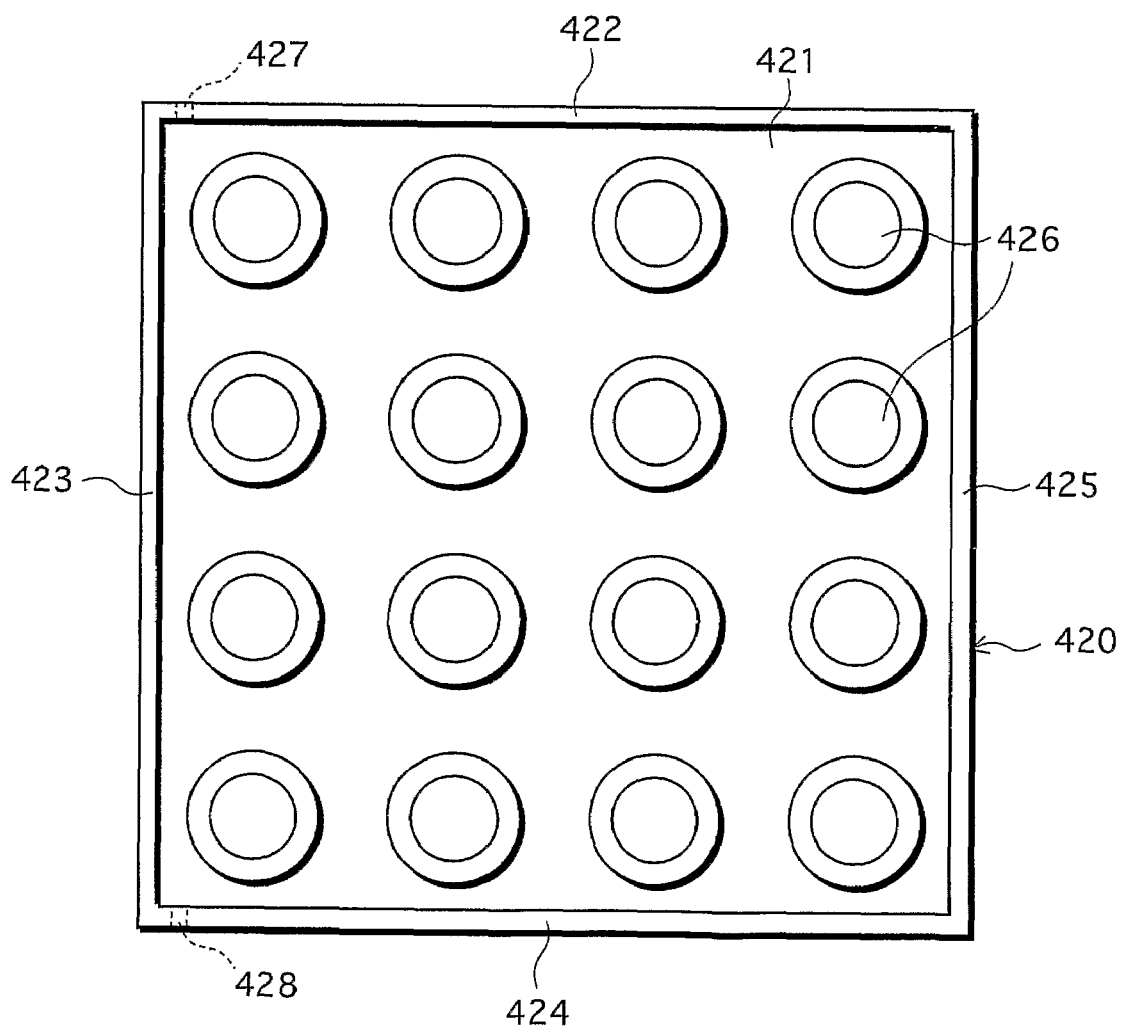
FIG. 19B is a plan view illustrating the mold with an upper part being removed.

FIG. 18 is an exploded perspective view illustrating a mold relating to the seventh modification example to form a half-cured reflecting board. FIG. 19A is a cross-sectional view illustrating the mold, and FIG. 19B is a plan view illustrating the mold with an upper part being removed.

A mold 400 is used to form a half-cured reflecting board based on injection molding. As shown in FIG. 18, the mold 400 includes a lower part 420, which, for example, corresponds to the mold 160 in the first embodiment, and an upper part 410 that closes an opening of the lower part 420. To form a half-cured reflecting board, the upper part 410 and the lower part 420 are combined, to create a formation space therebetween. It should be noted that a resin material injected into the formation space does not leak, when the upper part 410 and the lower part 420 are combined.

The lower part 420 is formed like a box, and has a base 421 and four side walls 422, 423, 424 and 425, similarly to the mold 160 in the first embodiment. On the base 421, protrusions 426 to form reflecting holes are provided. In the side wall 422, an inlet aperture 427 is provided for a resin material. In the side wall 424, an outlet aperture 428 is provided for a resin material.

To form the half-cured reflecting board, a liquid resin material is injected into the formation space formed when the upper part 410 and the lower part 420 are combined, through the inlet aperture 427, to such an extent that the resin material pours out through the outlet aperture 428. When the mold 400 is filled with the resin material, the resin material is heated, to be half-cured.

When the half-cured reflecting board is formed using injection molding, the same conditions are applied as in the half-cured reflecting board formation step relating to the first embodiment. The use of injection molding enables a half-cured reflecting board with high dimensional accuracy to be obtained efficiently. Therefore, when the half-cured reflecting board obtained using injection molding is placed on the printed wiring board to be adhered to the printed wiring board together, their surfaces can be substantially parallel to each other. Hence, the pressurizing member 169 can apply even pressure to the upper surface of the half-cured reflecting board. This achieves a reflecting board, or an LED mounting module ultimately, with little unevenness in thickness.

2. Construction

According to the first and second embodiments and the like, the reflecting board is formed like one plate, and has 16 separate reflecting holes in correspondence with locations where the LED devices are to be mounted. However, the first and second embodiments and the like are not limited to such. Alternatively, a separate reflecting piece may be formed in correspondence with a location of each of the LED devices, and each reflecting piece is separately adhered to the printed wiring board.

The following describes eighth and ninth modification examples where separate reflecting pieces are provided instead of the reflecting board, with reference to FIGS. 20, 21, 22 and 23.

Figure 20:
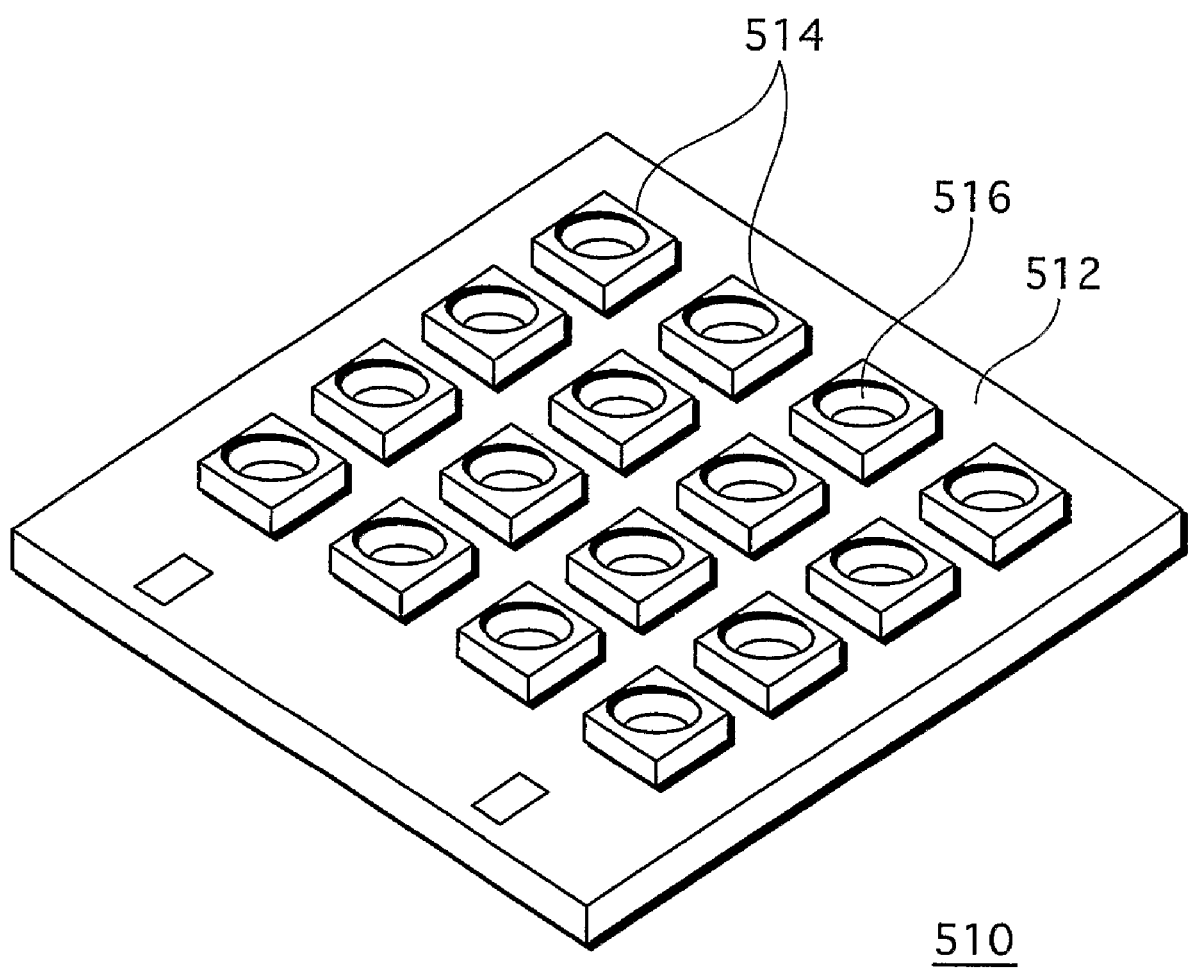
FIG. 20 is a perspective view illustrating an LED mounting module relating to an eighth modification example, which includes reflecting pieces instead of a reflecting board.

FIG. 20 is a perspective view illustrating an LED mounting module relating to the eighth modification example.

As shown in FIG. 20, an LED mounting module 510 relating to the eighth modification example is constituted by a printed wiring board 512 with wiring patterns (not shown in FIG. 20) and a plurality of (16) reflecting pieces 514 formed on a front surface of the printed wiring board 512.

As clearly seen from FIG. 20, each reflecting piece 514 has a reflecting hole 516 in its center. In other words, one reflecting piece 514 has one reflecting hole 516. The reflecting hole 516 is tapered downward towards the printed wiring board 512 as in the first and second embodiments and the like. The reflecting piece 514 is adhered to the printed wiring board 512 in the same manner as in the first embodiment. Specifically speaking, the reflecting piece 514 made of a resin material in a half-cured state is first placed at a predetermined location on the printed wiring board 512. After this, while a pressure is applied to a front surface of the reflecting piece 514, the reflecting piece 514 is heated, to be completely cured.

Figure 21A:
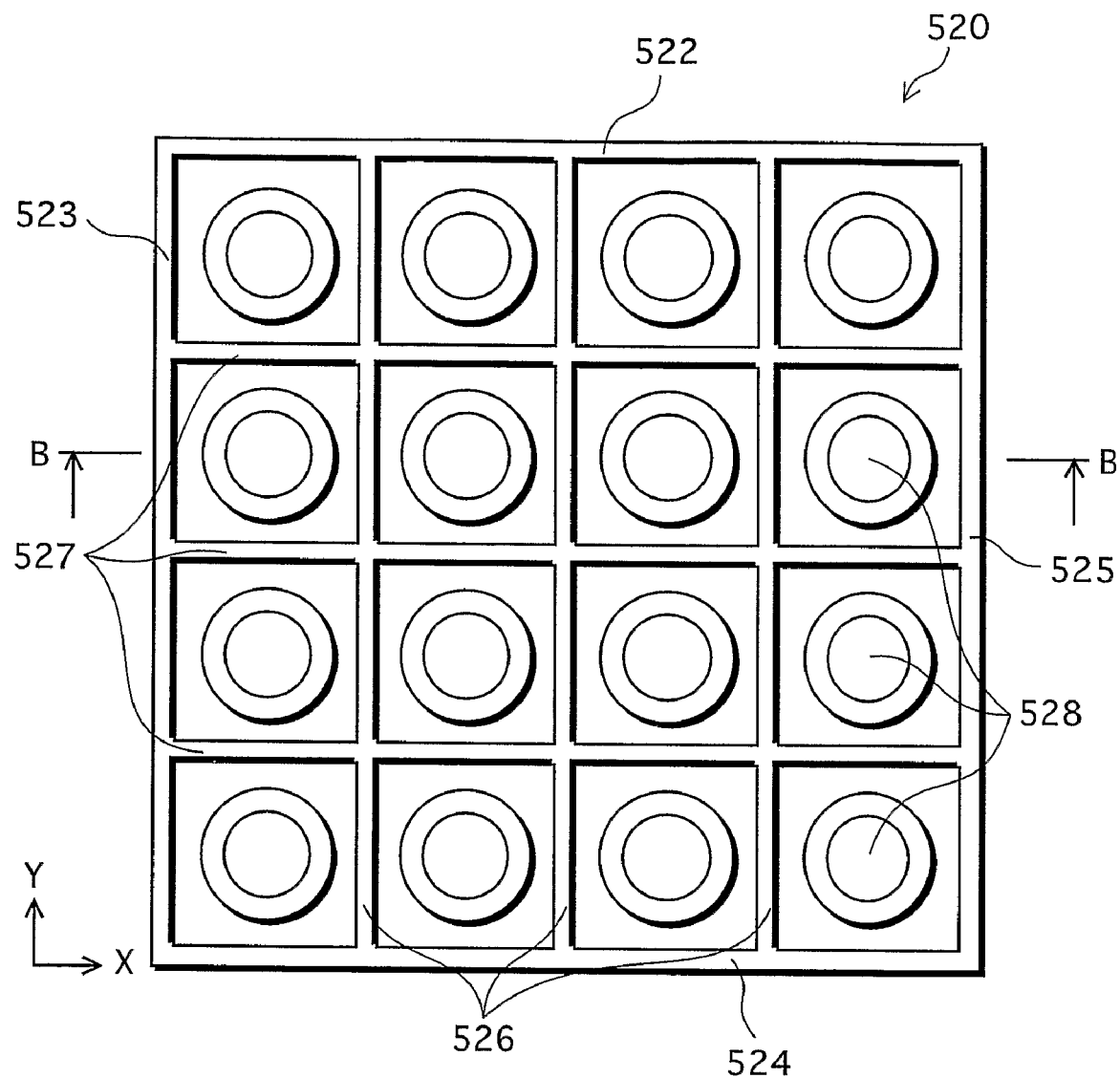
FIG. 21A is a plan view illustrating a mold to form the reflecting pieces relating to the eighth modification example.
Figure 21B:
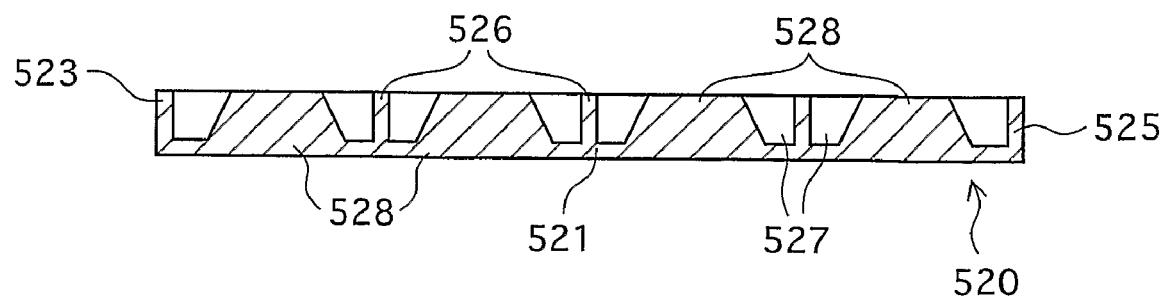
FIG. 21B is a cross-sectional view illustrating the mold along a line BB shown in FIG. 21A in a direction shown by the arrows.

FIG. 21A is a plan view illustrating a mold used to form the reflecting pieces 514 relating to the eighth modification example, and FIG. 21B is a cross-sectional view illustrating the mold along a line BB shown in FIG. 21A in a direction shown by the arrows.

As shown in FIG. 21, a mold 520 is formed like a box, and has a base 521 and four sidewalls 522, 523, 524 and 525, similarly to the mold 160 used to form the reflecting board 126 relating to the first embodiment.

An internal space of the box-like mold 520 is divided into 16 sub-spaces, in total, by horizontal walls 527 and vertical walls 526 that extend in horizontal and vertical directions (X and Y directions in FIG. 21A) and the sidewalls 522, 523, 524 and 525. In substantially the center of each sub-space, a protrusion 528 is provided on the base 521, to form the reflecting hole 516 formed in the reflecting piece 514. Note that the protrusion 528 is tapered from the base 521 to the open end of the mold 520, in correspondence with the shape of the reflecting hole 516.

The internal space of the mold 520 is divided into 16 sub-spaces so that the 16 reflecting pieces 514 are obtained at a time. However, the eighth modification example may alternatively use a mold corresponding to each sub-space, so that one reflecting piece 514 is obtained at a time.

Figure 22:
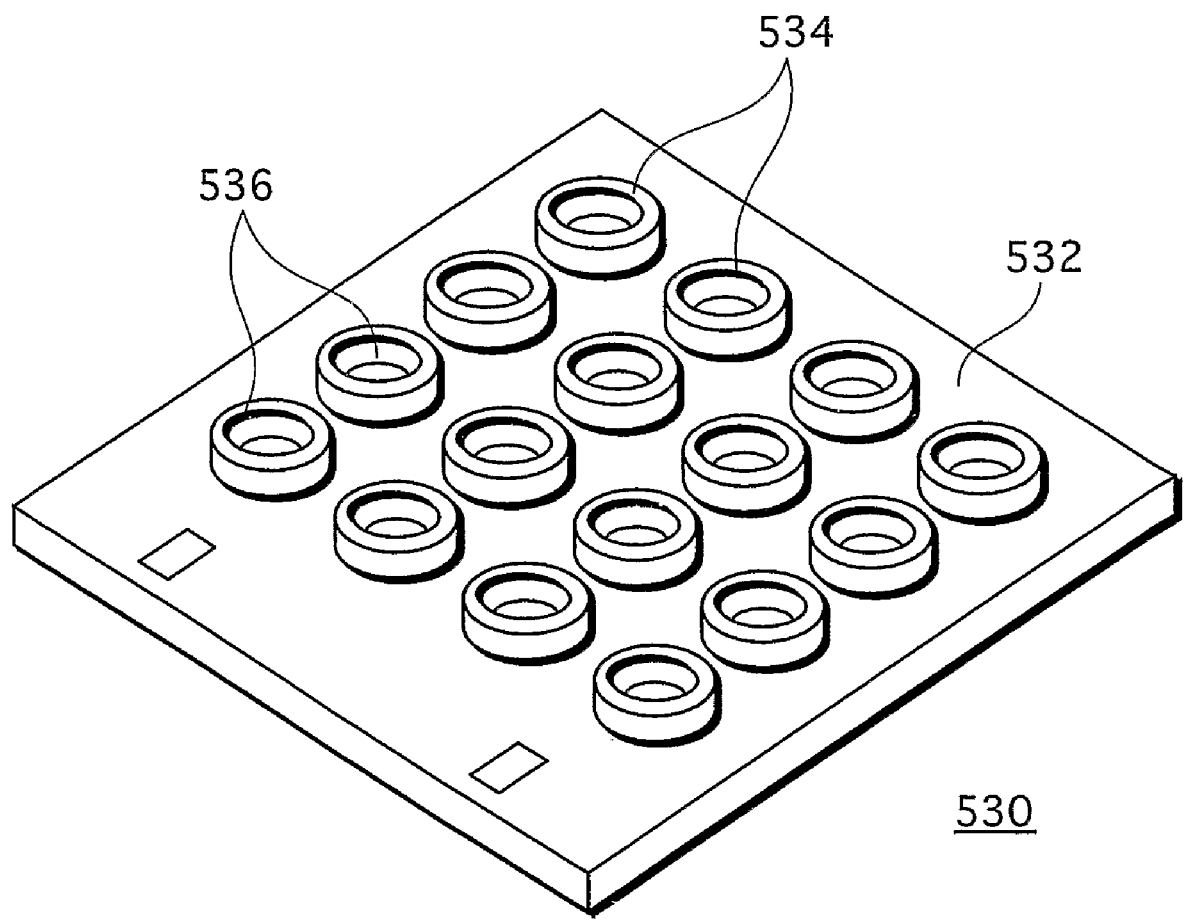
FIG. 22 is a perspective view illustrating an LED mounting module relating to a ninth modification example, which includes reflecting pieces instead of a reflecting board.

FIG. 22 is a perspective view illustrating an LED mounting module relating to the ninth modification example.

Similarly to the LED mounting module 510 relating to the eighth modification example, an LED mounting module 530 relating to the ninth modification example is constituted by a printed wiring board 532 including wiring patterns (not shown in FIG. 22) and a plurality of (16) reflecting pieces 534 formed on a front surface of the printed wiring board 532.

As clearly seen from FIG. 22, each reflecting piece 534 has one reflecting hole 536 in its center. The reflecting hole 536 is tapered downward towards the printed wiring board 532. The reflecting piece 534 is adhered to the printed wiring board 532 in the same manner as in the eighth modification example.

Figure 23A:
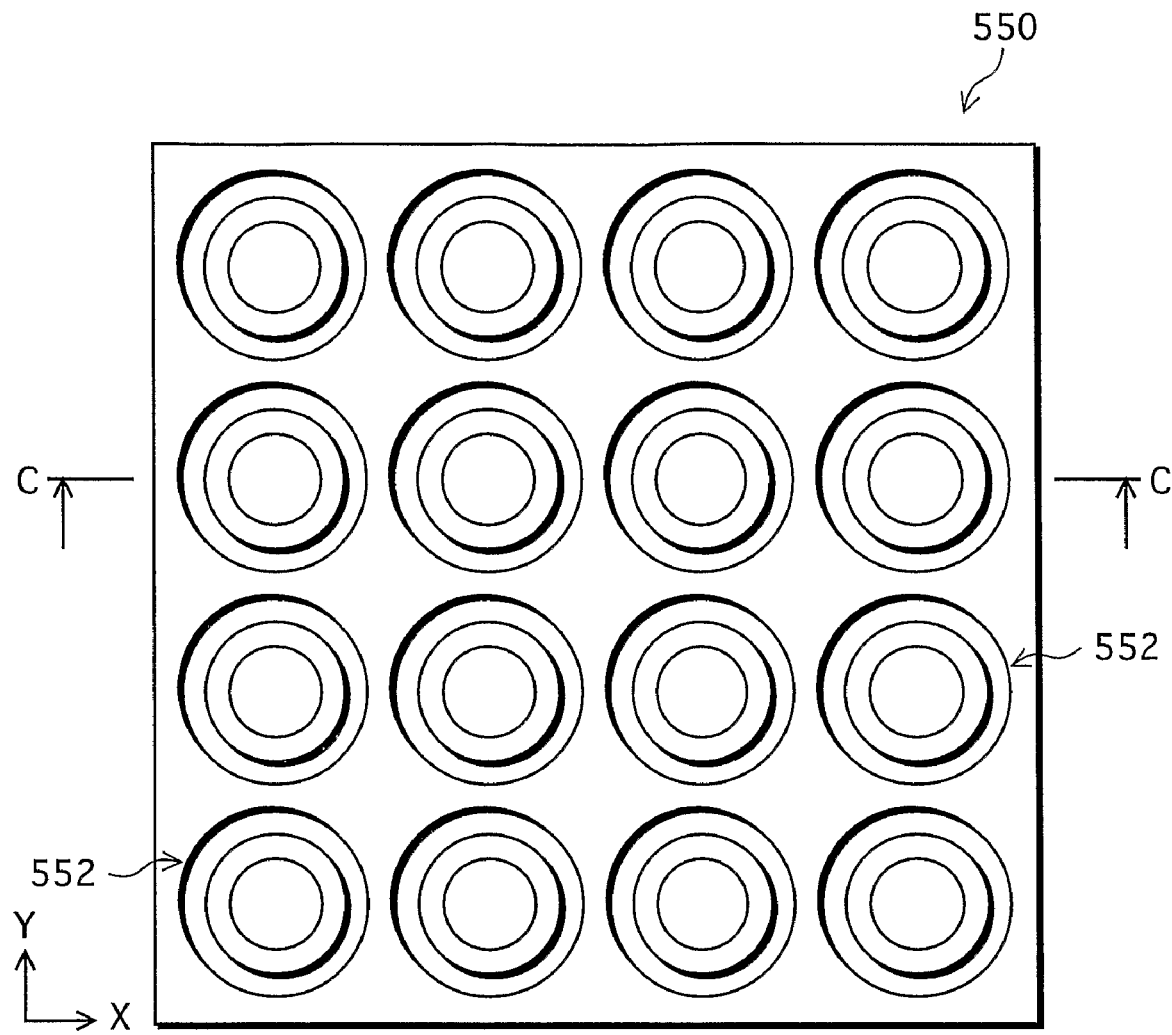
FIG. 23A is a plan view illustrating a mold to form the reflecting pieces relating to the ninth modification example.
Figure 23B:
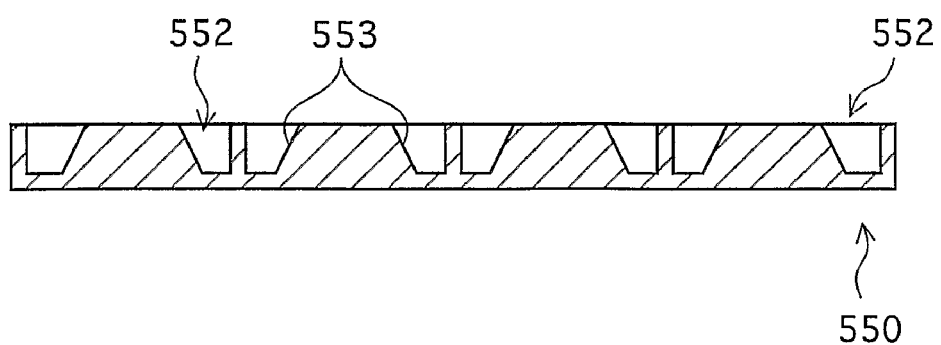
FIG. 23B is a cross-sectional view illustrating the mold along a line CC shown in FIG. 23A in a direction shown by the arrows.

FIG. 23A is a plan view illustrating a mold used to form the reflecting pieces 534 relating to the ninth modification example, and FIG. 23B is a cross-sectional view illustrating the mold along a line CC shown in FIG. 23A in a direction shown by the arrows.

As shown in FIG. 23, a mold 550 is plate-like, and has 16 depressions 552 arranged in 4×4 in horizontal and vertical directions (X and Y directions in FIG. 23A). A planar shape of each depression 552 is like a ring as shown in FIG. 23A. The inner diameter of the ring-like depression 552 increases from a front (open) side of the mold 550 toward the base of the mold 550, in correspondence with the shape of the reflecting hole 536 (see a wall 553 of the depression 552).

3. Resin Material

According to the first and second embodiments and the like, the reflecting board is made of an epoxy resin, but can be made of a different resin such as an unsaturated ester resin, a phenolic resin, a polyimide resin, and a polyphthalamide resin.

(2) Other Matters

According to the first and second embodiments and the first to ninth modification examples, the half-cured reflecting member (indicating the half-cured reflecting board and pieces) is placed on the printed wiring board, and then completely cured to be adhered. However, the following method is also applicable to realize such a construction that the printed wiring board and the reflecting member are directly adhered to each other at their surfaces that face each other. For example, a resin material is used to form the printed wiring board. The reflecting member (made of a partially or completely-cured resin material) is placed on the printed wiring board made of the resin material in a half-cured state. Subsequently, the printed wiring board and the reflecting member are heated and applied with pressure, to be adhered to each other.

When this alternative method is employed, the following problems may emerge. The wiring patterns formed in the front surface of the printed wiring board may be distorted like a wave. Furthermore, a part on the printed wiring board where the LED device is to be mounted may be distorted. These problems can be solved in the following manner, for example. The mold used to form the reflecting member is placed on the reflecting member, which has been placed on the printed wiring board, in such a manner that the protrusions of the mold correspond to the reflecting holes in the reflecting member. In this way, the part of the wiring patterns at which the LED device is to be mounted is pressed by the mold, during the LED mounting module formation step. In this way, that part of the wiring patterns can be flattened.

The reflecting member and the printed wiring board are made of the same resin (an epoxy resin) according to the second embodiment, but can be made of different resins. However, it should be noted that the reflecting member and the printed wiring board can be adhered to each other more strongly when the same resin is used.

According to the second embodiment, the resin material of the prepregs 364 and 368 to be formed into the printed wiring board 323 is completely cured during the printed wiring board formation step. As an alternative example, however, the resin material may be only half cured during the printed wiring board formation step. The resin material is completely cured when the printed wiring board is adhered to the reflecting board 326, together with the resin material forming the reflecting board 326 (this method is referred to as post-curing). If such is the case, the printed wiring board formation step takes a shorter time period. This can improve productivity.

According to the first and second embodiments and the like, the LED device is directly mounted on the printed wiring board. However, the LED device can be indirectly mounted on the printed wiring board. This modification is a tenth modification example, where an LED device is mounted on the printed wiring board by using a sub-mounting substrate.

Figure 24:
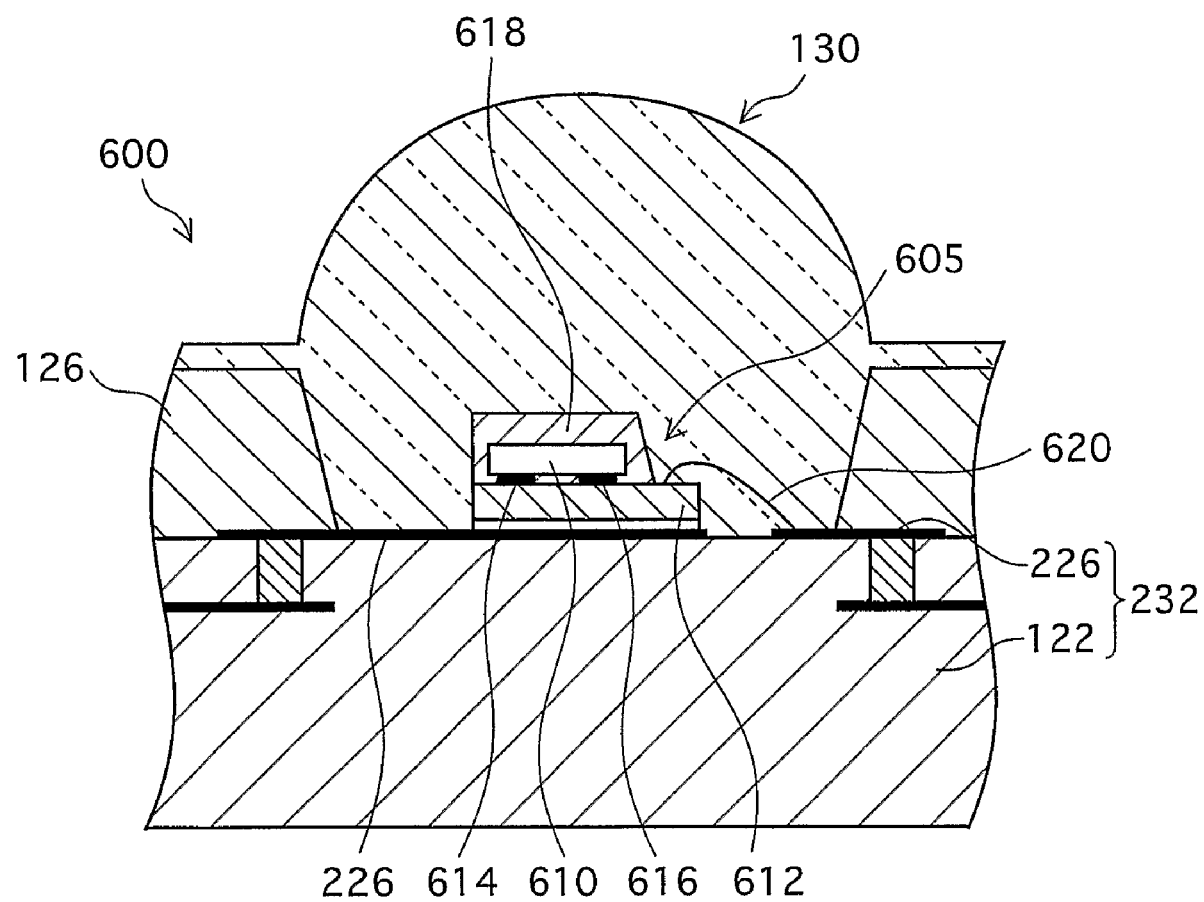
FIG. 24 is a cross-sectional view illustrating an LED module relating to a tenth modification example, where an LED device is indirectly mounted.

FIG. 24 is a cross-sectional view illustrating an LED module relating to the tenth modification example where an LED device is indirectly mounted.

An LED module 600 relating to the tenth modification example uses the same LED mounting module as in the second modification example. This LED mounting module is constituted by the printed wiring board 232 and the reflecting board 126. An LED device 610, included in a sub-mounting device 605, is indirectly mounted on a predetermined location in the LED mounting module. The LED module 600 includes the lens board 130 as in the second modification example.

The sub-mounting device 605 is, for example, constituted by a silicon substrate 612 (hereinafter referred to as an Si substrate 612), the LED device 610 mounted on an upper surface of the Si substrate 612, and a phosphor 618 enclosing the LED device 610 therein. Here, the LED device 610 is mounted on the Si substrate 612 through gold bumps 614 and 616.

On a lower surface of the Si substrate 612, a first terminal electrically connected to one of the electrodes of the LED device 610 is provided. On the upper surface of the Si substrate 612, a second terminal electrically connected to the other electrode of the LED device 610 is provided.

The sub-mounting device 605 is mounted on the LED mounting module using a silver paste, for example. The sub-mounting device 605 is electrically connected to the printed wiring board 232 in the following manner. The first terminal on the lower surface of the Si substrate 612 is connected to one of the wiring patterns 226 in the printed wiring board 232 using a silver paste as mentioned above. Furthermore, the second terminal on the upper surface of the Si substrate 612 is connected to the other wiring pattern 226 in the printed wiring board 232 through a wire 620.

When the LED device 610 is indirectly mounted using a sub-mounting substrate, the sub-mounting device 605 including the phosphor 618 is mounted on the printed wiring board 232. Hence, the sub-mounting device 605 can be mounted on the LED mounting module, after the LED device 610 is tested whether to emit light properly, for example. As a result, a yielding ratio of LED modules can be improved, for example.

Third Embodiment

According to the first and second embodiments, a solid member made of a resin material in B stage (e.g. the half-cured reflecting board 167a in the first embodiment) is separately formed, and then placed on the main surface of the printed wiring board. Following this, the resin solid member is completely cured, so as to be adhered to the printed wiring board and to form the reflecting board at the same time. There is, however, an alternative method to form a reflecting member (indicating reflecting board and pieces) which is directly adhered to the printed wiring board. According to this alternative method, a mold (corresponding to a molding member in the claims) is placed on the main surface of the printed wiring board, and a liquid resin material is then injected into the mold.

The following describes such a method that a reflecting board is directly formed on a main surface of a printed wiring board in a single step using a liquid resin material.

In a third embodiment, constituents such as a printed wiring board, an LED device and a lens board have the same configurations as their counterparts in the first embodiment, and are therefore indicated by the same reference numerals. The following description is made with focus on how to form a reflecting board 701.

(1) Forming Reflecting Board 701

Figure 25:
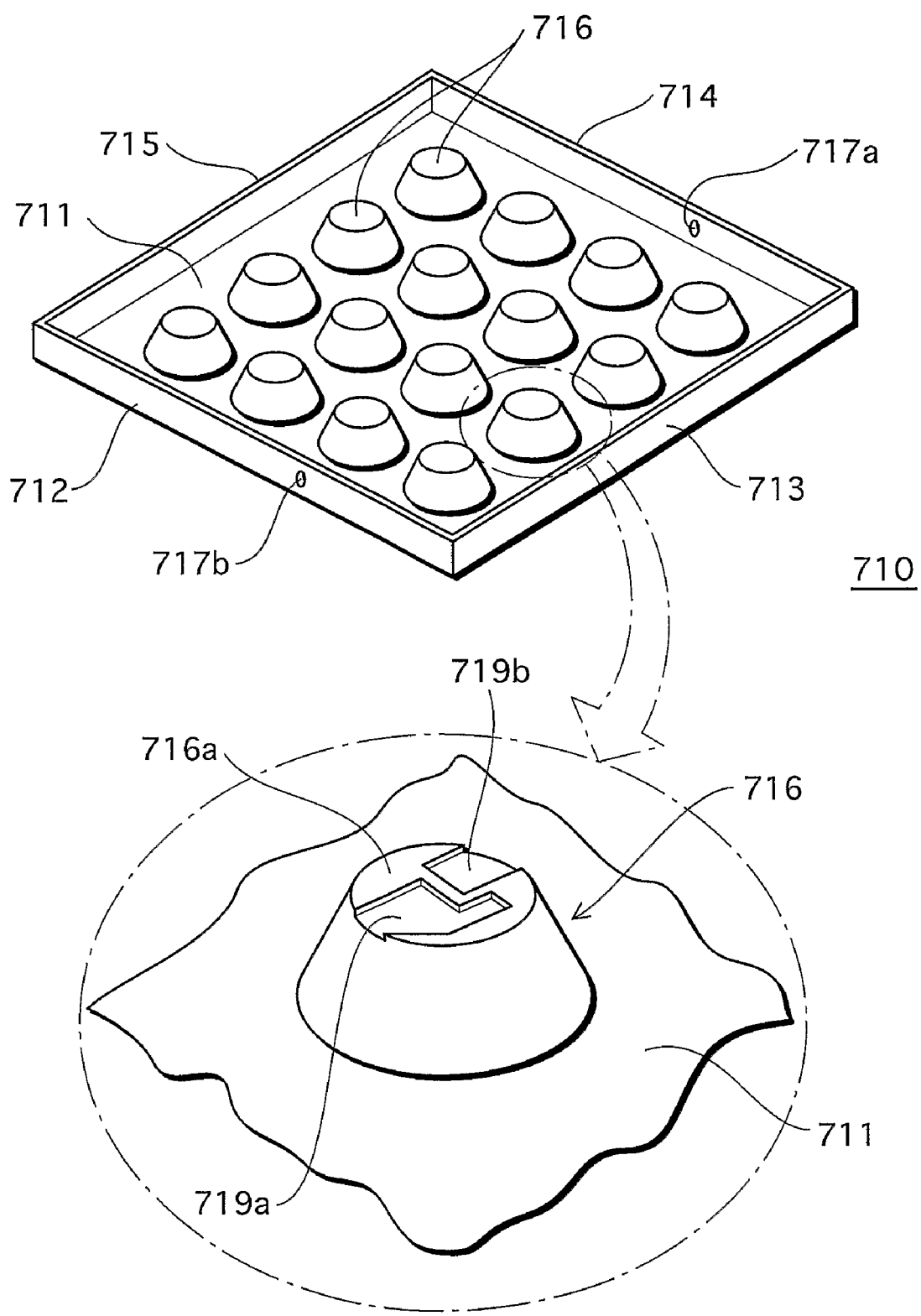
FIG. 25 is an exploded perspective view illustrating a mold used to form a reflecting board relating to a third embodiment.
Figure 26A:
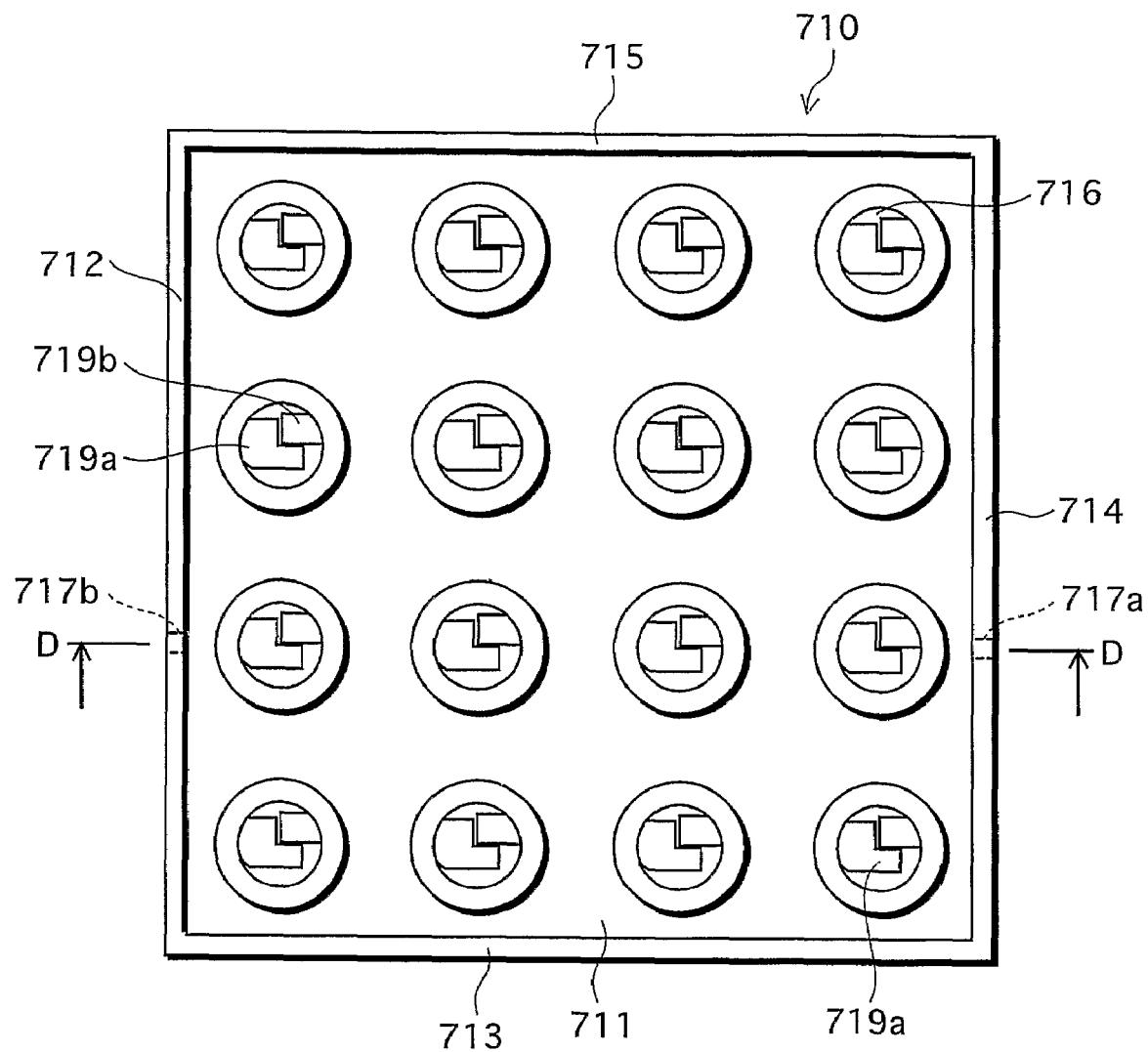
FIG. 26A is a plan view illustrating the mold used in the third embodiment.
Figure 26B:
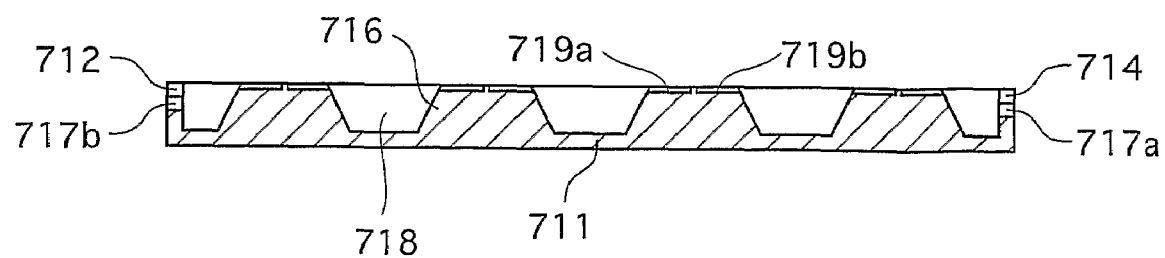
FIG. 26B is a cross-sectional view illustrating the mold along a line DD shown in FIG. 26A in a direction shown by the arrows.

FIG. 25 is a perspective view illustrating a mold used to form the reflecting board 701 relating to the third embodiment. FIG. 26A is a plan view illustrating the mold relating to the third embodiment, and FIG. 26B is a cross-sectional view illustrating the mold along a line DD shown in FIG. 26A in a direction shown by the arrows.

As shown in FIGS. 25 and 26, a mold 710 is formed like a box which is open at the upper side. A planar shape of the mold 710 is substantially square in correspondence with a planar shape of the reflecting board 701 (having the same shape as the reflecting board 126 shown in FIG. 3A). The mold 710 has a base 711, and side walls 712, 713, 714 and 715 that are formed at different edges of the base 711 so as to extend vertically. On an internal surface of the base 711, conoidal protrusions 716 are arranged in a matrix of 4×4.

If the reflecting board 701 is formed using this mold 710, the protrusions 716 correspond to reflecting holes 703 in the reflecting board 701. In a top part 716a of each protraction 716, depressions 719a and 719b are formed in correspondence with a part of the printed wiring board 123, which include a portion of the wiring patterns 124 on which the LED device 110 is to be mounted. The depressions 719a and 719b are two separate depressions, so as to correspond to the anode and cathode of the LED device 110.

Figure 27:
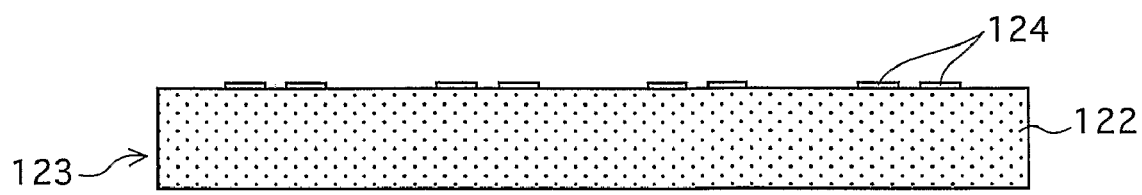
FIG. 27 is used to explain a reflecting board formation step relating to the third embodiment.
Figure 27:
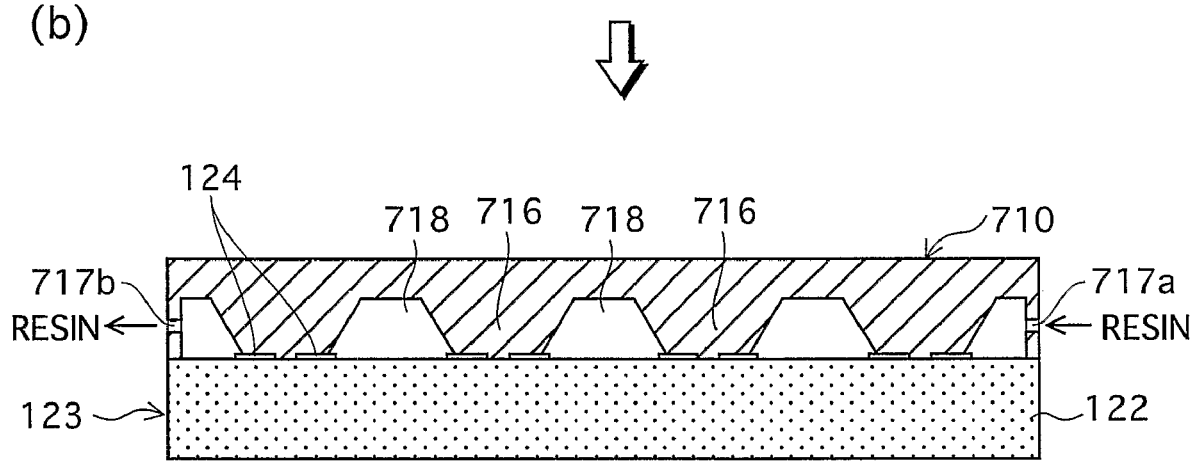
Figure 27:
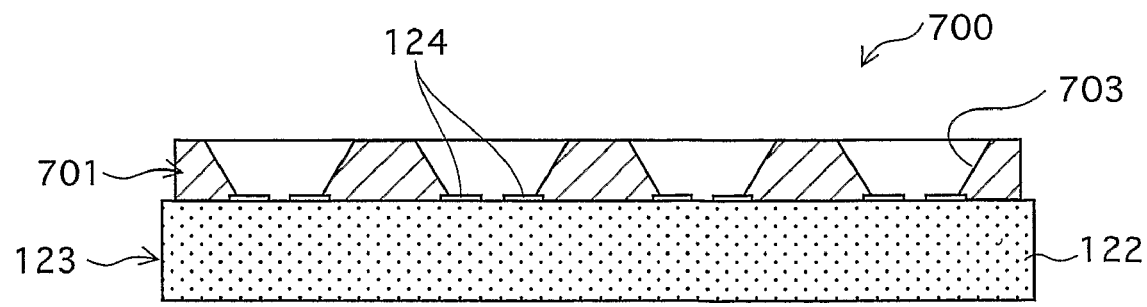

FIG. 27 is used to explain a reflecting board formation step relating to the third embodiment.

To start with, the printed wiring board 123 is kept in a predetermined state, for example, horizontally kept as shown in (a) in FIG. 27. Here, the printed wiring board 123 is constituted by the insulation board 122 and the wiring patterns 124 formed on and in the insulation board 122 (the wiring patterns formed within the insulation board 122 are not shown in FIG. 27).

After this, the above-described mold 710 is placed on the front (upper) surface of the printed wiring board 123, in such a manner that the base 711 faces away from the front surface of the printed wiring board 123. This creates a formation space 718 for the reflecting board 701 between the mold 710 and the printed wiring board 123.

Subsequently, a liquid thermoplastic resin material is injected into the mold 710 through an inlet aperture 717a, and suctioned through an outlet aperture 717b, as shown in (b) in FIG. 27. In this way, the thermoplastic resin material starts to be poured into the formation space 718 defined by the mold 710 and the printed wiring board 123. When completely filling the formation space 718, the thermoplastic resin material finally flows out through the outlet aperture 717b.

This thermoplastic resin material principally includes a polyphthalamide (PPA) resin, and further includes fillers to improve reflection efficiency, for example, $TiO_2$. Other than $TiO_2$, $SiO_2$, $Al_2O_3$, $BaSO_4$, or the like can be used for the fillers. The thermoplastic resin material preferably includes fillers of 0.1 (%) to 50 (%) containing one or more of these fillers. The fillers may not be added to the thermoplastic resin material if improvement of reflection efficiency is not required, for example.

After the formation space 718 defined by the mold 710 and the printed wiring board 123 is filled with the thermoplastic resin material, the thermoplastic resin material is cooled down, to be cured. Thus, the reflecting board 701 is formed on the front surface of the printed wiring board 123, as shown in (c) in FIG. 27. The reflecting board 701 is adhered to the front surface of the printed wiring board 123, as well as formed. In this way, an LED mounting module 700 is completed.

To obtain the liquid thermoplastic resin material, the thermoplastic resin material is heated to 320° C., for example. However, the temperature varies depending on factors such as a type of the thermoplastic resin material and viscosity required to form the reflecting board 701. Therefore, the temperature needs to be appropriately determined according to the resin material.

Figure 28:
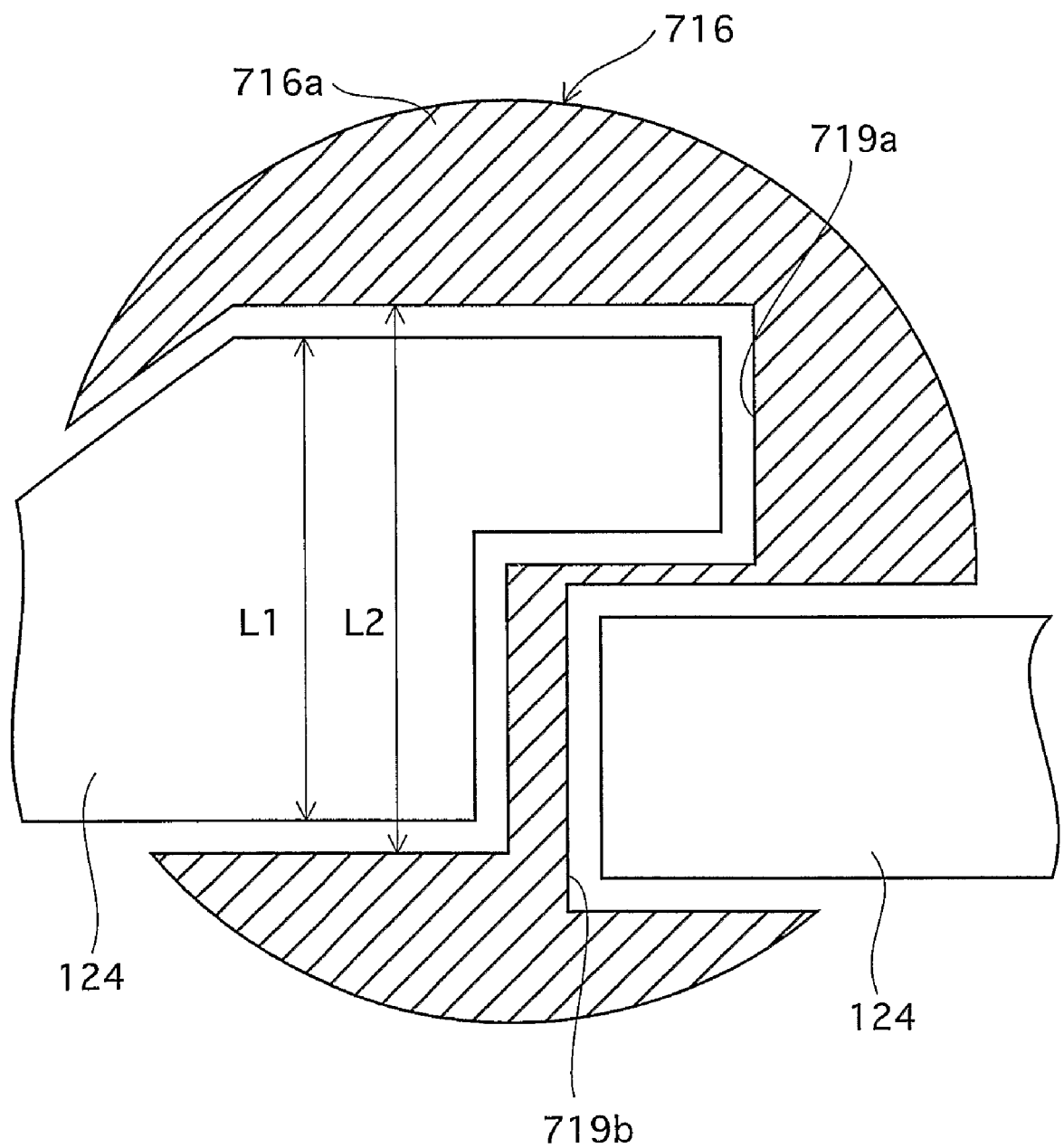
FIG. 28 is a cross-sectional view illustrating depressions formed in a protrusion of the mold, when the mold is placed on a printed wiring board.

FIG. 28 illustrates a cross-section of the depressions 719a and 719b in the top part 716a of the protrusion 716 formed in the mold 710, when the mold 710 is placed on the printed wiring board 123.

As shown in FIGS. 25 and 28, the depressions 719a and 719b are formed in the top part 716a of the protrusion 716 in the mold 710, in correspondence with the wiring patterns 124. This can lower the risk that the liquid thermoplastic resin material flows into a gap between the top part 716a and the wiring patterns 124, when the thermoplastic resin material is injected into the mold 710. For this reason, occurrence of flash caused by the thermoplastic resin material flowing into such a gap can be reduced.

The following mentions the dimension of the depression 719a (719b) with reference to FIG. 28. The width L1 (FIG. 28) of the wiring patterns 124, in detail, of a portion of one of the wiring patterns 124 including an electrode (to mount an LED device) is 350 μm. The width L2 (FIG. 28) of the depressions 719a and 719b, in detail, of a portion of the depression 719a corresponding to the above-identified portion of the wiring pattern 124 is 360 μm.

Which is to say, the depression 719a has a shape corresponding to that of the wiring pattern 124, and a distance of 5 μm is maintained between edges of the depression 719a and the wiring pattern 124. Here, the distance between the edges of the depression 719a and the wiring pattern 124 preferably falls within a range of 1 μm to 20 μm, taking into consideration the dimensional accuracy of the wiring patterns 124 and the risk of the thermoplastic resin material flowing into the depressions 719a and 719b.

The depressions 719a and 719b have a depth greater than a height of the wiring patterns 124 from the front surface of the insulation board 122. To be specific, the wiring patterns 124 have a height of 12 μm, and the depressions 719a and 719b have a depth of 15 μm, so that a distance of 3 μm is provided between the surfaces of the wiring patterns 124 and the bottoms of the depressions 719a and 719b.

Here, the distance between the surfaces of the wiring patterns 124 and the bottoms of the depressions 719a and 719b is preferably large enough to prevent a contact of the bottoms of the depressions 719a and 719b with the surfaces of the wiring patterns 124. This is because such a contact may damage the wiring patterns 124. However, an excessively large distance will cause more of the thermoplastic resin material to flow into the gap between the wiring patterns 124 and the depressions 719a and 719b. Considering these, the distance preferably falls within a range of 1 μm to 15 μm.

By forming the reflecting board 701 directly on the front surface of the printed wiring board 123 in a single step, the productivity of manufacturing LED mounting modules can be improved, when compared with the reflecting board formation method described in the first and second embodiments. According to the first and second embodiments, the half-cured reflecting board (126 and 326) is separately formed, and then placed on the printed wiring board (123 and 323). After this, the half-cured reflecting board (126 and 326) needs to be heated again, to be completely cured. According to the third embodiment, on the other hand, the reflecting board 701 can be almost completed in a single step, which is equivalent to the step of forming the half-cured reflecting board. Note that this single step may take a longer time than the half-cured reflecting board formation step relating to the first and second embodiments, depending on the type of the thermoplastic resin material used to form the reflecting board 701.

The reflecting board 701 is formed using the mold 710 in the third embodiment, and therefore has high dimensional accuracy. Accordingly, the reflecting board 701 can reliably reflect light emitted from an LED device in a predetermined direction.

(2) Mold 710

According to the above description, there are two depressions 719a and 719b in the top part 716a of the protrusion 716 of the mold 710. However, only one depression having a shape corresponding to those of the depressions 719a and 719b may be formed in the top part 716a. This is described as an eleventh modification example in the following. Furthermore, one depression having a modified shape may be formed in the top part 716a. This is described as a twelfth modification example in the following.

Figure 29:
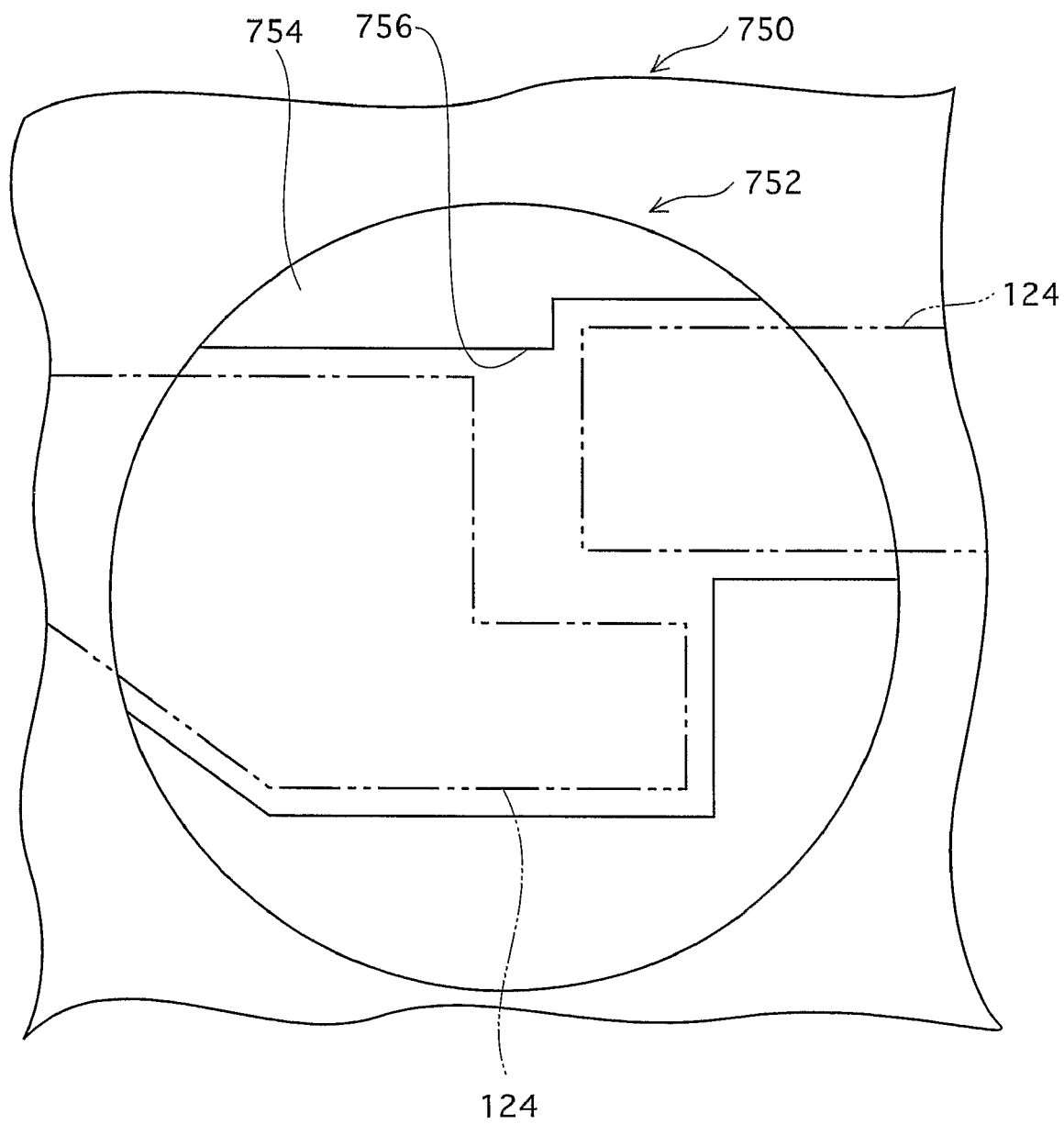
FIG. 29 is a plan view illustrating a protrusion of a mold used in an eleventh modification example.

FIG. 29 is a plan view illustrating a protrusion formed in a mold relating to the eleventh modification example. In FIG. 29, the wiring patterns 124 are indicated by dashed lines for better intelligibility.

In a mold 750, a depression 756 is formed in a top part 754 of a protrusion 752, and has a shape corresponding to the shapes of the two wiring patterns 124 as shown in FIG. 29. In this way, even the single depression 756 in the top part 754 can reduce the amount of a resin material that flows into an area on the printed wiring board 123 in which an LED device is to be mounted. In the eleventh embodiment, the distance between edges of the depression 756 and the wiring patterns 124 basically has the same length as the distance mentioned in the third embodiment.

Figure 30A:
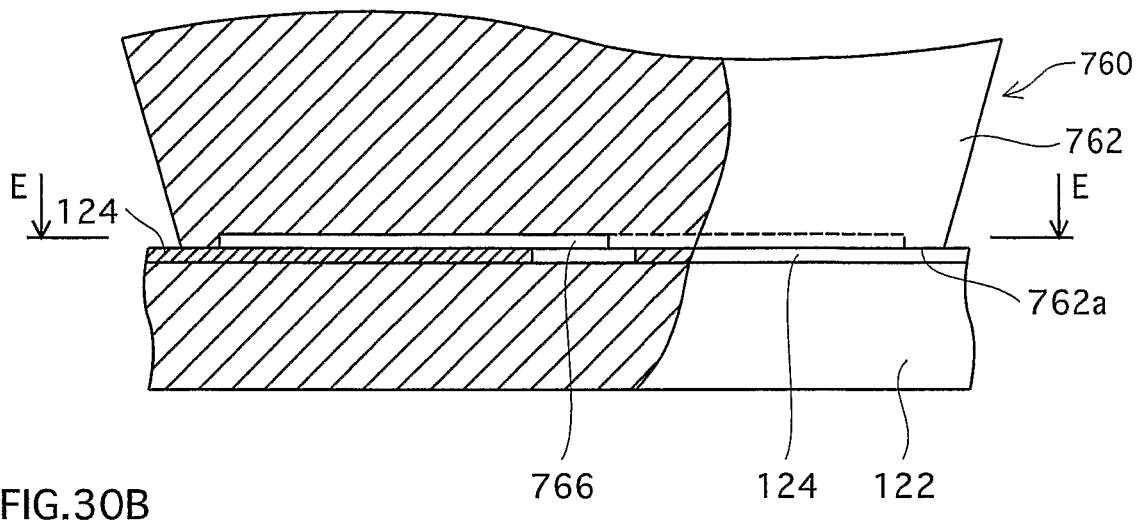
FIG. 30A is a cross-sectional view illustrating a mold relating to a twelfth modification example and a printed wiring board during a step of forming a reflecting board.
Figure 30B:
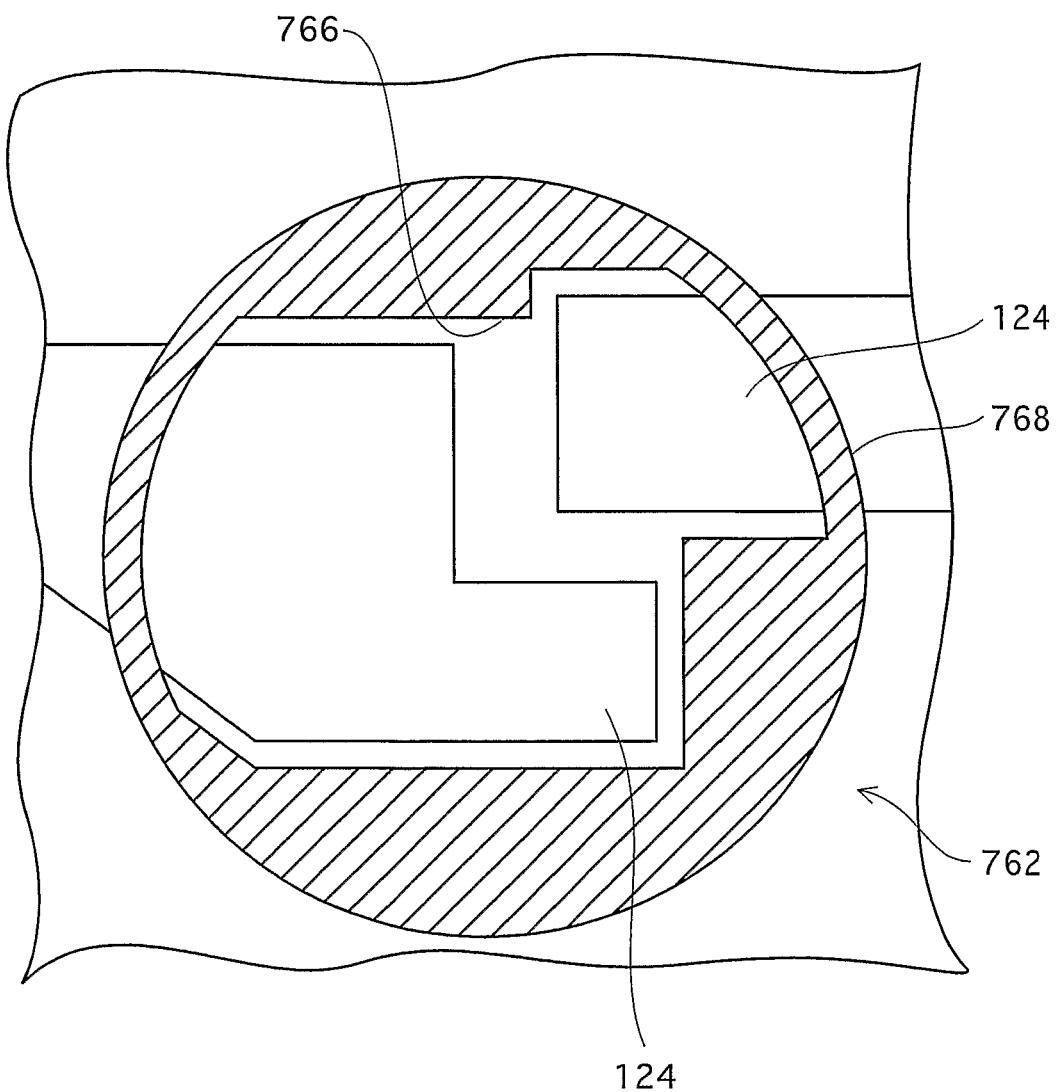
FIG. 30B is a cross-sectional view illustrating the mold and the printed wiring board along a line EE shown in FIG. 30A in a direction shown by the arrows.

FIG. 30A is a cross-sectional view illustrating a mold relating to the twelfth modification example and the printed wiring board 123, during the formation process of a reflecting board, and FIG. 30B illustrates a cross-section along a line EE shown in FIG. 30A in a direction shown by the arrows.

As seen from FIG. 30B, a depression 766 formed in a top part 762a of a protrusion 762 in a mold 760 has a shape corresponding to the shapes of the two wiring patterns 124, In addition, the depression 766 is formed with a periphery 768 being left in the top part 762a of the protrusion 762. Therefore, the periphery 768 is in contact with the wiring patterns 124, when the mold 760 is placed on the printed wiring board 123.

As described above, the depression 766 has a shape corresponding to the portions of the wiring patterns 124 in which an LED device is to be mounted. This reduces the risk of damage to those portions of the wiring patterns 124 during the formation process of the reflecting board.

Here, the molds 750 and 760 relating to the eleventh and twelfth modification examples basically have the same configuration as the mold 710 relating to the third embodiment. Specifically speaking, the molds 750 and 760 respectively have a base and side walls formed at different edges of the base so as to extend vertically. In addition, the conoidal protrusions 752 and 762 are arranged in a matrix of 4×4 on an internal surface of the base.

Fourth Embodiment

According to the third embodiment, the mold 710 is used to form the reflecting board 701. In detail, the mold 710 and the printed wiring board 123 define an enclosed space, and the thermoplastic resin material is injected into this enclosed space. There is, however, an alternative method to form a reflecting board directly on a front surface of a printed wiring board in a single step. The following describes a fourth embodiment, where a reflecting board is formed by printing directly on a front surface of a printed wiring board in a single step.

Figure 31A:
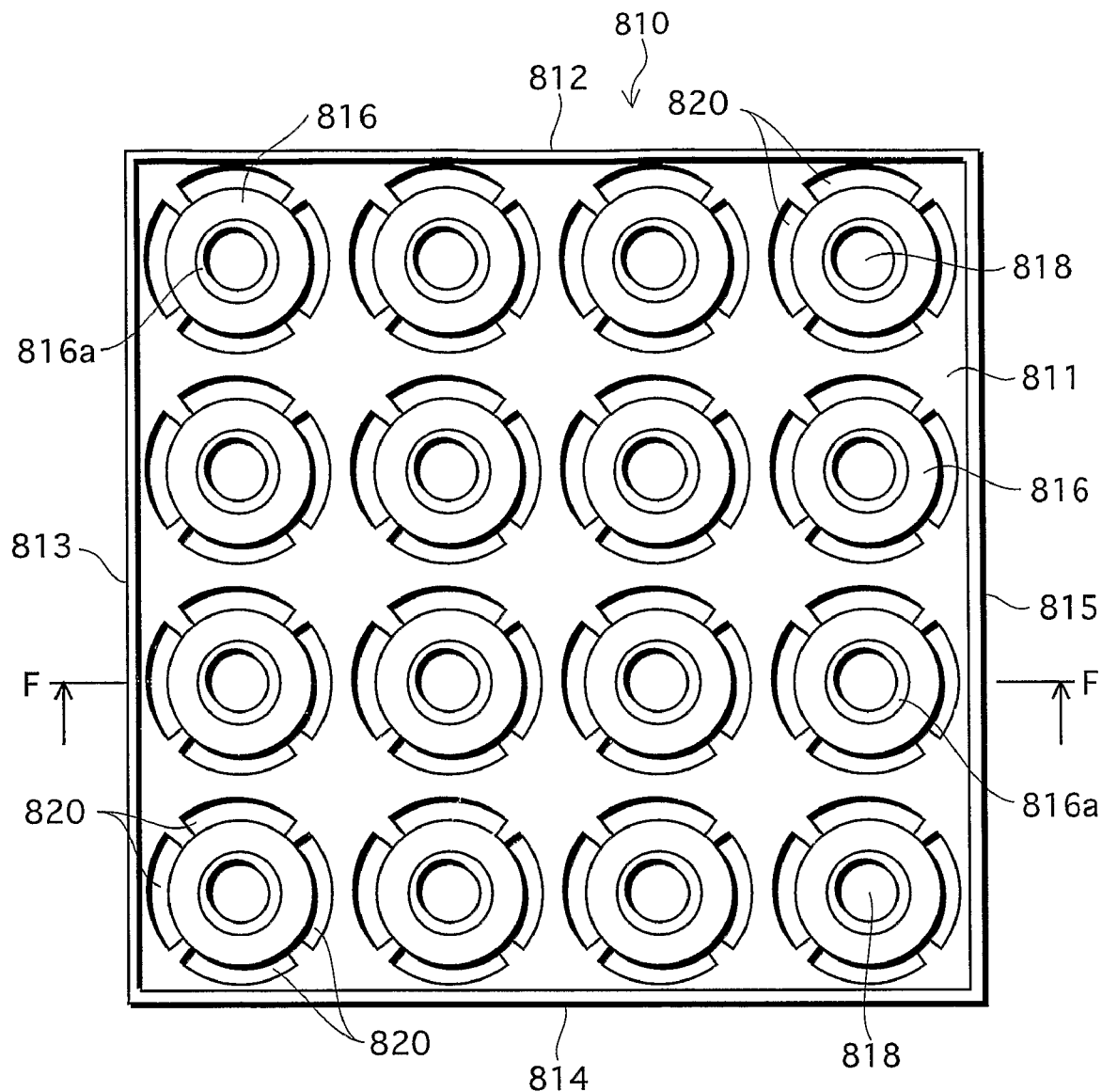
FIG. 31A illustrates a mold used to form a reflecting board relating to a fourth embodiment, showing a space to form the reflecting board.
Figure 31B:
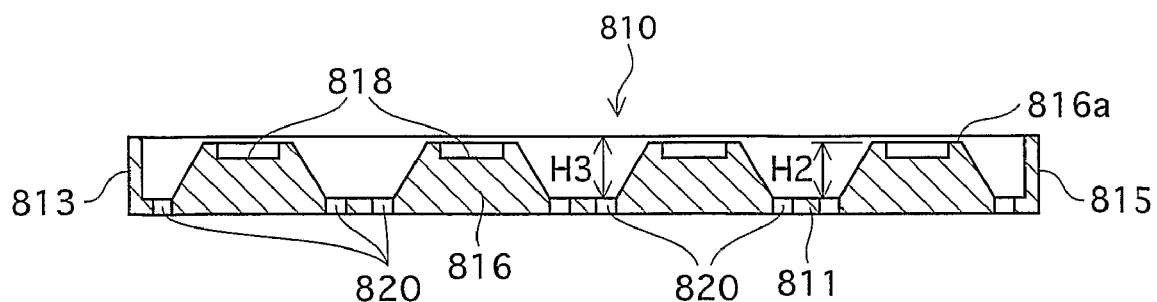
FIG. 31B is a cross-sectional view illustrating the mold along a line FF shown in FIG. 31A in a direction shown by the arrows.

FIG. 31A illustrates a mold used to form a reflecting board in the fourth embodiment, showing a space to form the reflecting board, and FIG. 31B illustrates a cross-section of the mold along a line FF shown in FIG. 31A in a direction shown by the arrows.

As shown in FIG. 31, a mold 810 relating to the fourth embodiment has a base 811 and side walls 812, 813, 814 and 815 formed at different edges of the base 811 so as to extend vertically. In addition, conoidal protrusions 816 are arranged in a matrix of 4×4 on an internal surface of the base 811.

A depression 818 is formed in a top part 816a of each protrusion 816. Here, the depression 818 is large enough to house an LED device therein without contacting the LED device. In addition, for example, four through holes 820 are provided in the base 811 so as to surround each protrusion 816. The through holes 820 allow a liquid thermosetting resin material to be injected into the mold 810, when the mold 810 is placed on the printed wiring board 123.

A height H2 from the internal surface of the base 811 to the top part 816a is smaller than a height H3 from the internal surface of the base 811 to the upper edges of the side walls 812, 813, 814 and 815, by a length equal to the height of the wiring patterns 124. Because of this construction, there is substantially no gap between the side walls 812 to 815 and the printed wiring board 123, when the mold 810 is placed on the front surface of the printed wiring board 123. This can reduce the risk that a liquid thermosetting resin material flows outside the mold 810.

The following describes a procedure of forming a reflecting board directly on the front surface of the printed wiring board 123 in a single step using this mold 810.

Figure 32:
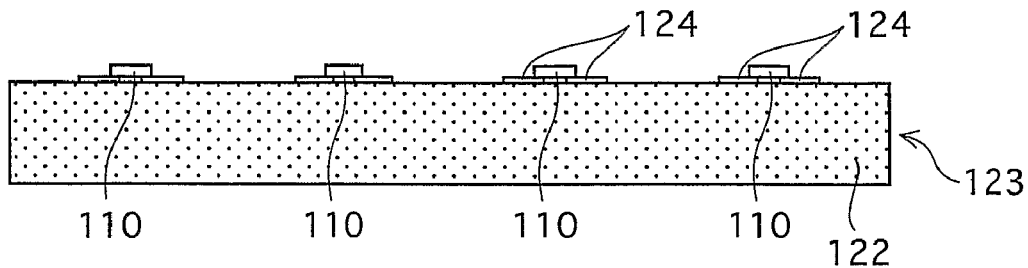
FIG. 32 is used to explain a reflecting board formation step relating to the fourth embodiment.
Figure 32:
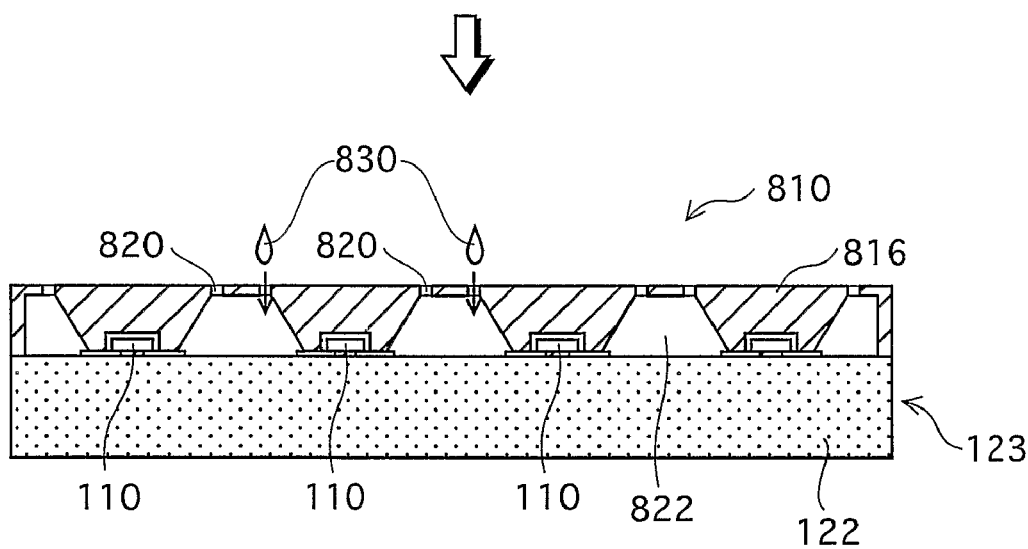
Figure 32:
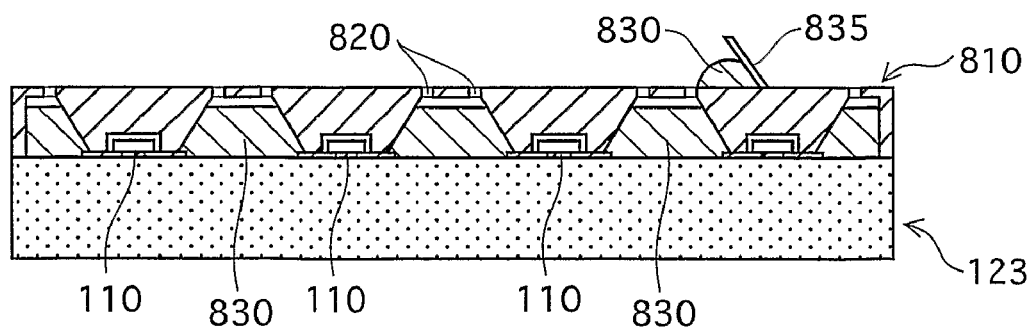

FIG. 32 is used to explain a reflecting board formation step relating to the fourth embodiment.

In the third embodiment, it is assumed that an LED device has not been mounted on the printed wiring board 123 before the reflecting board 701 is formed. In the fourth embodiment, on the other hand, it is assumed that the LED device 110 has already been mounted on the printed wiring board 123 before a reflecting board is formed.

To start with, the printed wiring board 123 is kept in a predetermined state, for example, horizontally kept as shown in (a) in FIG. 32. Here, the printed wiring board 123 is constituted by the insulation board 122 and the wiring patterns 124 formed on the insulation board 122 (the wiring patterns formed within the insulation board 122 are not shown in FIG. 32).

After this, the above-described mold 810 is placed on the front (upper) surface of the printed wiring board 123, in such a manner that the base 811 faces away from the front surface of the printed wiring board 123. This creates a formation space 822 to form a reflecting board between the mold 810 and the printed wiring board 123.

Subsequently, a liquid thermosetting resin material 830 is dropped, through the through holes 820, into the formation space 822 as shown in (b) in FIG. 32. The thermosetting resin material 830 principally contains an epoxy resin, and further contains $TiO_2$ and the like to improve reflection efficiency, as in the first embodiment.

When the formation space 822 is filled with the thermosetting resin material 830 to a certain extent, the thermosetting resin material 830 left on the base 811 of the mold 810 is put into the formation space 822 through the through holes 820 using a squeezee 835, as shown in (c) in FIG. 32. Thus, the formation space 822 is completely filled with the thermosetting resin material 830.

When the thermosetting resin material 830 is heated, to be cured, a reflecting board is formed on the front surface of the printed wiring board 123, similarly to (c) in FIG. 27 explaining the third embodiment. It goes without saying that the reflecting board is adhered to the front surface of the printed wiring board 123, as well as formed. Here, it should be noted that the thermosetting resin material 830 is heated at 150° C. for 30 minutes, for example, to be cured. However, the conditions to cure the thermosetting resin material 830 are not limited to such, and can be varied.

Figure 33A:
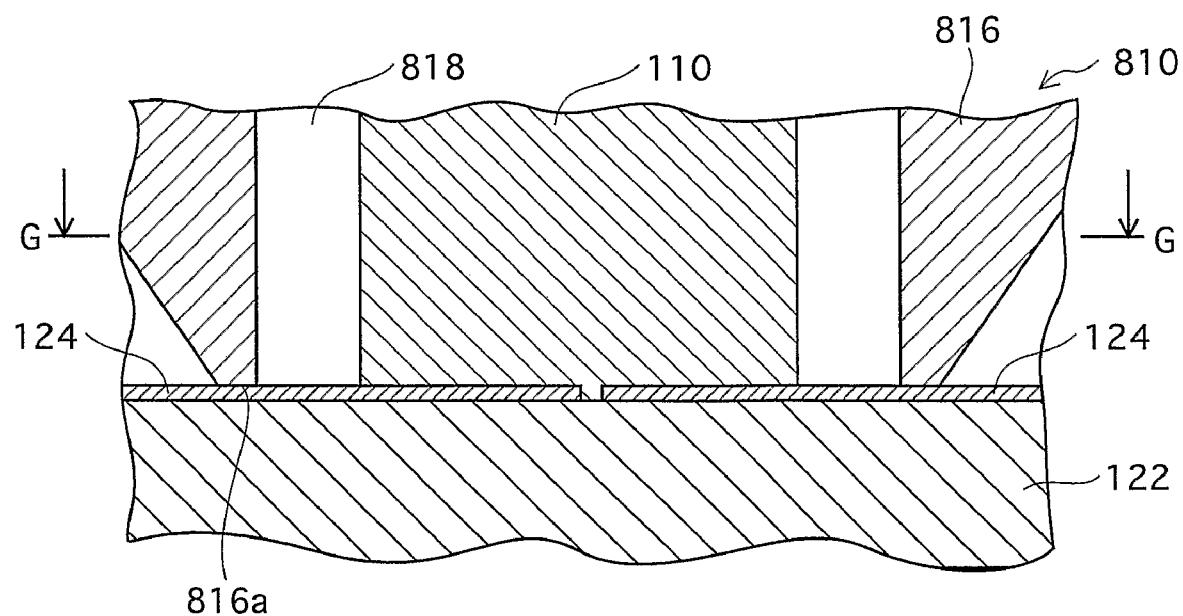
FIG. 33A is a cross-sectional view illustrating a mold and a printed wiring board, in such a state the mold is placed on the printed wiring board to form the reflecting board.
Figure 33B:
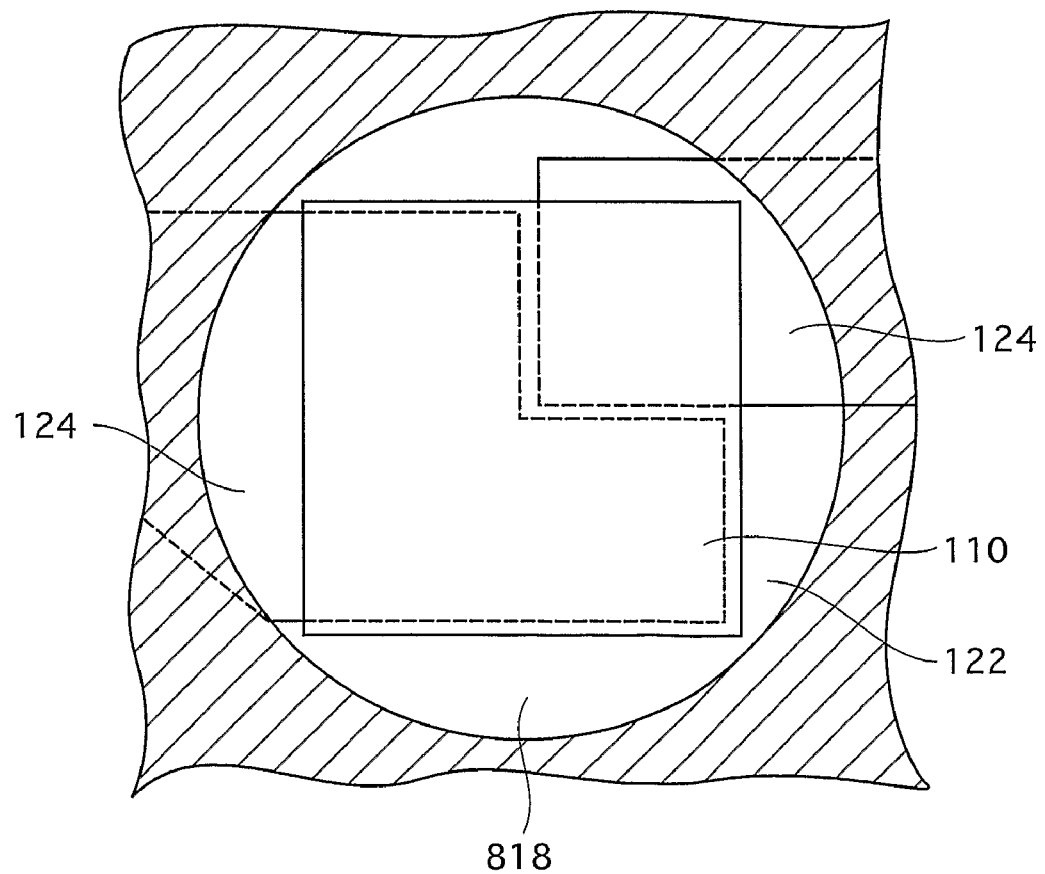
FIG. 33B is a cross-sectional view illustrating the mold and the printed wiring board along a line GG shown in FIG. 33A in a direction shown by the arrows.

FIG. 33A is a cross-sectional view illustrating the printed wiring board 123 and the mold 810, when the mold 810 is placed on the printed wiring board 123 to form the reflecting board, and FIG. 33B illustrates a cross-section along a line GG shown in FIG. 33A in a direction shown by the arrows.

As seen from FIG. 33, the depression 818 large enough to house the LED device 110 therein is formed in the top part 816a of the protrusion 816 formed in the mold 810. Here, the depression 818 is formed in the center of the top part 816a, with a periphery left in the top part 816a. Because of this configuration, the periphery of the protrusion 816 is in contact with the wiring patterns 124, when the mold 810 is placed on the printed wiring board 123. This can reduce the risk that the thermosetting resin material 830 flows into the depression 818.

According to the fourth embodiment, the periphery surrounding the depression 818 in the top part 816a of the mold 810 is substantially flat, and in contact with the wiring patterns 124.

Here, the fourth embodiment is not limited to the above description. For example, the configuration of the top part 816a can be modified. The following describes a thirteenth modification example, where the configuration of the top part 816a is modified.

Figure 34A:
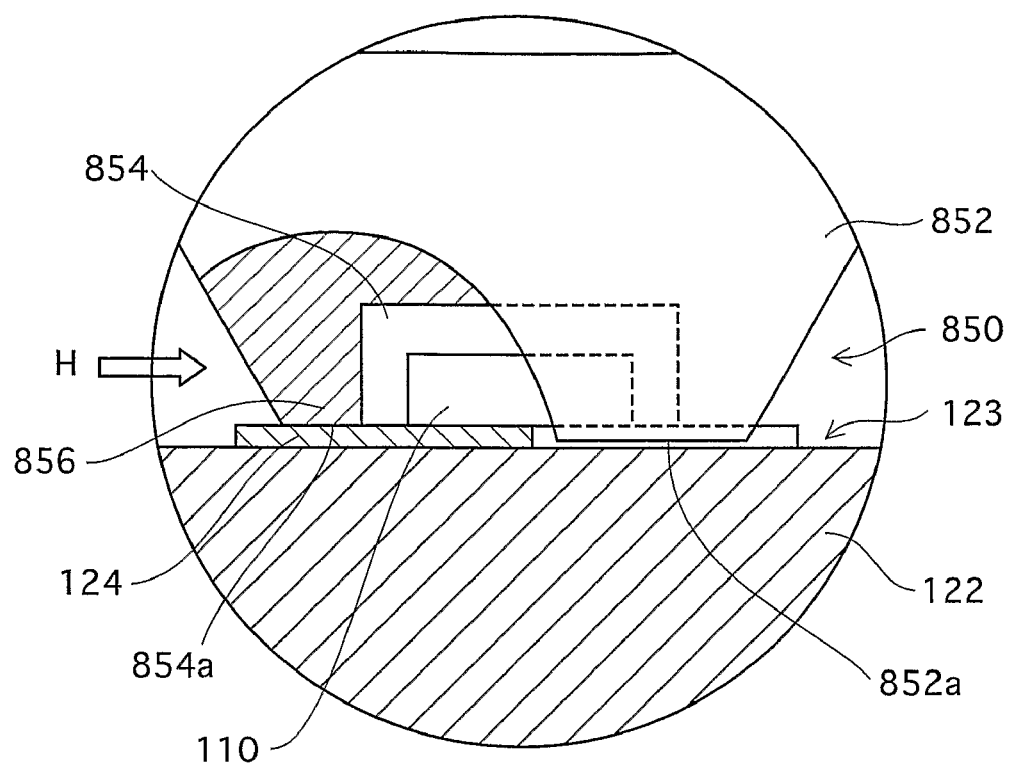
FIG. 34A illustrates a mold relating to a thirteenth modification example and a printed wiring board in such a state that the mold is placed on the printed wiring board to form the reflecting board, with a part broken away to show an inner structure.
Figure 34B:
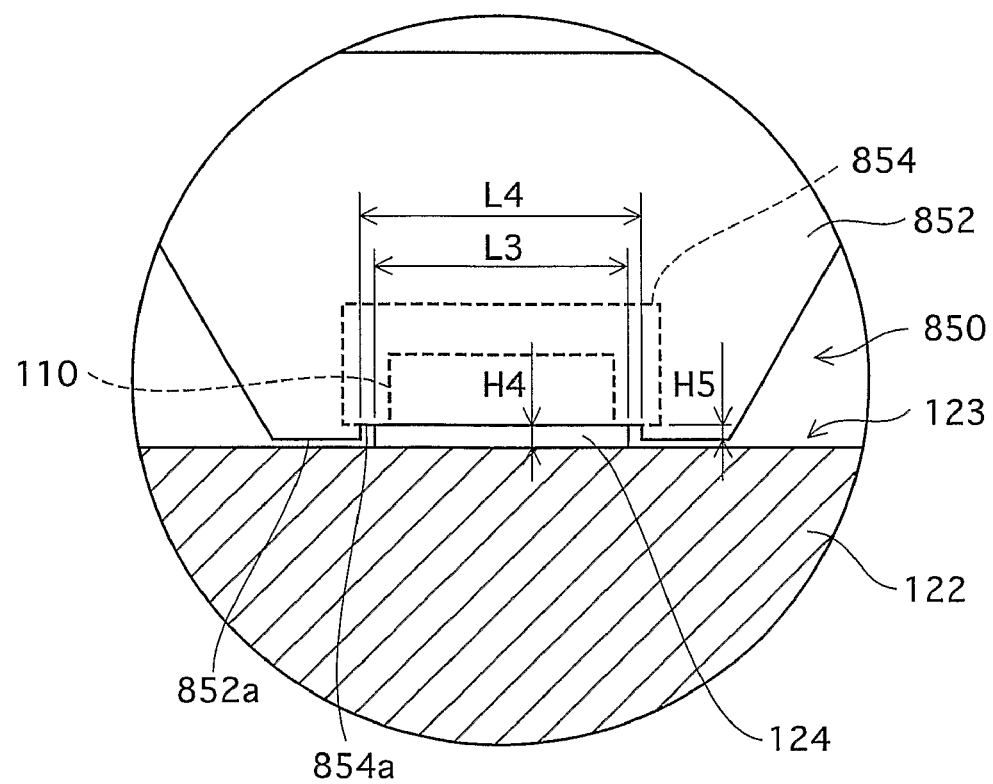
FIG. 34B illustrates the mold and the printed wiring board in a direction H shown by the arrow in FIG. 34A.

FIG. 34A illustrates a mold relating to the thirteenth modification example and the printed wiring board 123, when the mold is placed on the printed wiring board 123 to form a reflecting board, with a part broken away to show an inner structure, and FIG. 34B illustrates the mold and the printed wiring board 123 in a direction H shown in FIG. 34A.

A mold 850 relating to the thirteenth modification example has protrusions 852 in correspondence with reflecting holes in a reflecting board. Furthermore, a depression 854 large enough to house the LED device 110 therein is formed in a top part 852a of each protrusion 852.

Additionally, a second depression 854a is formed in a portion of the top part 852a which opposes the wiring patterns 124 and in which the depression 854 is not formed, as shown in FIG. 34B.

A depth H5 of the second depression 854a is smaller than a height H4 of the wiring patterns 124 from the front surface of the insulation board 122. Because of this configuration, a flat portion of the top part 852a (excluding the depression 854 and the second depression 854a) is positioned between the surfaces of the wiring patterns 124 and the insulation board 122.

Here, a width L4 of the second depression 854a is larger than a width L3 of the wiring pattern 124 as shown in FIG. 34B. The difference between the widths L3 and L4 is preferably from 1 μm to 20 μm, as mentioned in the third embodiment.

Because of this configuration, the portion of the top part 852a which is in contact with the printed wiring board 123 (wiring patterns 124) is configured so as to coincide with the uneven surface of the printed wiring board 123, excluding a portion of the printed wiring board 123 in which the LED device 110 is mounted. This can reduce the risk that a thermosetting resin material flows into the depression 854 during the formation process of the reflecting board.

In particular, the depth H5 of the second depression 854a is smaller than the height H4 of the wiring patterns 124. Because of this configuration, the wiring patterns 124 can be reliably made in contact with the bottom of the second depression 854a.

In the thirteenth modification example, since the depth H5 is smaller than the height H4, the insulation board 122 is not in contact with the protrusion 852. However, the depth H5 may have substantially the same length as the height H4, so that the printed wiring board 123 (the insulation board 122) is in contact with the top part 852a of the protrusion 852. This can also reduce the risk that the thermosetting resin material flows into the depression 854.

In the above description of the fourth embodiment, the reflecting board is formed by printing on the printed wiring board 123 on which the LED device 110 has already been mounted. To do so, the protrusion 816 formed in the mold 810 has the depression 818 to house the LED device 110 therein. However, if the reflecting board is formed by printing in a single step directly on the printed wiring board 123 on which the LED device 110 has not been mounted, the protrusion 816 may not need the depression 818 large enough to house the LED device 110 therein. In this case, the top part 816a of the protrusion 816 may be configured in the same manner as the top part 716a relating to the third embodiment, for example, or may have a depression similar to the depression 756 relating to the eleventh modification example or the depression 766 relating to the twelfth modification example.

Modification Examples of the Third and Fourth Embodiments

According to the third and fourth embodiments of the present invention, the reflecting board is formed directly on the printed wiring board in a single step. However, the third and fourth embodiments are not limited to such specific examples, and further include the following modification examples. In the following description, "the third and fourth embodiments and the like" indicates the eleventh to thirteenth modification examples based on the third and fourth embodiments, in addition to the third and fourth embodiments.

(1) Resin Material

According to the third embodiment, the reflecting board is made of a PPA resin. However, the reflecting board can be made of a different thermoplastic resin such as a polyphenylene sulfide (PPS) resin, a liquid crystal polymer (LCP), and a polybutylene terephthalate (PBT) resin. Furthermore, the reflecting board can be made of a thermosetting resin such as an epoxy resin. According to the fourth embodiment, the reflecting board is made of an epoxy resin. However, the reflecting board can be made of a different resin such as an unsaturated ester resin and a phenolic resin, or a thermoplastic resin as in the third embodiment.

(2) LED Device

According to the third and fourth embodiments and the like, the LED device is directly mounted on the printed wiring board. However, the LED device may be indirectly mounted on the printed wiring board, as in the tenth modification example where the sub-mounting device 605 including the LED device 610 is mounted on the printed wiring board 232. In this case, the depression formed in the top part of the protrusion needs to have a sufficiently large size to house a sub-mounting device therein.

(3) Depressions

1. Size

According to the fourth embodiment, the reflecting board is formed after the LED device 110 is mounted on the printed wiring board 123. However, the reflecting board may be instead formed after a resin member (for example, the phosphor 140 in the first embodiment) is formed by enclosing the LED device 110 mounted on the printed wiring board 123 therein by a resin material. If such is the case, the depression 818 needs to be large enough to house the LED device 110 with the resin member therein.

2. Configuration of Depressions

According to the third and fourth embodiments and the like, the depression formed in the top part of the protrusion in the mold has a bottom. As an alternative example, however, the depression may be formed as a through hole. In the present description, the depression may have a bottom, or be formed as a through hole without a bottom.

The configuration and planar shape of the depression are not limited to those disclosed in the third and fourth embodiments and the like.

(4) Reflecting Board

1. Construction

According to the third and fourth embodiments and the like, the reflecting board is formed like a plate, and has 16 separate reflecting holes in correspondence with the locations where the LED devices are to be mounted, but not limited to such. In other words, it is also possible to provide a separate reflecting piece for each LED devices, similarly to the eighth and ninth modification examples based on the first and second embodiments (the reflecting pieces 514 and 534).

The following describes a fourteenth modification example where separate reflecting pieces are provided instead of the reflecting board, with reference to FIGS. 35 to 38.

Figure 35:
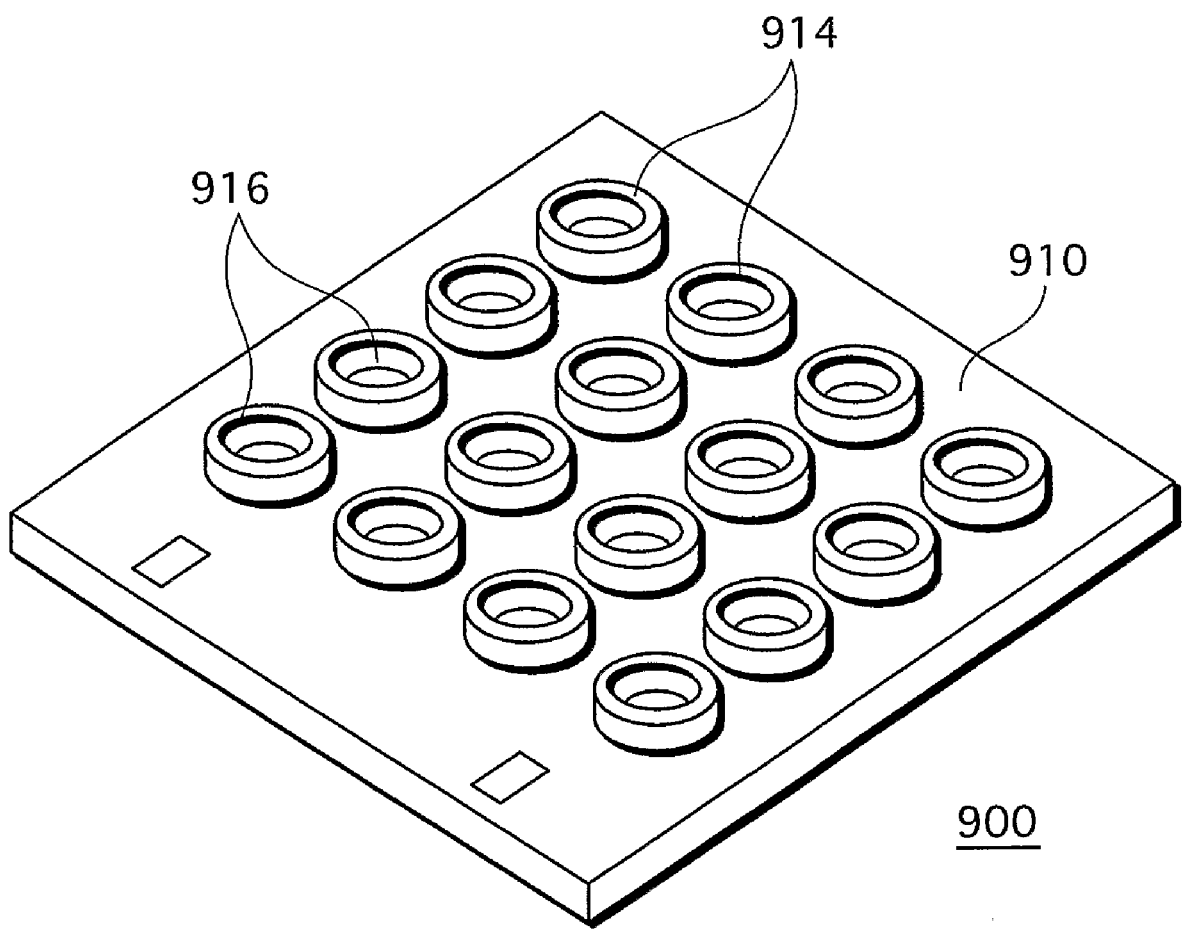
FIG. 35 is a perspective view illustrating an LED mounting module relating to a fourteenth modification example.

FIG. 35 is a perspective view illustrating an LED mounting module relating to the fourteenth modification example.

As shown in FIG. 35, an LED mounting module 900 relating to the fourteenth modification example is constituted by a printed wiring board 910 including wiring patterns (not shown in FIG. 35) and a plurality of (16) reflecting pieces 914 formed on a front surface of the printed wiring board 910.

As clearly seen from FIG. 35, each reflecting piece 914 has a reflecting hole 916 in its center. In other words, one reflecting piece 914 has one reflecting hole 916. The reflecting hole 916 is tapered from a front side of the reflecting piece 914 (which faces away from the printed wiring board 910) toward the printed wiring board 910, as in the first to fourth embodiments and first to thirteenth modification examples.

The reflecting piece 914 is formed on the printed wiring board 910 in the same manner as in the third and fourth embodiments and the like. Specifically speaking, a mold to form the reflecting pieces 914 is appropriately placed on the printed wiring board 910. Subsequently, a liquid (thermoplastic or thermosetting) resin material is injected into the mold, and then cured.

Figure 36A:
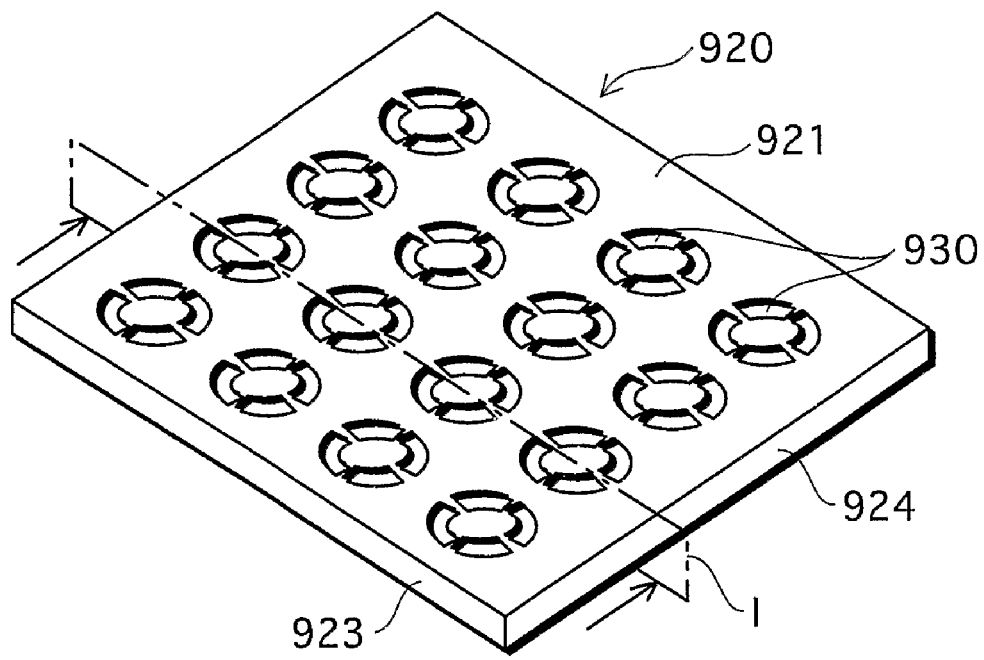
FIG. 36A is a perspective view illustrating a mold to form reflecting pieces relating to the fourteenth modification example.
Figure 36B:
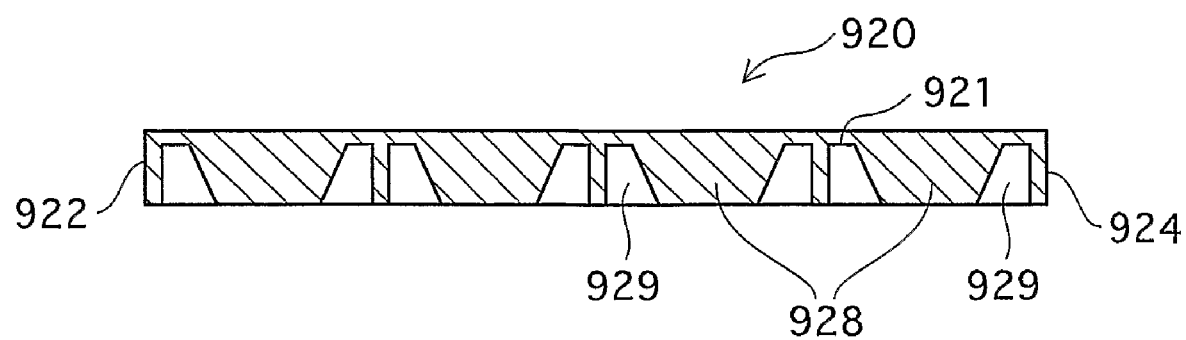
FIG. 36B is a cross-sectional view illustrating the mold along a plane I shown in FIG. 36A in a direction shown by the arrows.

FIG. 36A is a perspective view illustrating the mold to form the reflecting pieces 914 relating to the fourteenth modification example, and FIG. 36B is a cross-sectional view illustrating the mold along a plane I shown in FIG. 36A in a direction shown by the arrows.

As shown in FIG. 36, a mold 920 is formed like a box, and has a base 921 and four side walls 922, 923, 924 and 925 (the side wall 925 is not shown in FIG. 36, but used for explanation), similarly to the mold 810 relating to the fourth embodiment.

An internal space of the box-like mold 920 is divided into 16 sub-spaces, in total, by horizontal and vertical walls that extend in horizontal and vertical directions (see X and Y directions in FIG. 21A) and the side walls 922, 923, 924 and 925. In substantially the center of each sub-space, a protrusion 928 is provided on the base 921, to form the reflecting hole 916 in the reflecting piece 914. A portion in each sub-space in which the protrusion 928 is not formed is a formation space 929 to form the reflecting piece 914. Note that the protrusion 928 is tapered from the base 921 to the top of the protrusion 928, in correspondence with the shape of the reflecting hole 916.

In each sub-space of the inner space of the mold 920, through holes 930 connected to the formation space 929 are provided in the base 921 around the protrusion 928. Through these through holes 930, a liquid resin material can be poured into the formation space 929, when the mold 920 is placed on the printed wiring board 910 to form the reflecting pieces 914.

Figure 37:
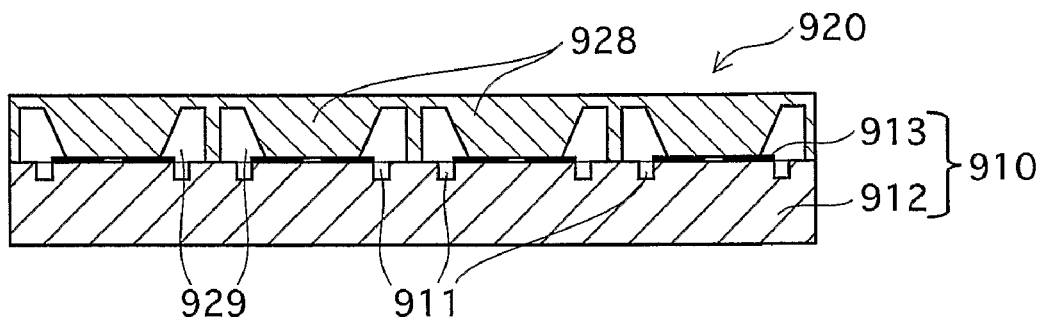
FIG. 37 is used to explain a reflecting piece formation step in the fourteenth modification example.
Figure 37:
Figure 37:
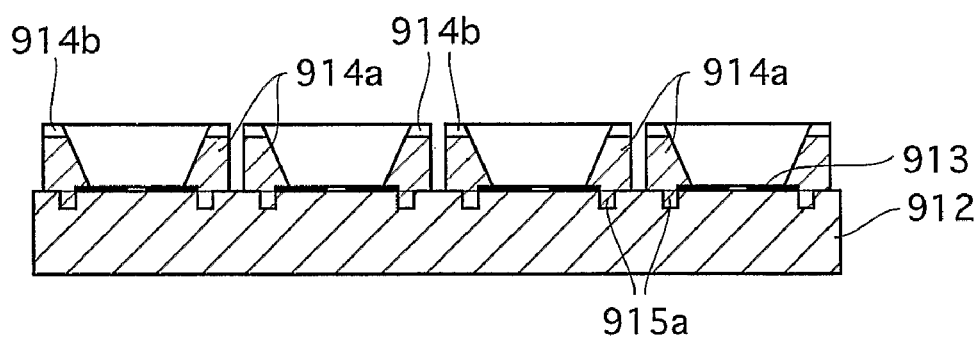
Figure 37:
Figure 37:
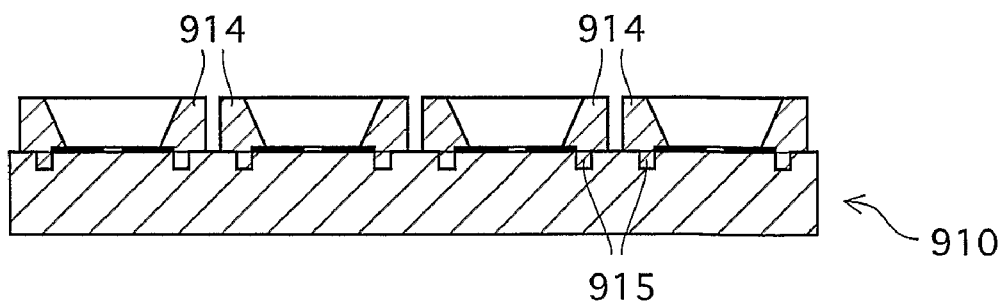

FIG. 37 is used to explain the step of forming the reflecting pieces 914 relating to the fourteenth modification example.

The printed wiring board 910 is constituted by wiring patterns 913 and an insulation board 912 as shown in (a) in FIG. 37. Similarly to the third embodiment, no LED device is mounted on the printed wiring board 910.

Here, in this printed wiring board 910, depressions 911 are provided at locations where the reflecting pieces 914 are to be adhered, in order to realize stronger connection between the reflecting pieces 914 and the printed wiring board 910. TO be specific, when a resin material is injected to form the reflecting pieces 914, the resin material also flows into the depressions 911. In this way, the area at which each reflecting piece 914 is adhered to the printed wiring board 910 can be increased.

When the insulation board 912 is made of a composite material containing an alumina filler and an epoxy resin, for example, the depressions 911 can be formed using a drill, a laser, or the like, after the epoxy resin is cured. When the insulation board 912 is made of a different material, for example, a ceramic material, the depressions 911 are formed in the following manner. Through holes are formed by blanking or the like in a green sheet forming a front surface of the printed wiring board 910, and the green sheet is then fired.

To form the reflecting pieces 914, the printed wiring board 910 is kept in a predetermined state, for example, horizontally kept. After this, the mold 920 is placed on the front (upper) surface of the printed wiring board 910 in such a manner that the base 921 faces away from the front surface of the printed wiring board 910, as shown in (a) in FIG. 37.

Subsequently, a liquid thermosetting resin material is dropped onto the base 921 of the mold 920, to be injected into the formation space 929 through the through holes 930. The thermosetting resin material is the same as that used in the fourth embodiment, and is dropped and injected in the same manner as in the fourth embodiment.

When the formation space 929 is filled with the thermosetting resin material to a certain extent, the thermosetting resin material left on the base 921 of the mold 920 is put into the mold 920 through the through holes 930 by using a squeezee, for example. Thus, the formation space 929 is completely filled with the thermosetting resin material (see FIG. 32).

After the thermosetting resin material in the formation space 929 is heated, to be cured, the mold 920 is removed. In this way, preliminary reflecting pieces 914a, which are to be formed into the reflecting pieces 914, are formed on the front surface of the printed wiring board 910, as shown in (b) in FIG. 37. Here, the preliminary reflecting pieces 914a are adhered to the front surface of the printed wiring board 910, as well as formed.

Figure 38:
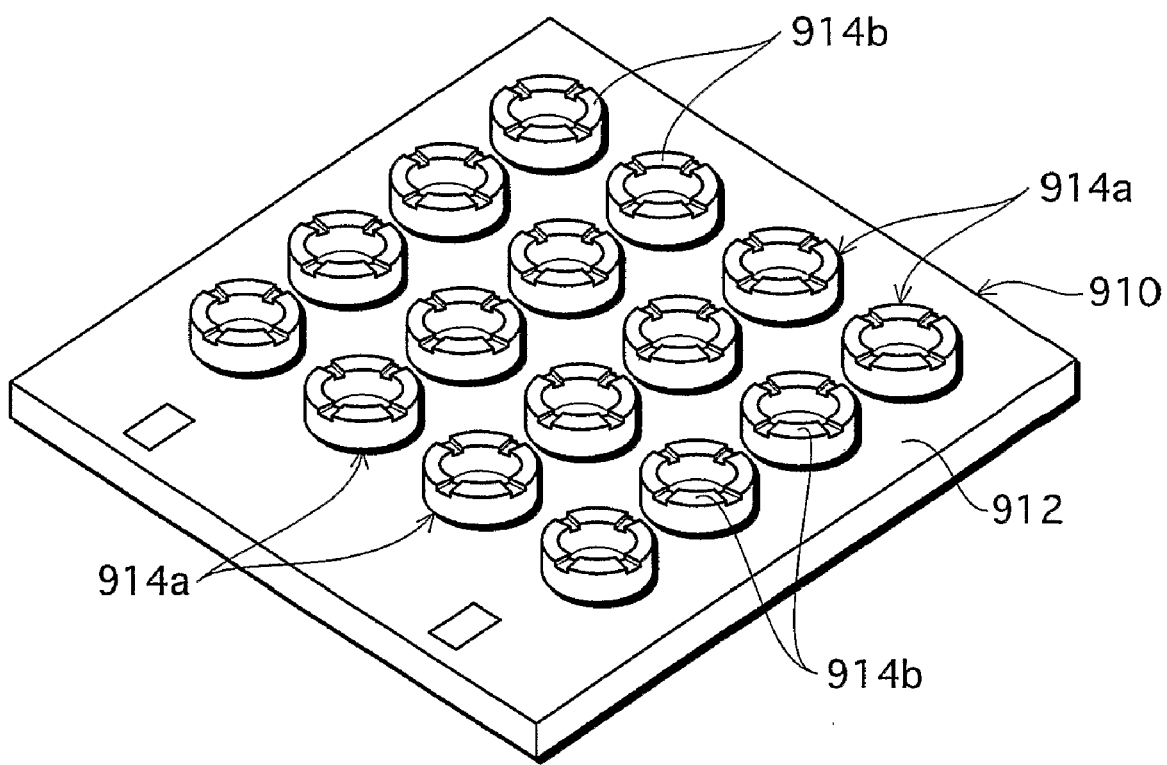
FIG. 38 is a perspective view illustrating a printed wiring board on which preliminary reflecting pieces are formed.

FIG. 38 is a perspective view illustrating the printed wiring board 910 on which the preliminary reflecting pieces 914a are formed.

As shown in FIG. 38, a top surface (an end surface which faces away from the printed wiring board 910) of each preliminary reflecting piece 914a includes projections 914b, due to the resin material filling the through holes 930 in the mold 920.

Following this, a step of removing the projections 914b of the preliminary reflecting piece 914a is performed. In this step, the projections 914b are removed by grinding, for example, using a grinding stone or the like. Thus, the preliminary reflecting pieces 914a have an even height.

As shown in FIG. 37, the depressions 911 are provided at locations, in the printed wiring board 910, where the reflecting pieces 914 are to be formed. The resin material to form the reflecting pieces 914 also flows into the depressions 911, to form portions 915a. Here, the portions 915a are adhered to the reflecting pieces 914. This can achieve stronger connection between the reflecting pieces 914 and the printed wiring board 910.

According to the fourteenth modification example, the reflecting pieces 914 are formed on the printed wiring board 910 before the LED devices are mounted. However, the reflecting pieces 914 can be formed in the same manner as in the fourth embodiment, where the reflecting board is formed on the printed wiring board 123, on which the LED devices 110 have already been mounted.

The following describes a fifteenth modification example, where separate reflecting pieces are formed on a printed wiring board, on which LED devices have already been mounted.

Figure 39:
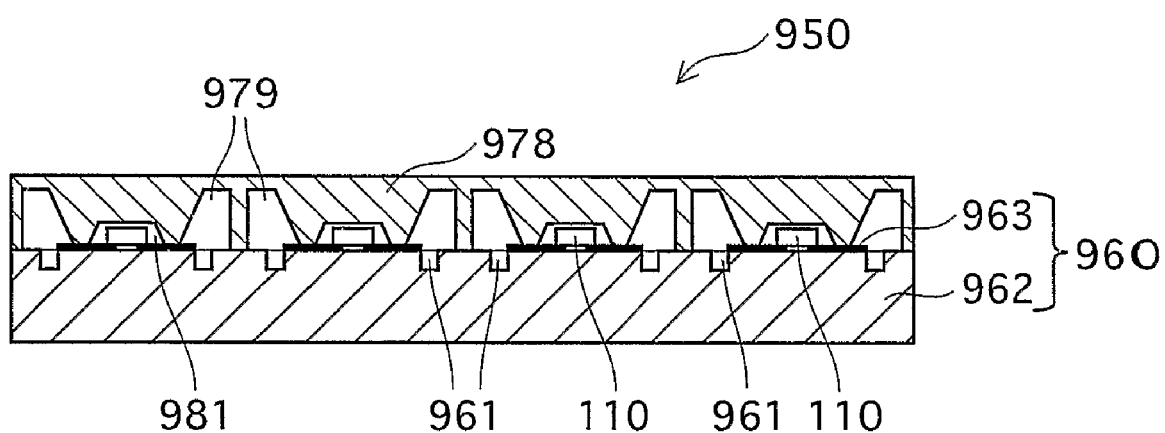
FIG. 39 is a cross-sectional view illustrating a mold relating to a fifteenth modification example and a printed wiring board in such a state that the mold is placed on the printed wiring board.

FIG. 39 is a cross-sectional view illustrating a mold relating to the fifteenth modification example and a printed wiring board, when the mold is placed on the printed wiring board.

As shown in FIG. 39, a printed wiring board 960 is constituted by an insulation board 962 and wiring patterns 963. Here, the LED devices 110 have already been mounted on the printed wiring board 960. Therefore, a depression 981 large enough to house the LED device 110 therein is formed in a protrusion 978 in a mold 950 relating to the fifteenth modification example, similarly to the protrusion. 816 in the mold 810 relating to the fourth embodiment. By placing the mold 950 on the printed wiring board 960, a formation space 979 to form reflecting pieces is defined between the mold 950 and the printed wiring board 960.

Because of the mold 950 having this configuration, separate reflecting pieces can be formed on the printed wiring board 960 on which the LED devices 110 have already been mounted.

Depressions 961 are provided in the insulation board 962, as in the fourteenth modification example. Here, the fifteenth modification example can be realized without the depressions 961. However, the depressions 961 can achieve stronger connection between the reflecting pieces and the printed wiring board 960, as mentioned above.

2. Conditions Under which Reflecting Board or Pieces are Formed

The above description of the third and fourth embodiments and the eleventh to fifteenth modification examples does not particularly mention the conditions under which the reflecting member (indicating the reflecting board and pieces) is formed. The reflecting member is preferably formed under vacuum. In this way, air in the liquid resin material to form the reflecting member can be evacuated, and fewer voids are created in the completed reflecting member. An appropriate degree of vacuum varies depending on the viscosity of the liquid resin material, the shape of the reflecting member, the shape of the reflecting holes, and therefore needs to be determined based on experiments and the like. Generally speaking, however, a favorable reflecting member can be obtained under vacuum of 100 (Pa) or less.

(5) Flash Observed During Process of Forming Reflecting Member

The above description of the third and fourth embodiments and the eleventh to fifteenth modification examples does not particularly mention how to remove flash created due to the gap between the mold and the printed wiring board during the step of forming the reflecting member. Such flash can be removed by grid blasting (sandblasting), for example, in which particles are forcibly sprayed.

The particles used in sandblasting include particles of glass, silicone, phenol, nylon, polycarbonate, melanin, urea, polyester, and the like. An average particle diameter is preferably 0.05 mm to 3.0 mm approximately, and the pressure at which the particles are sprayed is appropriately determined based on factors such as the thickness of the flash.

<Further Modifications>

The present invention is described with reference to the first to fourth embodiments and the first to fifteenth modification examples based thereon, but not limited to those. The present invention further includes the following modification examples.

(1) Insulation Board

According to the first to fourth embodiments, the insulation board constituting the printed wiring board is made of a ceramic material or a composite material containing an alumina filler and an epoxy resin, but can be made of a different material. For example, an alumina filler may be replaced with a different inorganic filler such as $SiO_2$ and AlN, and an epoxy resin can be replaced with a different thermosetting resin such as a bismaleimide-triazine (BT) resin.

In addition, the insulation board may be made of a thermosetting resin material, containing a thermosetting resin such as an epoxy resin and a BT resin, and a glass fiber.

Note that the resin materials mentioned in the present description indicate a resin material containing an epoxy resin, a BT resin, or the like principally, and a different component additionally.

(2) Wiring Patterns

According to the first embodiment, the wiring patterns 124 are formed by printing and firing the conductive paste. According to the second embodiment, the wiring patterns 324 and 325 are formed by photolithography.

However, the wiring patterns can be formed using a different method, which is presented in the following as an example. The front surface of the insulation board is masked except for a part in which the wiring patterns are to be formed. After this, a metal film made of nickel, platinum, gold, silver, copper, palladium, or the like is formed by sputtering, deposition or the like, thereby acquiring the wiring patterns formed by the metal film.

(3) The Number of LED Devices

According to the first to fourth embodiments, the LED devices are arranged in a matrix of 4×4. However, the present invention is not limited to such. Furthermore, in a case where separate reflecting pieces are respectively provided for the LED devices, the number and arrangement of the reflecting pieces vary in accordance with the change in the number and arrangement of the LED devices.

(4) Reflecting Member

According to the eighth, ninth and fourteenth modification examples, the separate reflecting pieces (514, 534 and 914) are provided in a one-to-one correspondence with the LED devices 110.

However, it is also possible to use a reflecting piece corresponding to a predetermined number of LED devices, out of all the LED devices. Which is to say, multiple reflecting pieces each of which has a predetermined number of reflecting holes may be separately formed on the printed wiring board. Specifically speaking, four reflecting pieces each having four reflecting holes can be formed, for example.

Furthermore, there is no limitation to the number of reflecting holes (516, 536 and 916) in each reflecting piece (514, 534 and 914). In detail, the number of reflecting holes (516, 536 and 916) may be the same or different in each of the reflecting pieces (514, 534 and 914). Alternatively, the reflecting pieces (514, 534 and 914) may be grouped depending on the number of reflecting holes (516, 536 and 916) therein. Furthermore, the shape of the reflecting hole (516, 536 and 916) may be the same or different in each of the reflecting pieces (514, 534 and 914). Alternatively, the reflecting pieces (514, 534 and 914) may be grouped depending on their shape.

The separate reflecting pieces (514, 534 and 914) have an advantage that less distortion is caused in the reflecting member and the printed wiring board by heat, when compared with the reflecting board 126 relating to the first embodiment, for example. Such distortion is caused due to a difference in thermal expansion coefficient between materials forming the reflecting member and the printed wiring board.

(5) Other Matters

According to the first to fourth embodiments, the wall of the reflecting hole is expressed by a substantially straight line in the cross-section of the reflecting board, when seen in a direction perpendicular to the cross-section. However, the present invention is not limited to such. As an alternative example, in its cross-section, the wall may be expressed by a curved line such as a parabolic line, and a part of an ellipse (including a circle). This modification can be easily realized by using a mold with protrusions which each have a curved external surface, in terms of its cross-section. Here, it is preferable that the protrusions have a smaller diameter at its top than at its base, considering that the half-cured reflecting board is taken out of the mold.

According to the second embodiment, the reflecting board and the printed wiring board are made of the same resin (an epoxy resin). However, the reflecting board and the printed wiring board can be made of different resins. Note that, however, the same resin can achieve stronger connection between the reflecting board and the printed wiring board.

When the printed wiring board is made up by a plurality of layers as in the second embodiment, for example, at least a front layer, that is to say, a layer in contact with the reflecting board, is preferably made of the same resin as the reflecting board.

The above description is made under assumption that the LED mounting modules are used in a lighting apparatus. However, the LED mounting modules can be also used in a display apparatus which achieves display of information by selectively causing a plurality of LED devices to emit light, that is to say, a display apparatus in which each light emitting device is counted as one dot.

The above embodiments and modification examples use the LED devices for light emitting devices, but can also use different types of semiconductor light emitting devices such as laser diodes.

The first to fourth embodiments, the first to fifteenth modification examples, and the modification examples described in this section may be freely combined.

This application is based on applications No. 2004-93896 and No. 2005-64801 filed in Japan, the content of which is hereby incorporated by reference.

INDUSTRIAL APPLICABILITY

The present invention can provide an LED mounting module which can achieve favorable light extraction efficiency without increasing a cost.

The invention claimed is:

1. An LED mounting module for having LED devices which are to be mounted thereon, the LED mounting module comprising:

a substrate including at least one insulation board made of an insulation material, and a wiring pattern on which the LED device is to be mounted and which is disposed to cover at least part of a main surface of the insulation board; and a reflecting member made of a resin material and having a reflecting hole in a position corresponding to each LED devices which is to be mounted on one of main surfaces of the substrate, wherein the resin material composing the reflecting member is identical in type with a resin material composing the insulation board, the reflecting member has a lower surface part of which is directly adhered to part of the wiring pattern opposing the part of the lower surface with use of the resin material composing the reflecting member, and a remainder of which is directly adhered to part of the insulation board opposing the remainder of the lower surface with use of the resin material composing the reflecting member.

2. The LED mounting module of claim 1, wherein the reflecting member and the insulation board are both made of the resin material containing one or more fillers, and are clouded by the fillers.

3. The LED mounting module of claim 1, wherein the resin material is a thermosetting resin material principally containing an epoxy resin.

4. The LED mounting module of claim 1, wherein the wiring pattern is a surface pattern on which each LED device is to be mounted, and the surface pattern excluding an area corresponding to the reflecting hole is entirely covered with the reflecting member.

5. The LED mounting module of claim 4, wherein the wiring pattern has another pattern being not formed on the main surface of the insulation board, and a via hole electrically connecting the other pattern and the surface pattern is formed within the insulation board in an area corresponding to the lower surface of the reflecting member.

6. An LED mounting module for having a plurality of LED devices which are to be mounted thereon, the LED mounting module comprising:

a substrate including at least one insulation board made of an insulation material, and a wiring pattern disposed to cover at least part of a main surface of the insulation board;

a metal board layered on another surface of the substrate;

a plurality of reflecting members provided on one of main surfaces of the substrate and each provided at a position corresponding to one of the plurality of LED devices which is to be mounted, and each having a reflecting hole in the position, wherein the reflecting members are each made of a resin material having one or more fillers that enhances reflectance efficiency, the resin material composing the reflecting member is identical in type with a resin material composing the insulation board, the reflecting member and the insulation board are clouded by the fillers, the reflecting member has a lower surface part of which is directly adhered to part of the wiring pattern opposing the part of the lower surface with use of the resin material composing the reflecting member, and a remainder of which is directly adhered to part of the insulation board opposing the remainder of the lower surface with use of the resin material composing the reflecting member.

* * * * *